United States Patent
Constantino et al.

(10) Patent No.: US 10,446,498 B2
(45) Date of Patent: Oct. 15, 2019

(54) ISOLATION BETWEEN SEMICONDUCTOR COMPONENTS

(71) Applicant: FAIRCHILD SEMICONDUCTOR CORPORATION, Sunnyvale, CA (US)

(72) Inventors: John Constantino, Morgan Hill, CA (US); Timwah Luk, Falmouth, ME (US); Ahmad Ashrafzadeh, Morgan Hill, CA (US); Robert L. Krause, San Jose, CA (US); Etan Shacham, Cupertino, CA (US); Maria Clemens Ypil Quinones, Cebu (PH); Janusz Bryzek, Oakland, CA (US); Chung-Lin Wu, San Jose, CA (US)

(73) Assignee: Fairchild Semiconductor Corporation, Phoenix, AZ (US)

( * ) Notice: Subject to any disclaimer, the term of this patent is extended or adjusted under 35 U.S.C. 154(b) by 0 days.

(21) Appl. No.: 15/676,360

(22) Filed: Aug. 14, 2017

(65) Prior Publication Data
US 2017/0373008 A1    Dec. 28, 2017

Related U.S. Application Data

(63) Continuation of application No. 14/593,642, filed on Jan. 9, 2015, now Pat. No. 9,735,112.
(Continued)

(51) Int. Cl.
*H01L 23/538* (2006.01)
*H01L 27/06* (2006.01)
(Continued)

(52) U.S. Cl.
CPC ...... *H01L 23/538* (2013.01); *H01L 23/49531* (2013.01); *H01L 23/49537* (2013.01);
(Continued)

(58) Field of Classification Search
CPC .................................................... H01L 23/538
(Continued)

(56) References Cited

U.S. PATENT DOCUMENTS

| 4,312,023 A | 1/1982 | Frappart et al. |
| 7,678,609 B2 | 3/2010 | Pavier |

(Continued)

FOREIGN PATENT DOCUMENTS

CN    102308349 A    1/2012

OTHER PUBLICATIONS

Lim, Michele Hui Fern, "Low Temperature Co-fired Ceramics Technology for Power Magnetics Integration", Nov. 17, 2008, 226 pages.
(Continued)

*Primary Examiner* — Jami Valentine Miller
(74) *Attorney, Agent, or Firm* — Brake Hughes Bellermann LLP

(57) ABSTRACT

In some general aspects, an apparatus may include a first semiconductor die, a second semiconductor die, and a capacitive isolation circuit being coupled to the first semiconductor die and the second semiconductor die. The capacitive isolation circuit may be disposed outside of the first semiconductor die and the second semiconductor die. The first semiconductor die, the second semiconductor die, and the capacitive circuit may be included in a molding of a semiconductor package.

18 Claims, 40 Drawing Sheets

Related U.S. Application Data

(60) Provisional application No. 61/926,030, filed on Jan. 10, 2014.

(51) Int. Cl.
 *H01L 49/02* (2006.01)
 *H01L 23/495* (2006.01)
 *H01L 23/66* (2006.01)

(52) U.S. Cl.
 CPC .. *H01L 23/49541* (2013.01); *H01L 23/49575* (2013.01); *H01L 23/49589* (2013.01); *H01L 23/66* (2013.01); *H01L 27/06* (2013.01); *H01L 28/40* (2013.01); *H01L 2224/0603* (2013.01); *H01L 2224/16145* (2013.01); *H01L 2224/32145* (2013.01); *H01L 2224/48091* (2013.01); *H01L 2224/48137* (2013.01); *H01L 2224/48247* (2013.01); *H01L 2224/73257* (2013.01); *H01L 2224/73265* (2013.01); *H01L 2924/13055* (2013.01); *H01L 2924/13091* (2013.01); *H01L 2924/181* (2013.01)

(58) Field of Classification Search
 USPC .......................................................... 257/532
 See application file for complete search history.

(56) References Cited

U.S. PATENT DOCUMENTS

| | | | |
|---|---|---|---|
| 7,737,871 B2 | 6/2010 | Leung et al. | |
| 7,838,964 B2 | 11/2010 | Carobolante et al. | |
| 7,902,627 B2 | 3/2011 | Dong et al. | |
| 8,088,645 B2 | 1/2012 | Liu et al. | |
| 8,110,474 B2 | 2/2012 | Carobolante et al. | |
| 8,169,108 B2 | 5/2012 | Dupuis et al. | |
| 8,188,814 B2 | 5/2012 | Ng et al. | |
| 8,344,464 B2 | 1/2013 | Cho | |
| 8,421,204 B2 | 4/2013 | Liu et al. | |
| 8,497,573 B2 | 7/2013 | Cho et al. | |
| 8,525,334 B2 | 9/2013 | Cardwell | |
| 8,614,503 B2 | 12/2013 | Cho | |
| 8,674,486 B2 | 3/2014 | Haigh et al. | |
| 2003/0160338 A1 | 8/2003 | Yang | |
| 2006/0109605 A1 | 5/2006 | Matters-Kammerer | |
| 2006/0267159 A1 | 11/2006 | Yamamoto et al. | |
| 2007/0040238 A1 | 2/2007 | Yamasaki et al. | |
| 2007/0062027 A1 | 3/2007 | Ripamonti et al. | |
| 2007/0080587 A1 | 4/2007 | Ruizenaar et al. | |
| 2009/0073633 A1 | 3/2009 | Tews | |
| 2010/0109123 A1 | 5/2010 | Strzalkowski et al. | |
| 2011/0013349 A1 | 1/2011 | Morikita et al. | |
| 2011/0018136 A1 | 1/2011 | Bedair et al. | |
| 2011/0037169 A1* | 2/2011 | Pagaila | H01L 21/561 257/737 |
| 2011/0062584 A1 | 3/2011 | Ishihara et al. | |
| 2011/0156243 A1 | 6/2011 | Chang et al. | |
| 2011/0156261 A1 | 6/2011 | Kapusta et al. | |
| 2011/0285007 A1 | 11/2011 | Chi et al. | |
| 2011/0285215 A1 | 11/2011 | Hatase | |
| 2012/0286404 A1 | 11/2012 | Pagaila | |
| 2013/0037909 A1 | 2/2013 | French et al. | |
| 2013/0075923 A1 | 3/2013 | Park et al. | |
| 2013/0154071 A1 | 6/2013 | Haigh et al. | |
| 2013/0316646 A1* | 11/2013 | Steeneken | H01L 28/60 455/41.1 |
| 2014/0071650 A1 | 3/2014 | Flores et al. | |
| 2014/0312458 A1 | 10/2014 | Ashrafzadeh et al. | |
| 2016/0190918 A1* | 6/2016 | Ho | H01L 23/48 327/530 |

OTHER PUBLICATIONS

Second Office Action for Chinese Application No. 201510015097.8, dated Jan. 29, 2019, 8 pages.

Summons to Oral Proceedings for European Application No. 14001300.4, dated Mar. 28, 2019, 8 pages.

\* cited by examiner

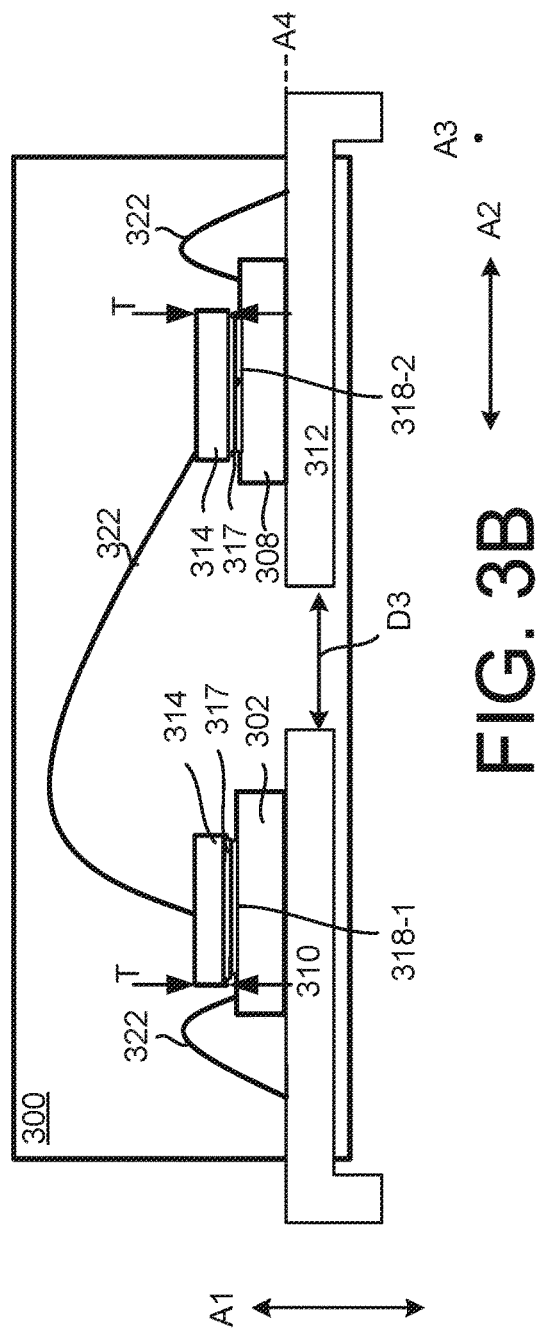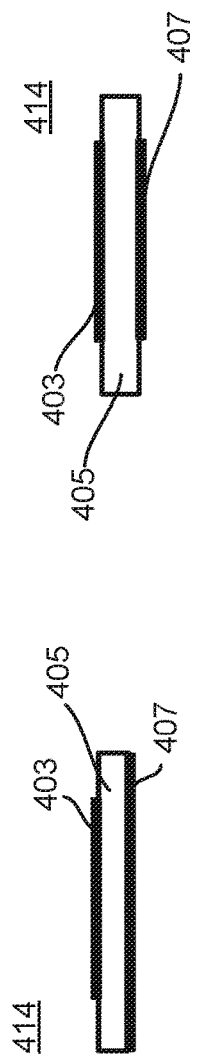

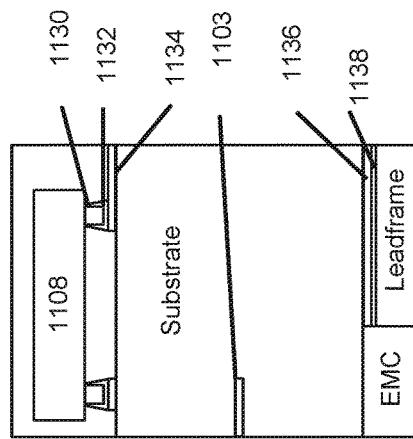
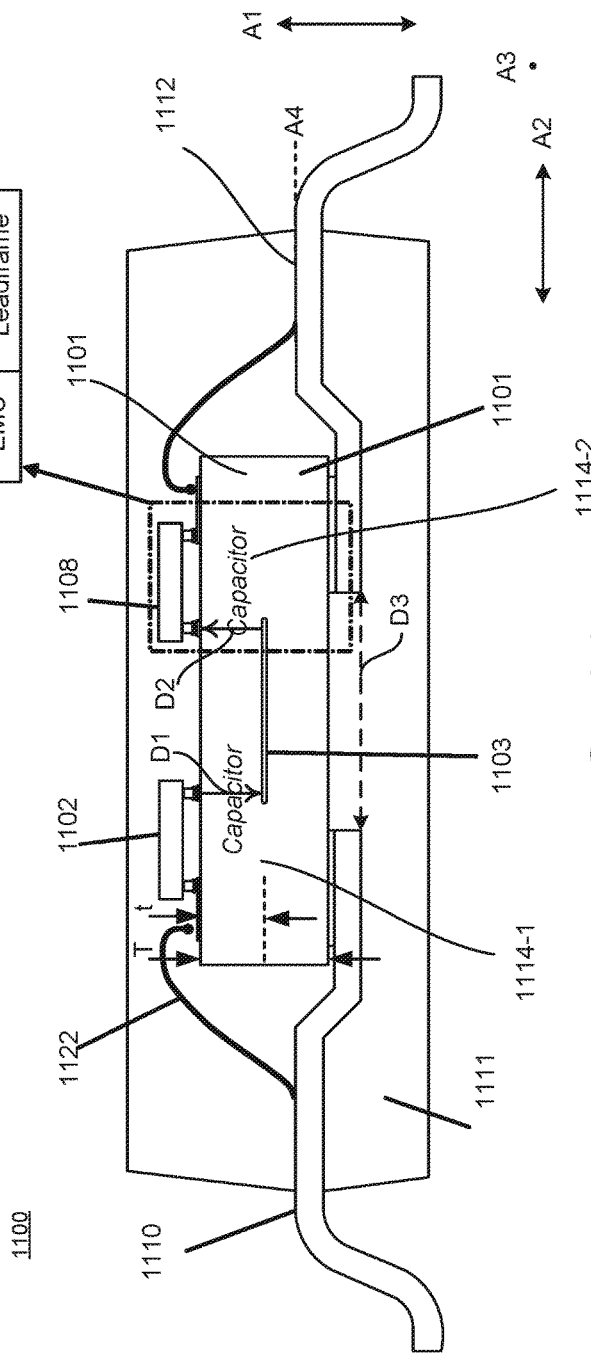
FIG. 11B
FIG. 11A

1300

1302 — Dispose solder on lead frame portions

1304 — Attach substrate to lead frame portions

1306 — Dispose solder on substrate

1308 — Attach flip-chip die to substrate

1310 — Heat solder to reflow

1312 — Perform flux cleaning

1314 — Connect substrate to lead frame portions

1316 — Perform plasma clean

1318 — Coat package in molding + PMC

1320 — Perform Postplate + SRB

1322 — Perform trim and form

1324 — Perform electrical testing

1326 — Perform finishing (Mark + TNR)

FIG. 13

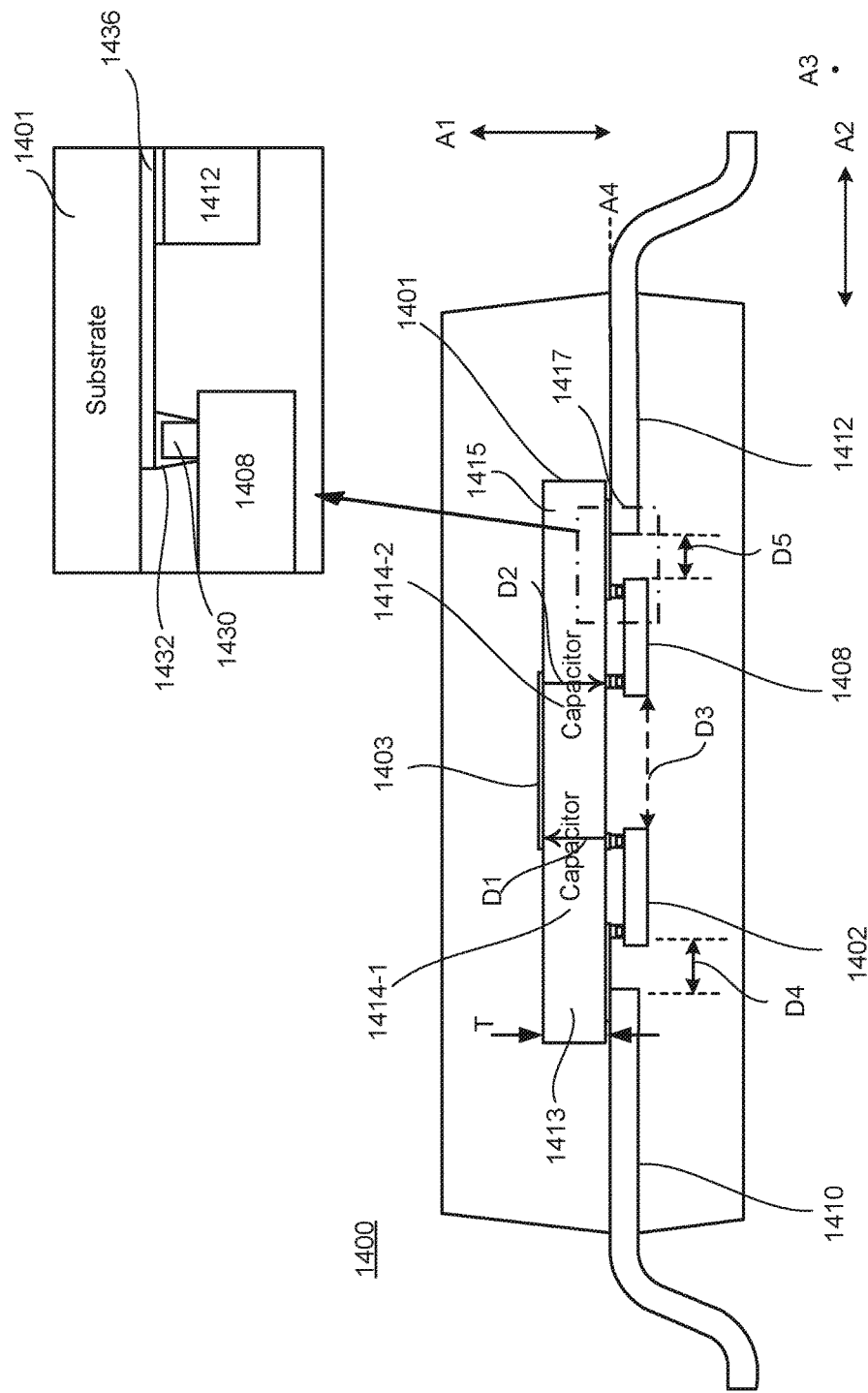

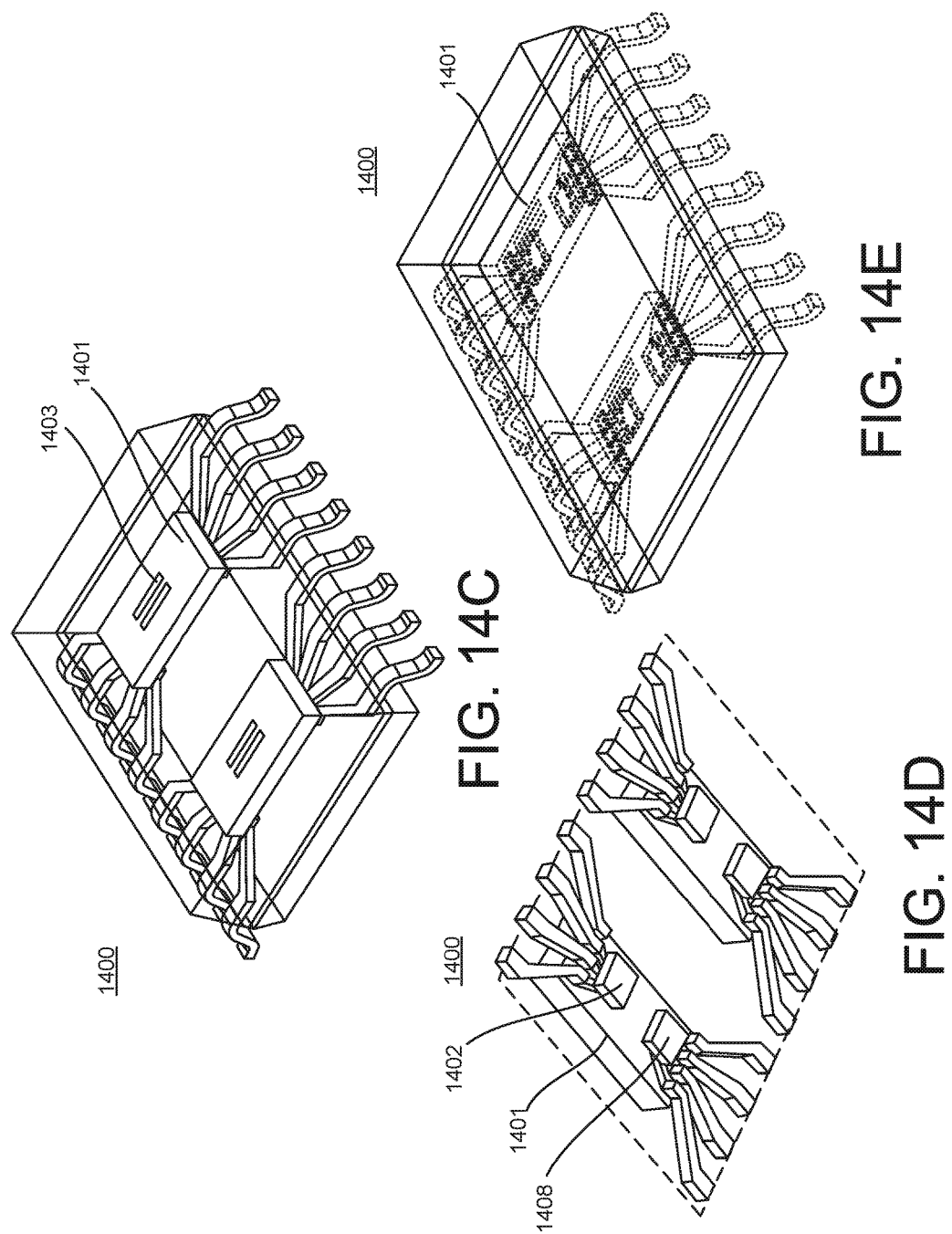

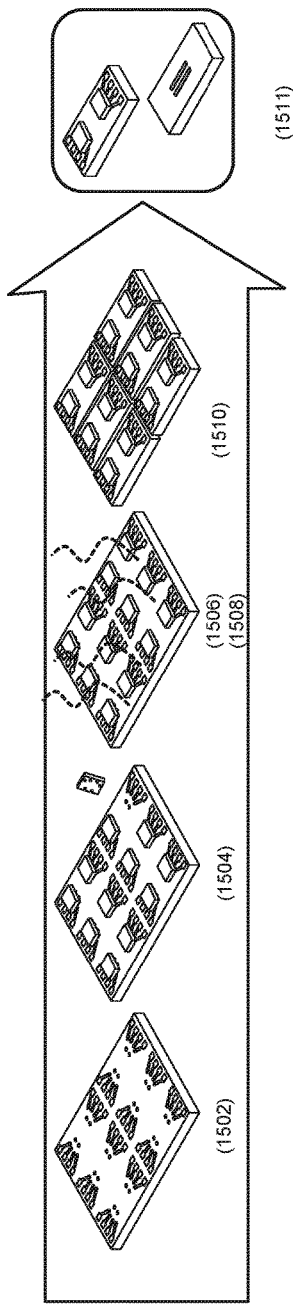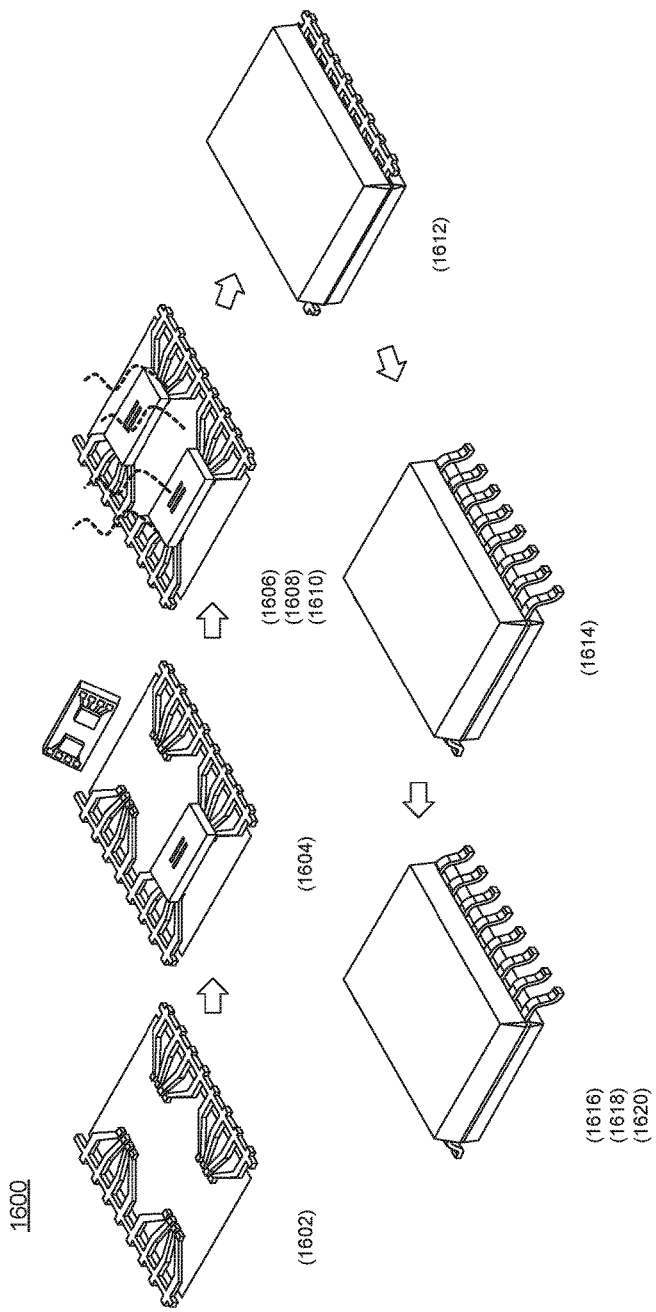
FIG. 15
FIG. 16

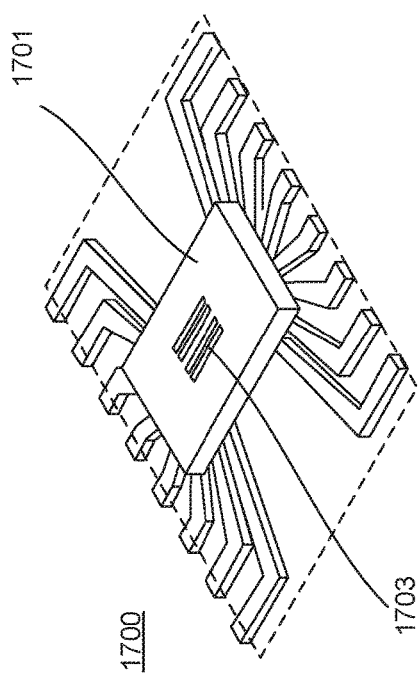
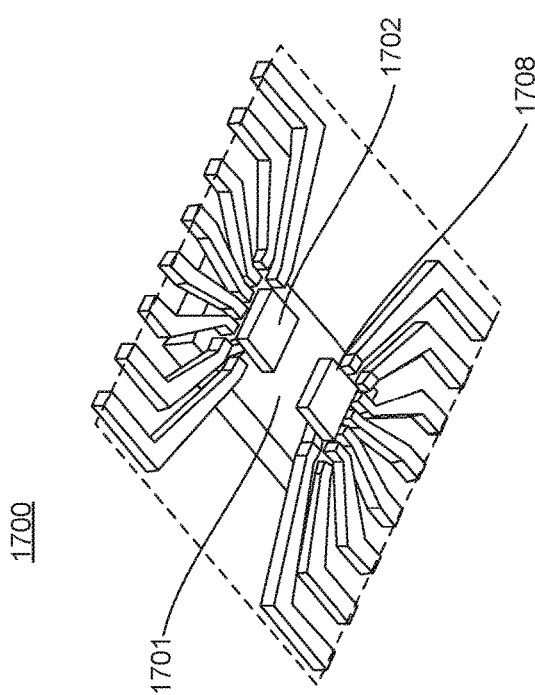

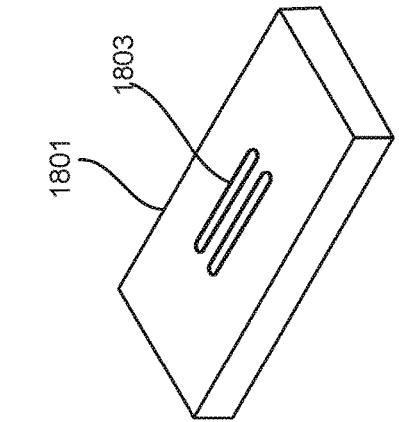
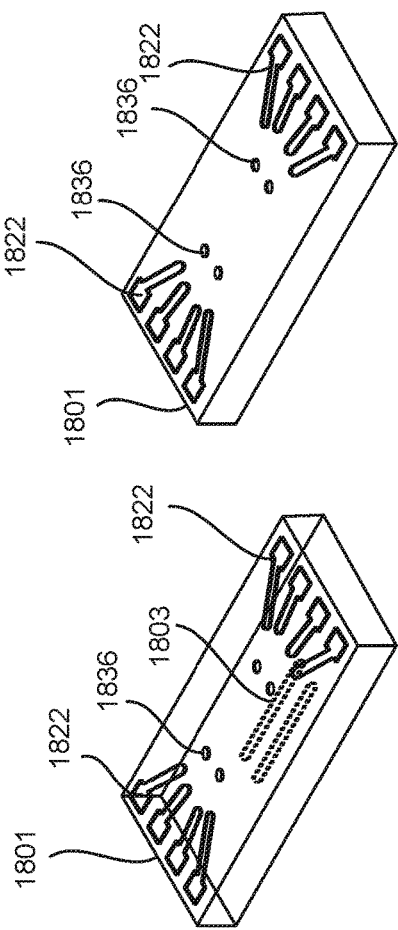
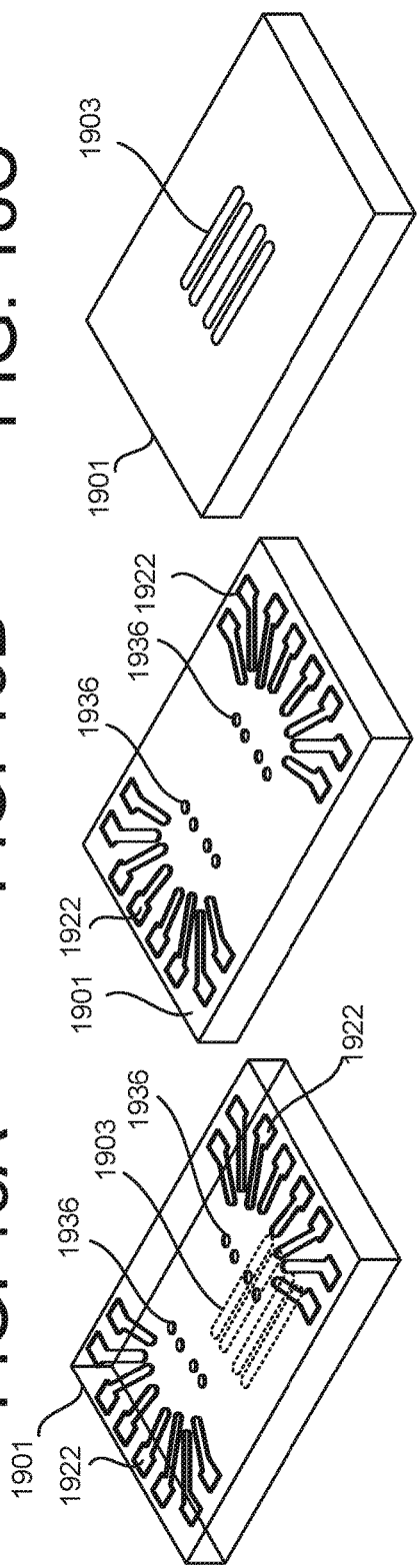
FIG. 18C
FIG. 19C
FIG. 18B
FIG. 19B
FIG. 18A
FIG. 19A

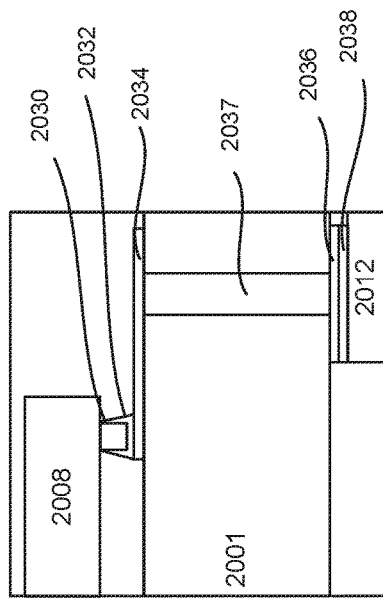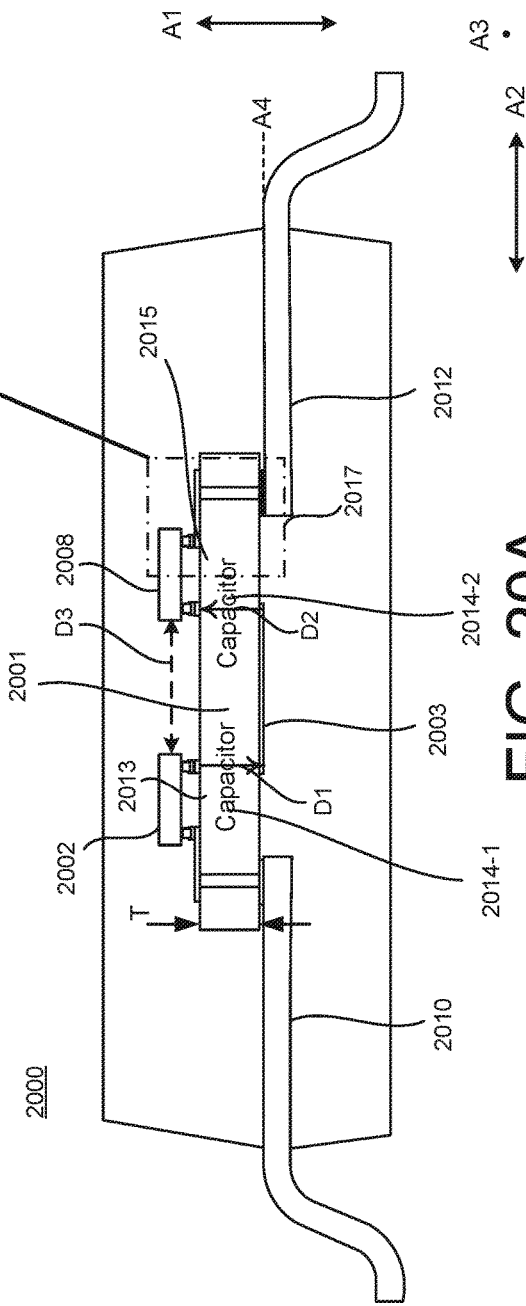
FIG. 20B
FIG. 20A

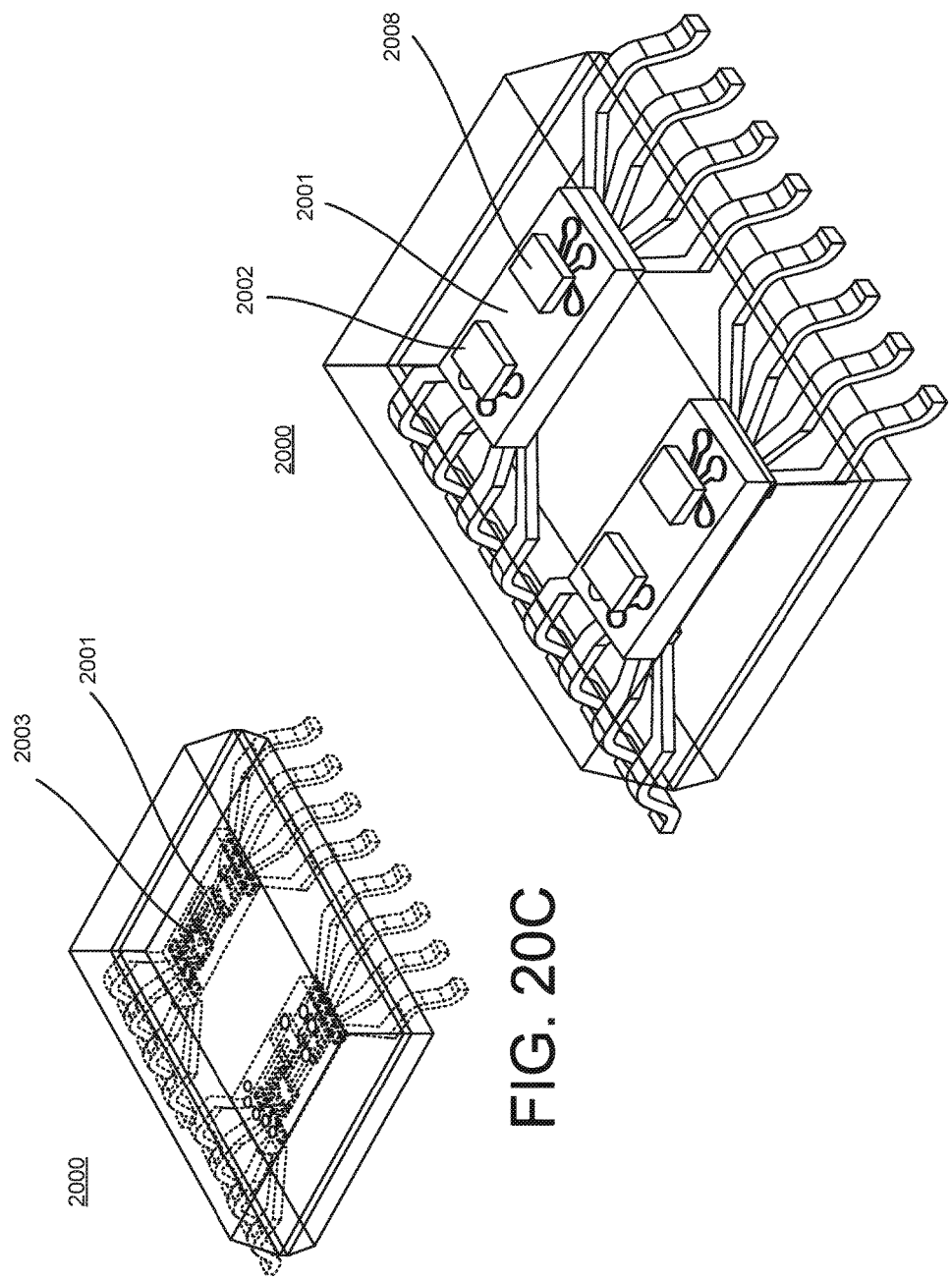

2100

2102 — Dispose solder on lead frame portions

2104 — Attach isolation substrate bridge to lead frame portions

2106 — Attach semiconductor die to the substrate bridge

2108 — Perform solder reflow

2110 — Perform flux clean

2112 — Perform plasma clean

2114 — Coat in molding + PMC

2116 — Perform trim and form

2118 — Perform electrical testing

2120 — Perform finishing (Mark + TNR)

FIG. 21

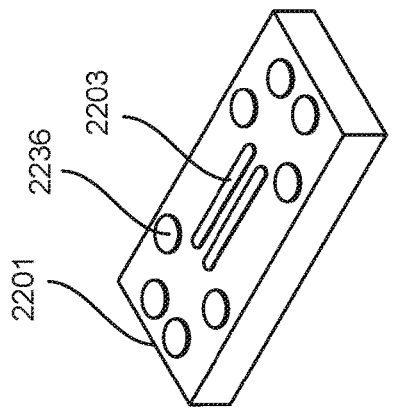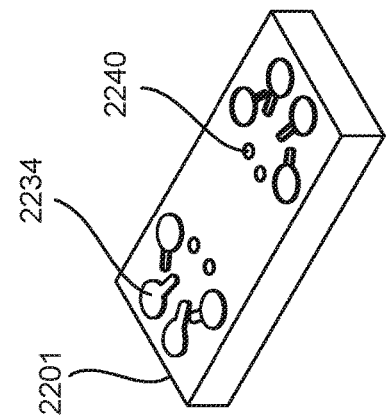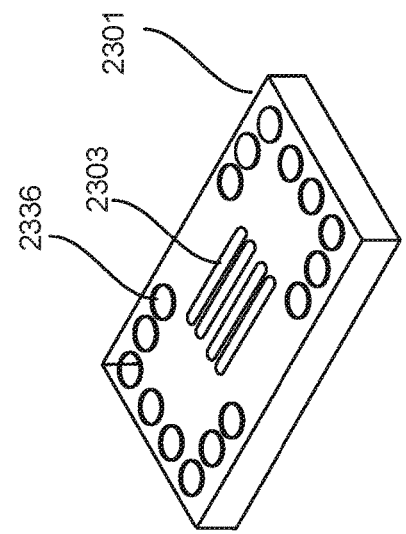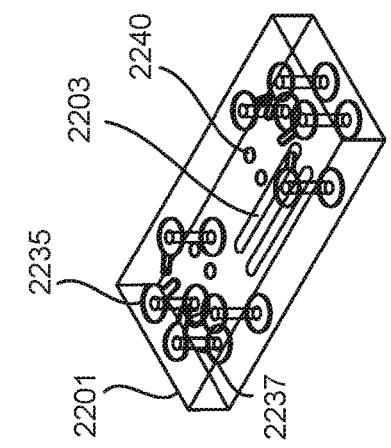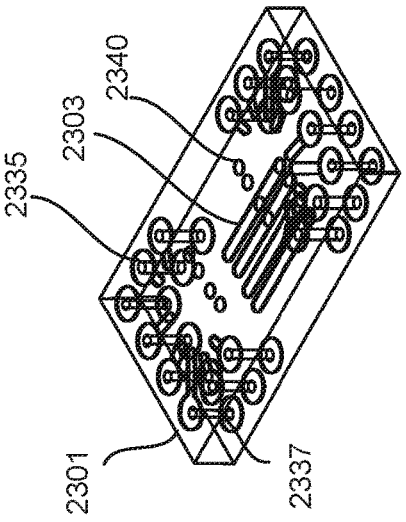

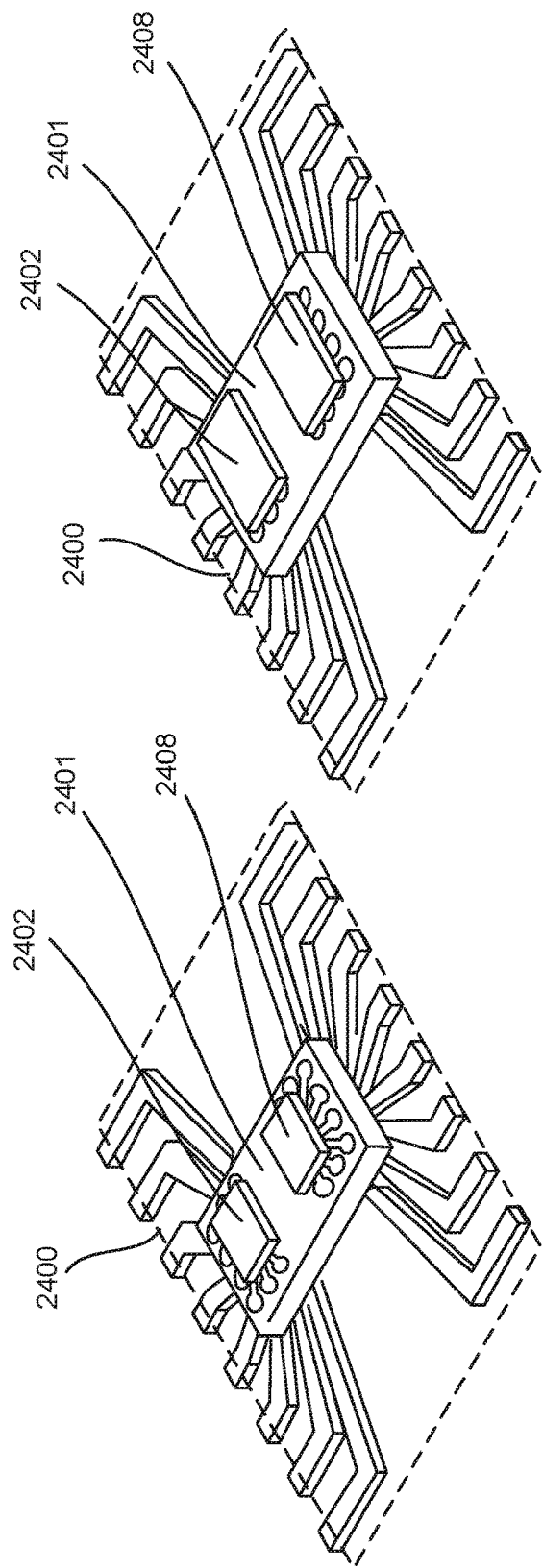

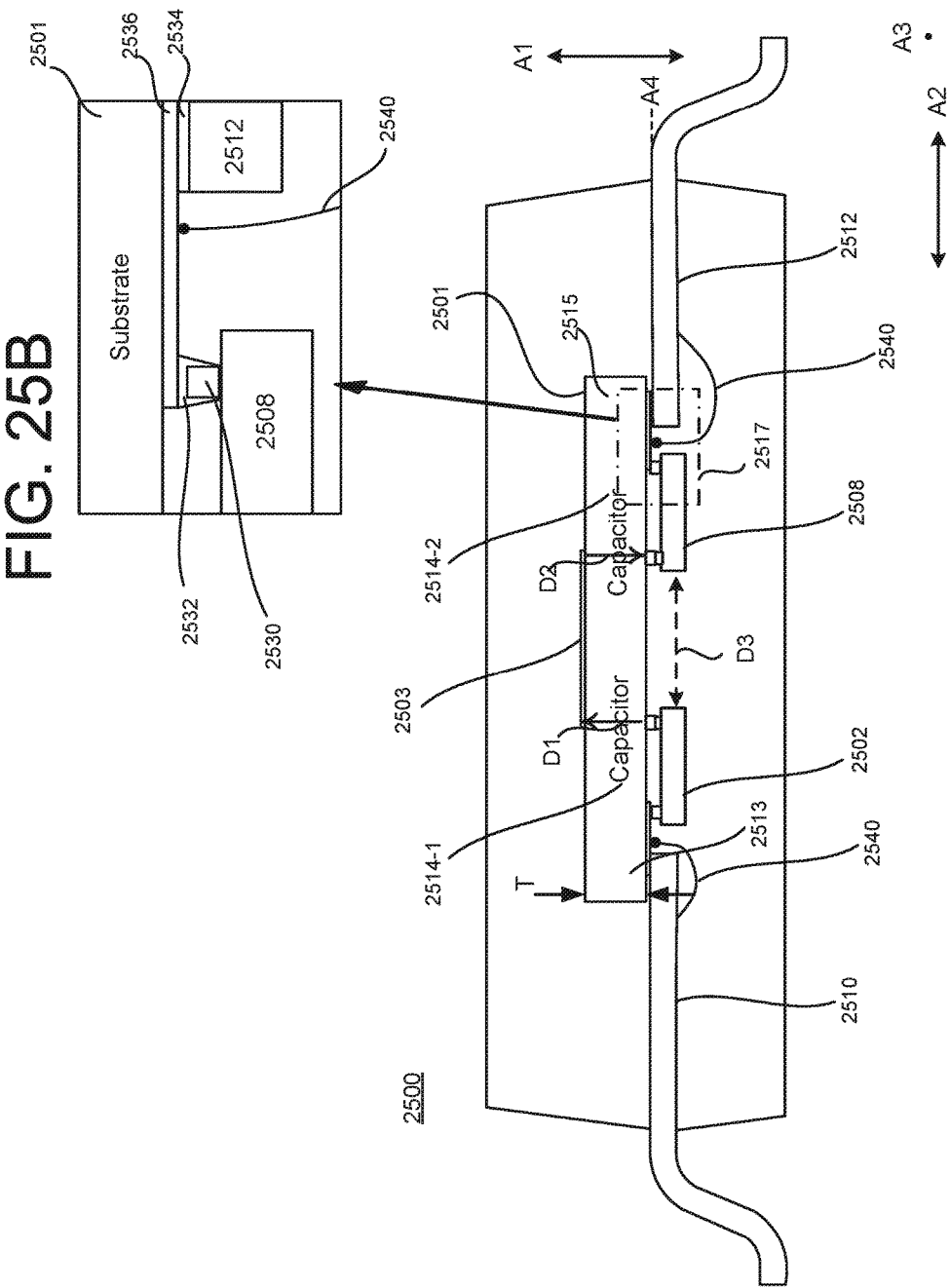

2600

Pre-assembly (on Substrate)

2602 — ⊙ Dispose solder on the substrate
2604 — ⊙ Attach die to the substrate
2606 — ⊙ Heat to reflow solder
2608 — ⊙ Perform Flux clean
2610 — ⊙ Substrate Singulation

Package Assembly

2612 — ⊙ Dispose solder on lead frame portions
2614 — ⊙ Attach loaded substrate
2616 — ⊙ Solder Reflow/ Adhesive Cure
2618 — ⊙ Perform Flux Clean (if solder)
2620 — ⊙ Perform wire bond
2622 — ⊙ Perform Plasma Clean
2624 — ⊙ Coat package in molding and PMC
2626 — ⊙ Perform Post-plate and SRB
2628 — ⊙ Perform trim And form
2630 — ⊙ Perform electrical testing
2632 — ⊙ Perform finishing (Mark + TNR)

FIG. 26

ISOLATION BETWEEN SEMICONDUCTOR COMPONENTS

RELATED APPLICATIONS

This application is a continuation application of U.S. patent application Ser. No. 14/593,642, filed Jan. 9, 2015, entitled "Isolation Between Semiconductor Components," which claims the benefit of U.S. Provisional Patent Application No. 61/926,030, filed Jan. 10, 2014, entitled "Isolation Between Semiconductor Components," both of which are hereby incorporated by reference in their entirety.

TECHNICAL FIELD

This description relates to isolation for semiconductor devices.

BACKGROUND

Isolators may be used between multiple semiconductor circuits operating at different voltage levels in order to isolate but permit the exchange of data between these circuits. Conventionally, these isolations may include optocouplers, capacitors, transformers, small magnetic coils or giant magneto registers (GMR) as isolation elements between semiconductor circuits. However, in some conventional approaches, an isolator may be integrated (or built) within the semiconductor component itself using the metal capacitance between the top metal layer and bottom metal layers (as well as intermediate layers) to form a capacitance-based insulator, and the insulation is provided by either a layer of oxide or a thin polyimide tape between the metal layers within the bulk of the semiconductor component. The thickness of the dielectric stacks between the top and bottom isolation contacts of the capacitor determines the distance through insulation and limits the maximum isolation voltage that is achievable. Conventionally, these isolators have been limited in their distance through insulation which may decrease insulation performance and increase the risk of electrostatic discharge (ESD) degrading the insulating properties of the device.

SUMMARY

In some general aspects, an apparatus may include a first semiconductor die, a second semiconductor die, and a capacitive isolation circuit being coupled to the first semiconductor die and the second semiconductor die. The capacitive isolation circuit may be disposed outside of the first semiconductor die and the second semiconductor die. The first semiconductor die, the second semiconductor die, and the capacitive circuit may be included in a molding of a semiconductor package.

In some general aspects, the capacitive isolation circuit may be coupled to the first semiconductor die via a first conductive component, and the capacitive isolation circuit may be coupled to the second semiconductor die via a second conductive component. The capacitive isolation circuit may include capacitors and transmission lines forming at least one capacitive network to transmit data between the first semiconductor die and the second semiconductor die. The capacitive isolation circuit may include a first conductive layer, second conductive layer, and a dielectric material disposed between the first conductive layer and the second conductive layer. The dielectric material may include one of a glass material and a ceramic material. The capacitive isolation circuit may include a dielectric thickness that provides a distance through insulation equal to or greater than 0.1 mm. The capacitive isolation circuit may have a distance through insulation greater than or equal to a minimum distance between the first lead frame portion and the second lead frame portion. The capacitive isolation circuit may include a differential communication channel for communicating between the first semiconductor die and the second semiconductor die. The differential communication channel may include a first conductive transmission line, and a second conductive transmission line. Each of the first semiconductor die and the second semiconductor die may include a top conductive layer and a bottom conductive layer. The capacitive isolation circuit may be formed outside the top conductive layer and the bottom conductive layer.

In some general aspects, the capacitive isolation circuit may include a first capacitor network having first and second conductive layers with a dielectric material disposed between the first and second conductive layers, a second network capacitor having first and second conductive layers with a dielectric material disposed between the first and second conductive layers, a bond wire coupled to the first conductive layer of the first capacitor and the first conductive layer of the second capacitor network. The second conductive layer of the first capacitor may be coupled to a conductor of the first semiconductor die, and the second conductive layer of the second capacitor network may be coupled to a conductor of the second semiconductor die.

In some general aspects, the capacitive isolation circuit may include an isolation substrate bridge having a dielectric material and at least one conductive transmission line that communicatively couples the first semiconductor die with the second semiconductor die. The at least one conductive transmission line may include a plurality of conductive transmission lines. The isolation substrate bridge may be at least partially disposed on top of the first semiconductor die and at least partially disposed on top of the first semiconductor die, and the at least one conductive transmission line may be disposed on a top surface of the dielectric material. The isolation substrate bridge may be disposed between the first semiconductor die and second semiconductor die, and the first and second lead frame portions. The at least one conductive transmission line may be disposed on a bottom surface of the dielectric material. The at least one conductive transmission line may be embedded within the dielectric material. The isolation substrate bridge may be disposed on top of at least a portion of the first lead portion, the first semiconductor die, the second semiconductor die, and at least a portion of the second lead portion. The at least one conductive transmission line may be disposed on a top surface of the dielectric material. The isolation substrate bridge may include a first portion coupled to the first semiconductor die, a second portion disposed in an area between the first semiconductor die and the second semiconductor die, and a third portion coupled to the second semiconductor die.

In some general aspects, a first semiconductor die disposed proximate to a first lead frame portion, a second semiconductor die disposed proximate to a second lead frame portion, and a capacitive circuit coupled to the first semiconductor die and coupled to the second semiconductor die. The capacitive circuit may have a distance through insulation greater than or equal to a minimum distance between a first conductive component and a second conductive component.

In some general aspects, the capacitive isolation circuit may include an isolation substrate bridge having a dielectric material and at least one conductive transmission line that communicatively couples the first semiconductor die with the second semiconductor die. The at least one conductive transmission line may include a plurality of conductive transmission lines configured as a bi-directional differential channel. The isolation substrate bridge may be at least partially disposed on top of the first semiconductor die and at least partially disposed on top of the first semiconductor die, and the at least one conductive transmission line may be disposed on a top surface of the dielectric material. The isolation substrate bridge may be disposed between the first semiconductor die and second semiconductor die, and the first and second lead frame portions. The at least one conductive transmission line may be disposed on a bottom surface of the dielectric material. The at least one conductive transmission line may be embedded within the dielectric material.

In some general aspects, an apparatus may include a first semiconductor die disposed proximate to a first lead frame portion, a second semiconductor die disposed proximate to a second lead frame portion, and an isolation substrate bridge disposed proximate to the first semiconductor die and the second semiconductor die. The isolation substrate bridge may be configured to support communication between the first semiconductor die and the second semiconductor die.

In some general aspects, the isolation substrate bridge may include a differential communication channel for communicating between the first semiconductor die and the second semiconductor die. The apparatus may include a third semiconductor die disposed on a third lead frame portion. Each of the first semiconductor die and the second semiconductor die may include a top conductive layer and a bottom conductive layer. The isolation substrate bridge may be formed outside the top conductive layer and the bottom conductive layer.

The details of one or more implementations are set forth in the accompanying drawings and the description below. Other features will be apparent from the description and drawings, and from the claims.

BRIEF DESCRIPTION OF THE DRAWINGS

FIG. 3B illustrates a cross-section of the capacitor networks that are coupled to the semiconductor die via conductive epoxy according to an embodiment;

FIG. 4A illustrates an example of a capacitor network according to an embodiment;

FIG. 4B illustrates another example of the capacitor network according to an embodiment;

FIG. 11A illustrates a cross-sectional view of the semiconductor package according to an embodiment;

FIG. 11B illustrates a more detailed view of a portion of the cross-section view of FIG. 11A according to an embodiment;

FIG. 13 illustrates a process flow for constructing the semiconductor packages of FIGS. 11-12 according to an embodiment;

FIG. 14A illustrates a cross-sectional view of a semiconductor package using an inverted substrate and a flip-chip configuration according to an embodiment;

FIG. 14B illustrates a more detailed view of a portion of the cross-sectional view of FIG. 14A according to an embodiment;

FIG. 14C illustrate a top view of a semiconductor package having pairs of semiconductor die communicating on a single channel substrate according to an embodiment;

FIG. 14D illustrates a bottom view of the semiconductor package having pairs of semiconductor die communicating on a single channel substrate according to an embodiment;

FIG. 14E illustrates another perspective of the semiconductor package having pairs of semiconductor die communicating on a single channel substrate according to an embodiment;

FIG. 15 illustrates a pre-process flow for constructing the semiconductor packages of FIGS. 14A-14E according an embodiment;

FIG. 16 illustrates a package assembly flow for constructing the semiconductor packages of FIGS. 14A-14E according to an embodiment;

FIG. 17A illustrates a top view of the semiconductor package according to an embodiment;

FIG. 17B illustrates a bottom view of the semiconductor package of the FIG. 17A according to an embodiment;

FIG. 18A illustrates a perspective of the isolation substrate bridge according to an embodiment;

FIG. 18B illustrates a top view of the isolation substrate bridge of FIG. 18A according to an embodiment;

FIG. 18C illustrates a bottom view of the isolation substrate bridge of FIG. 18A or 18B according to an embodiment;

FIG. 19A illustrates a perspective of the isolation substrate bridge according to another embodiment;

FIG. 19B illustrates a top view of the isolation substrate bridge of FIG. 19A according to an embodiment;

FIG. 19C illustrates a bottom view of the isolation substrate bridge of the FIG. 19A or 19B according to an embodiment;

FIG. 20A illustrates a cross-sectional view of a semiconductor package having an isolation substrate bridge using a conductive connection within a flip-chip configuration according to an embodiment;

FIG. 20B illustrates a more detailed view of a portion of the cross-sectional view of FIG. 20A according to an embodiment;

FIG. 20C illustrates a top view of a semiconductor package having pairs of semiconductor die communicating on a single channel substrate according to an embodiment;

FIG. 20D illustrates a top view of a semiconductor package having pairs of semiconductor die communicating on a single channel substrate according to an embodiment;

FIG. 21 illustrates a process flow for constructing the semiconductor packages of FIGS. 20A-20D according to an embodiment;

FIG. 22A illustrates a perspective of the isolation substrate bridge according to an embodiment;

FIG. 22B illustrates a top view of the isolation substrate bridge of FIG. 22A according to an embodiment;

FIG. 22C illustrates a bottom view of the isolation substrate bridge of FIG. 22A or 22B according to an embodiment;

FIG. 23A illustrates a perspective of the isolation substrate bridge according to another embodiment;

FIG. 23B illustrates a top view of the isolation substrate bridge of FIG. 23A according to an embodiment;

FIG. 23C illustrates a bottom view of the isolation substrate bridge of FIG. 23A or 23B according to an embodiment;

FIG. 24A illustrates a top view of a semiconductor package having a pair of semiconductor die with an isolation substrate bridge configured as a dual channel communication substrate according to an embodiment;

FIG. 24B illustrates a top view of the semiconductor package of FIG. 24A according to another embodiment;

FIG. 25A illustrates a cross-sectional view of a semiconductor package using an inverted substrate and flip-chip configuration with wire bonds according to an embodiment;

FIG. 25B illustrates a more detailed view of a portion of the cross-sectional view of FIG. 25A according to an embodiment;

FIG. 26 illustrates a process flow for constructing the semiconductor packages of FIGS. 25A-25E according to an embodiment;

DETAILED DESCRIPTION

Figure 1:
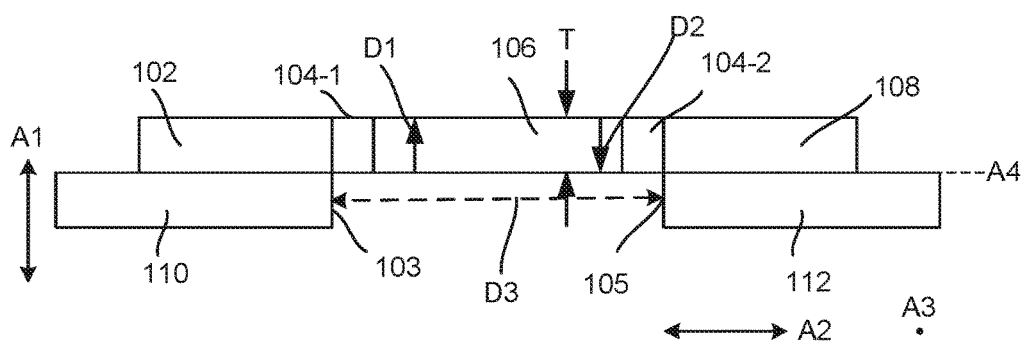
FIG. 1 illustrates an apparatus for providing isolation between multiple semiconductor die according to an embodiment.

The disclosure herein is related to a semiconductor apparatus providing a non-optical based capacitive isolation circuit between a first semiconductor die and a second semiconductor die such that the capacitive isolation circuit not only provides galvanic isolation between the first semiconductor die and the second semiconductor die but also functions as a transmission system to communicate data across the capacitive isolation circuit. Also, the capacitive isolation circuit is provided outside the first semiconductor die and the second semiconductor die but within a molding of a semiconductor package. The first semiconductor die and the second semiconductor die can be coupled to a lead frame (or portions thereof). In other words, in contrast to conventional techniques, an isolator is not formed (or built within) within the bulk of the semiconductor die itself, but rather the capacitive isolation circuit is disposed external to the semiconductor die (but still within the semiconductor molding) such that the distance through insulation can be increased. As a result, the semiconductor apparatus having the capacitive isolation circuit can support applications having a relatively high voltage level within a relatively compact package, thereby providing sufficient isolation between the multiple semiconductor die while permitting relatively fast transmission across the insulation barrier in a safe manner.

In some implementations, the capacitive isolation network may include a dielectric material (or sometimes referred to as a dielectric substrate, substrate, or isolation substrate bridge) and conductors (e.g., metal plates, lines, pads, layers, etc.) disposed on at least a portion of the top and/or bottom surfaces (and/or embedded within a portion of the dielectric material). As further described below, the configuration of the conductive material on or within the dielectric substrate may define a capacitive network for transmitting data across the dielectric substrate. In some implements, the capacitive network may be represented by, or can include, two or more capacitors. Further, in some implementations, the capacitive isolation network may include a top conductive layer disposed on at least a portion of the top surface of the dielectric material, and a bottom conductive layer disposed on at least a portion of the bottom surface of the dielectric material.

The capacitive isolation circuit may be coupled to the first semiconductor die and the second semiconductor die via a conductive component such as bond wires, solder (which may be in the form of solder balls), and/or conductive epoxy. In some implementations, the capacitive isolation circuit may be defined as two or more capacitors disposed outside the bulk of the integrated circuit. In some implementations, a first capacitor network is placed on top of a first semiconductor die, and a second capacitor network is placed on top of a second semiconductor die. Each of the first and second capacitor networks may be considered one or more capacitors. In other implementations, the capacitor networks are placed on a portion of the lead frame separate from the multiple semiconductor die. In other examples, the capacitor networks are built within an isolation substrate bridge (which may be composed of a dielectric substrate having various types of conductors) between the first semiconductor die and the second semiconductor die. As a result, the distance through insulation may be increased such that the semiconductor package may support relatively high levels of voltage in a relatively safe manner with a reduced risk of electrostatic discharge (ESD) damage or breakdown. These and other features are further explained with reference to the following figures.

FIG. 1 illustrates an apparatus 100 for providing isolation between multiple semiconductor die according to an embodiment. In some implementations, the apparatus 100 provides galvanic isolation between multiple semiconductor die. Galvanic isolation may refer to the concept of isolating functional sections of electronics to prevent or substantially prevent current flow (e.g., no direct conduction path), but allows the exchange of information by other means such as capacitance. The apparatus 100 may include a first semiconductor die 102 disposed proximate to (e.g., disposed on, coupled to, directly coupled to) a first lead frame portion 110, a second semiconductor die 108 disposed proximate to (e.g., disposed on, coupled to, directly coupled to) a second lead frame portion 112, and a capacitive isolation circuit 106 coupled to the first semiconductor die 102 via a first conductive component 104-1 and coupled to the second semiconductor die 108 via a second conductive component 104-2. In some implementations, the apparatus 100 may be included within a molding (not shown) of a semiconductor package. For example, the molding of the semiconductor package may include one or more types of material (e.g., in a molding compound if including multiple types of materials) such as a metal, a plastic, a resin, an epoxy, a phenolic hardener, a silica material, a pigment, a glass, a ceramic casing, and/or so forth and can contain (or enclose) at least the components of FIG. 1.

The first semiconductor die 102 and/or the second semiconductor die 108 may be, or include, a semiconductor material having an integrated circuit, a processor, microprocessor, memory and/or any semiconductor device or circuit. In some implementations, one or more of the semiconductor die 102, 108 can include a variety of semiconductor devices. In some implementations, the first semiconductor die 102 can operate at a different voltage level than the second semiconductor die 108. In some implementations, one or more of the semiconductor die 102, 108 can be, or can include, a discrete semiconductor device. Specifically, one or more of the semiconductor die 102, 108 can be, or can include, a laterally-oriented transistor device (e.g., a lateral metal-oxide-semiconductor field-effect transistor (MOSFET) device) and/or a vertically-oriented transistor device (e.g., a vertical MOSFET device). In some implementations, one or more of the semiconductor die 102, 108 can be, or can include, a bipolar junction transistor (BJT) device, a diode device, an insulated-gate bipolar transistor (IGBT) device, and/or so forth. In some implementations, one or more of the semiconductor die 102, 108 can be, or can include, a circuit such as a filter circuit, a controller circuit, a driver circuit, a communication circuit (e.g., a receiver and/or transmitter), and/or so forth. In some implementations, one or more of the semiconductor die 102, 108 can be any type of circuit used for any type of functions. In some implementations, one or more of the semiconductor die 102, 108 can include special purpose logic circuitry, combinational logic, a field programmable gate array (FPGA), an application-specific integrated circuit (ASIC). In some implementations, semiconductor die 102 and/or semiconductor die 108 can instead be a module (e.g., a discrete device module, a packaged device module). In some implementations, each of the first semiconductor die 102 and the second semiconductor die 108 may include a single integrated circuit or may be separate integrated circuits. In some implementations, an additional semiconductor die is provided within the semiconductor package (e.g., hybrid option or 3-die configuration) in a manner described with reference to FIG. 27. In some implementations, the semiconductor material may be an electronic-grade silicon or any other type of semiconductor substrate. As a specific example, the first semiconductor die 102 may be a controller die including a controller device formed on a semiconductor material, and the second semiconductor die 108 may be a driver die including a driver device formed on a semiconductor material, or vice versa. In some implementations, the driver die may be considered, or may function as, the output die.

In some implementations, the first lead frame portion 110 and the second lead frame portion 112 may be included in a same lead frame but may be different portions of the same lead frame. In other implementations, the first lead frame portion 110 and the second lead frame portion 112 may relate to two separate lead frames. For example, the first lead frame portion 110 may be included in a portion of a first lead frame, and the second lead frame portion 112 may be included in a portion of a second lead frame separate from the first lead frame. In either case, the first lead frame portion 110 and the second lead frame portion 112 may be any type of conductive structure including copper, a copper alloy, aluminum, and/or so forth that can be used within a semiconductor package.

In some implementations, as shown in FIG. 1, the first semiconductor die 102 may be disposed on a top surface of the first lead frame portion 110, and the second semiconductor die 108 may be disposed on a top surface of the second lead frame portion 112. As discussed herein, the terms top and bottom refer to the relative location of the corresponding component when the apparatus 100/semiconductor package is within an orientation. In some implementations, a portion of the apparatus 100, or a direction away from the lead frame portions 110, 112 (substantially along the direction A1), can be referred to as top portion or an upward direction. In some implementations, a portion of the apparatus 100, or a direction away from the lead frame portions 110, 112 (substantially along the direction A1), can be referred to as bottom portion or a downward direction. A direction A3 into the page (shown as a dot) is aligned along or parallel to the plane A4 and is orthogonal to directions A1 and A2. In the implementations described herein, the vertical direction is normal to a plane along which the semiconductor die 102, 108 are aligned (e.g., the plane A4). The directions A1, A2, and A3, and plane A4, are used throughout several of the various views of the implementations described throughout the figures for simplicity.

Also, it is noted that although FIG. 1 depicts the first semiconductor die 102 and the second semiconductor die 108 on top and aligned with an inner edge 103 of the first lead frame portion 110 and an inner edge 105 of the second lead frame portion 112, respectively, the first semiconductor die 102 and the second semiconductor die 108 may be disposed at any location along the top surface of their respective lead frame portions 110, 112. For example, the first semiconductor die 102 may be spaced further apart from the second semiconductor die 108 by disposing these semiconductor die 102, 108 at locations away from the inner edges 103, 105 of the lead frame portions 110, 112 along the direction A2. Regardless of the location along the top surface of the lead frame portions, the first semiconductor die 102 may be coupled to the top surface of the first lead frame portion 110, and the second semiconductor die 108 may be coupled to the top surface of the second lead frame portion 112 using any type of die attachment material (e.g., conductive epoxy, solder bumps, adhesive, etc.).

In other implementations, the first semiconductor die 102 may be disposed above (along a vertical direction), below (along a vertical direction), and/or adjacent (along a lateral direction) to the first lead frame portion 110, and the second semiconductor die 108 may be disposed above, below, and/or adjacent to the second lead frame portion 112. In some implementations, the first semiconductor die 102 and the second semiconductor die 108 may be at least partially supported by the capacitive isolation circuit 106, and the first semiconductor die 102 and the second semiconductor die 108 may be coupled to their respective lead frame portions using conductive epoxy, conductive plates, solder bumps, or generally any type of attachment material.

As shown in FIG. 1, the capacitive isolation circuit 106 may be coupled to the first semiconductor die 102 via a first conductive component 104-1, and the capacitive isolation circuit 106 may be coupled to the second semiconductor die 108 via a second conductive component 104-2. In some implementations, the first conductive component 104-1 and the second conductive component 104-2 may be bond wire(s), solder, or epoxy, or any combination thereof. A bond wire may be a conductive (e.g., metal) wire such as aluminum, copper, or gold, or any combination thereof, for example. Solder may be a fusible conductive alloy (e.g., metal alloy). In one implementation, the solder may be a plurality of solder balls. The epoxy may be any type of conductive epoxy. Also, the capacitive isolation circuit 106 may be disposed in any location relative to the first semiconductor die 102 and the second semiconductor die 108, as further explained below.

Generally, the capacitive isolation circuit 106 may define a capacitive coupling network within an isolator that may permit the transfer of data between the first semiconductor die 102 and the second semiconductor die 108 through the insulation material or substrate. For example, the first semiconductor die 102 may transmit or receive data to/from the second semiconductor die 108 via the capacitive isolation circuit 106. For example, the capacitive isolation circuit 106 may be a structure that provides a transmission path within an isolation material via an electric field. In some implementations, the capacitive isolation circuit 106 may include one, two, or more transmission paths or transmission lines that may be formed on top, below, or embedded within the dielectric substrate of the capacitive isolation circuit 106. In some implementations, the capacitive isolation circuit 106 (or any capacitive isolation circuit described with reference to any figures) may support differential communication. In some implementations, the capacitive isolation circuit 106 (or any capacitive isolation circuit described with reference to any figures) may support bi-directional differential communication. With respect to bi-directional differential communication, the capacitive isolation circuit 106 may define a bi-directional differential communication channel. In order to realize bi-directional differential communication, in some implementations, the capacitive isolation circuit 106 may include two distinct transmission networks (e.g., one for one direction and the other for the opposite direction), where each transmission network may include a pair of conductive transmission lines that are used for differential sensing at the first semiconductor die 102 and/or the second semiconductor die 108. In some implementations, the capacitive isolation circuit 106 may optionally include a single transmission network for bi-directional differential communication. In some implementations, the bi-directional differential communication channel may be formed from two pairs of conductive transmission lines, e.g., a first pair of conductive transmission lines would be used to transmit data in one direction, and a second pair of conductive transmission lines would be used to transmit data in the other direction. Further, the capacitive isolation circuit 106 may be configured to support multiple bi-directional communication channels such as dual bi-directional differential communication channels (e.g., eight pairs of conductive transmission lines). However, generally, any of the capacitive isolation circuits or isolation substrate bridges described herein may support any type of communication network. These and other features of the capacitive isolation circuit 106 are further described below.

In some implementations, the capacitive isolation circuit 106 may be configured to permit the first semiconductor die 102 and the second semiconductor die 108 to communicate at relatively high voltage levels such as any voltage level up to and greater than 20 KV. As further described below, the capacitive isolation circuit 106 may provide a distance through insulation (which is described in more detail below) that permits the apparatus 100 to function relatively safely at these high voltage levels with a reduced risk of electrostatic discharge (ESD) or other high voltage events causing damage to the isolation barrier, while meeting the spacing requirements to fit within a compact semiconductor package.

In a general implementation, the capacitive isolation circuit 106 may include a dielectric material or substrate, a first conductive layer, and a second conductive layer. In some implementations, the capacitive isolation circuit 106 may include a dielectric substrate having conductors on at least a portion of a top surface, bottom surface, and/or embedded within the dielectric substrate.

Figure 3A:
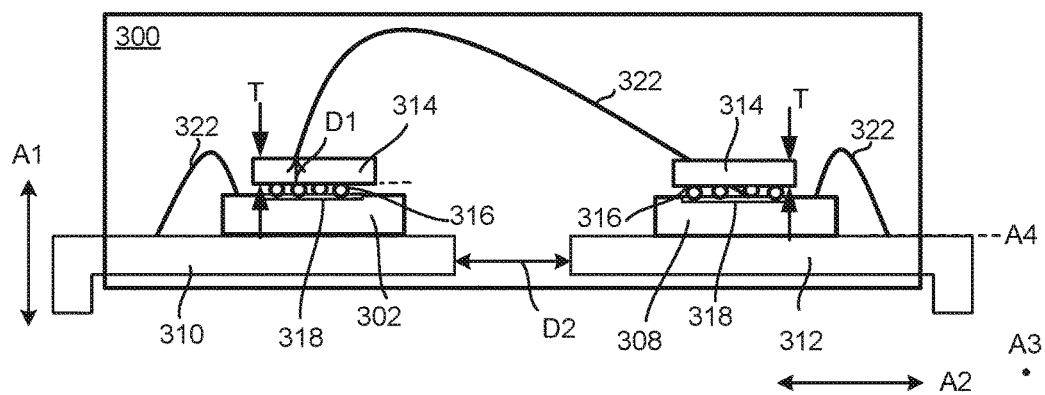
FIG. 3A illustrates a cross-section of capacitor networks that are coupled to the semiconductor die via solder balls according to an embodiment.

In some implementations, the first conductive layer (also can be referred to as an electrode, a top metal pad(s), a line(s), a plate(s), etc.) may be formed on at least a portion of the top surface of the dielectric substrate, and the second conductive layer (also can be referred to as an electrode, a bottom metal pad(s), a line(s), a plate(s), etc.) may be formed on at least a portion of the bottom surface of the dielectric material. Also, in some implementations, the dielectric substrate may be a single continuous piece of material with the conductors on at least a portion of each side of the dielectric substrate and/or embedded within the dielectric substrate (e.g., isolation substrate bridge implementations). In other examples, the dielectric material may be two separate portions of dielectric material layered with conductors that are connected with one or more bond wires (e.g., as shown in FIG. 3A).

The dielectric substrate may be any type of insulating or isolating material. In some implementations, the dielectric substrate may be any type of material having a dielectric constant greater than air. In some implementations, the dielectric substrate may be any type of glass material such as silicon dioxide based glass material, a co-fired dielectric, and/or any type of ceramic material such as an aluminum oxide based ceramic material. In some implementations, the thickness of the dielectric material may provide a distance through insulation equal to or exceeding 0.1 millimeters (mm). The distance through insulation is further explained below. The conductors and dielectric material of the capacitive isolation circuit 106 may form a capacitive network within the capacitive isolation circuit 106. In a simplified characterization, the capacitive network may be described as defining at least two capacitors using the conductive layers and the dielectric material of the capacitive isolation circuit 106. Then, the first semiconductor die 102 may transmit a signal to the second semiconductor die 108 by modulating the signal across the capacitors of the capacitive isolation circuit 106 within the electric field—which may use one or more conductive transmission lines.

In some implementations, the capacitive isolation circuit 106 may define a coupling network having at least two capacitor networks such as a first capacitor network disposed on top of the first semiconductor die 102 and a second capacitor network disposed on top of the second semiconductor die 108. Each of the first capacitor network and the second capacitor network may be defined by a top conductive plate, a bottom conductive plate, and the dielectric material disposed between the bottom conductive plate and the top conductive plate. In this implementation, the bottom plate of the first capacitor network may be coupled to a conductive pad (e.g., metal pad) of the first semiconductor die 102 via the first conductive component 104-1, and the bottom plate of the second capacitor network may be coupled to a conductive pad of the second semiconductor die 108 via the second conductive component 104-2. Further, the capacitive isolation circuit 106 may include a bond wire that is coupled to the top plate of the first capacitor network and the top plate of the second capacitor network. However, the capacitive isolation circuit 106 may include other configurations as further explained with reference to the other figures.

Regardless of the type of implementation of the capacitive isolation circuit 106, as shown in FIG. 1, the capacitive isolation circuit 106 is disposed outside the first semiconductor die 102 and the second semiconductor die 108. For example, each of the first semiconductor die 102 and the second semiconductor die 108 may include a top conductive layer (or top conductive contact pad) and a bottom conductive layer. The top conductive contact pad may be the contact or connection point for the semiconductor die. Further, these semiconductor die 102, 108 may include other intermediate layers as well as silicon oxide layers between the conductive layers. In some implementations, the capacitive isolation circuit 106 may be disposed outside the top conductive contact pad (and bottom conductive layer) of the first semiconductor die 102 and the second semiconductor die 108. However, the first semiconductor die 102, the second semiconductor die 108, and the capacitive isolation circuit 106 are included in the molding of the semiconductor package. In some implementations, the molding of the semiconductor package may be, or may include, a conductor, plastic, glass, or ceramic casing that contains the components of FIG. 1 including the first semiconductor die 102, the second semiconductor die 108, and the capacitive isolation circuit 106. In this manner, the distance through insulation may be increased as compared to conventional insulators, as further described below.

In some implementations, the capacitive isolation circuit 106 discussed with reference to FIG. 1 (or any isolator discussed with reference to any of the figures) may provide a distance through insulation greater than or equal to 0.1 mm, which is greater than existing digital isolation solutions are able to achieve (e.g., existing digital isolation solutions may be only able to achieve distance through insulation in the order of tens of micrometers). In some examples, the distance through insulation may be based on the spacing (D3) between the first lead frame portion 110 and the second lead frame portion 112, and the thickness (T) of the dielectric material of the capacitive isolation circuit 106. D1, D2, D3 may refer to various distances or paths. More generally, the distance through insulation may be defined as the shortest path between a conductive element on the first semiconductor die side and a conductive element on the second semiconductor die side. In one example, the distance (D3) between the first lead frame portion 110 and the second lead frame portion 112 may be considered one path. Also, the combined dielectric thickness (2T) of the dielectric material of the capacitive isolation circuit 106 may be considered another path (D1+D2). The shorter of these two paths may define the distance through insulation.

In a non-limiting example, the dielectric thickness (T) of the dielectric material may be 0.5 mm. As such, within this path, the distance through insulation may be 1 mm because the signal would modulate through the thickness of the dielectric material at the side of the first semiconductor die 102 (via D1) and would module again through the thickness (T) of the dielectric material at the side of the second semiconductor die 108 (via D2). In FIG. 1, the path (D1+D2) is shown in one direction for clarity purposes only. For example, the path (D1+D2) is shown with respect to one direction, but the path could also be in the opposite direction (D2+D1). Also, it is noted that this may be the situation for any of the other figures. A combined thickness (2T) of the dielectric material may refer to the thickness of the dielectric material that the signal must modulate through in order to be received at one of the semiconductor die 102, 108 (e.g., D1+D2). Continuing with this example, if the distance (D3) between the first lead frame portion 110 and the second lead frame portion 112 is 0.5 mm, the distance through insulation would be 0.5 mm because the distance through insulation is defined as the shortest of the two paths. As such, according to an embodiment, the combined thickness (2T) of the dielectric material of the capacitive isolation circuit 106 may be equal or greater than distance (D3) between the first lead frame portion 110 and the second lead frame portion 112. Still further, the combined thickness (2T) of the dielectric material of the capacitive isolation circuit 106 may be defined as any value greater or equal to 0.1 mm, and this value may be equal to or greater than the distance (D3) between the first lead frame portion 110, and the second lead frame portion 112. These concepts of distance through insulation may apply to the other implementations of the various other figures described herein.

Instead of integrating the capacitors within the semiconductor die itself in order to provide galvanic isolation, the capacitive isolation circuit 106 is built outside the construct (e.g., outside of the outer surface, outside of the volume) of the semiconductor die but within the semiconductor packaging so that the distance through insulation may be increased in a desirable fashion. Therefore, besides the spacing limitations of the semiconductor package, the distance through insulation is not limited as compared with conventional non-optical isolations which construct their isolators within the oxide layers of the semiconductor die itself. For example, the thickness of the oxide of conventional isolators are limited due to cracking and other uniformity problems, and therefore the distance through insulation is limited to values smaller than 0.1 mm. In addition, if magnetic transformers are used (as opposed to capacitors), providing additional spacing between the transformers coils (e.g., in order to increase the distance through insulation) may cause problems with the transmission path because there would be no signal coupling. Therefore, the capacitive isolator circuit 106 may provide a distance through insulation (D1+D2) that is equal to or greater than 0.1 mm while fitting within a relatively small semiconductor package.

Figure 2:
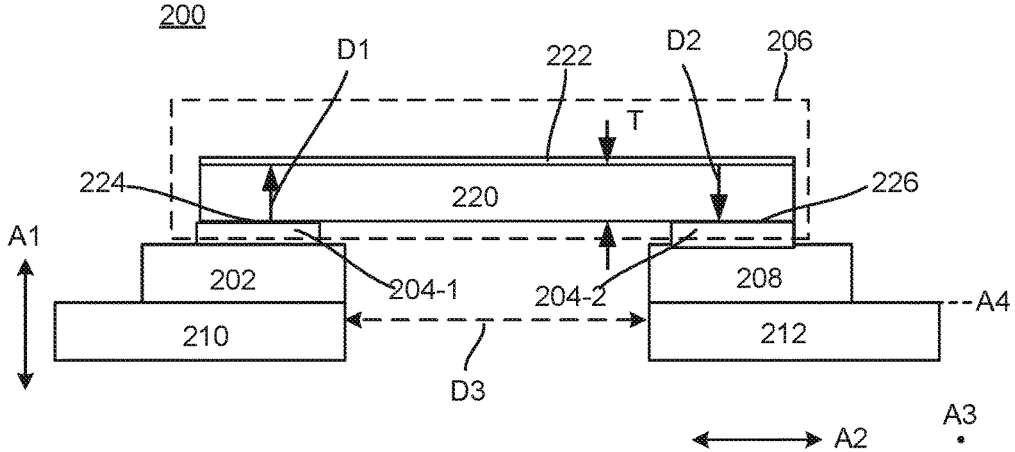
FIG. 2 illustrates an apparatus for providing isolation between multiple semiconductor die according to another embodiment.

FIG. 2 illustrates an apparatus 200 for providing isolation between multiple semiconductor die according to an embodiment. The apparatus 200 may include a first semiconductor die 202 disposed proximate to a first lead frame portion 210, a second semiconductor die 208 disposed proximate to a second lead frame portion 212, and a capacitive isolation circuit 206 coupled to the first semiconductor die 202 via a first conductive component 204-1 and coupled to the second semiconductor die 208 via second conductive component 204-2. In some implementations, the apparatus 200 may be included within a semiconductor package. For example, the semiconductor package may be, or may include, a metal, plastic, glass, or ceramic casing that contains at least the components of FIG. 2.

The first semiconductor die 202, the second semiconductor die 208, the first lead frame portion 210, the second lead frame portion 212, the first conductive component 204-1, and the second conductive component 204-2 of FIG. 2 may be the same as (or similar to) the first semiconductor die 102, the second semiconductor die 108, the first lead frame portion 110, the second lead frame portion 112, the first conductive component 104-1, and the second conductive component 104-2 of FIG. 1, and therefore the details of these components are omitted for the sake of brevity.

Similar to FIG. 1, the capacitive isolation circuit 206 may define a capacitive coupling network within a dielectric material that may permit the transfer of data between the first semiconductor die 202 and the second semiconductor die 208 through the insulation material. For example, the first semiconductor die 202 may transmit or receive data to/from the second semiconductor die 208 via the capacitive isolation circuit 206. However, referring to FIG. 2, the capacitive isolation circuit 206 may be a bridge-type structure that provides a transmission path within an isolation material via an electric field.

Referring to FIG. 2, the capacitive isolation circuit 206 include an isolation substrate bridge having a dielectric material 220, a conductive transmission line 222 disposed on a top surface of the dielectric material 220. A conductive layer portion 224 disposed on a bottom surface of the dielectric material 220 at a location proximate to the first semiconductor die 202, and a conductive layer portion 226 disposed on a bottom surface of the dielectric material 220 at a location proximate to the second semiconductor die 208. In this implementation, the isolation substrate bridge may be defined as constructing a first capacitor network (e.g., by virtue of the conductive layer portion 224, a portion of the dielectric material 220, and a portion of the conductive transmission line 222), and a second capacitor network (e.g., by virtue of the conductive layer portion 226, a portion of the dielectric material 220, a portion of the conductive transmission line).

Further, the isolation substrate bridge may include a first portion coupled to the first semiconductor die 202 via the first conductive component 204-1. For example, the conductive layer portion 224 may be coupled to a top conductive pad of the first semiconductor die 202 via the first conductive component 204-1. The isolation substrate bridge may include a second portion disposed in an area between the first semiconductor die 202 and the second semiconductor die 208, and a third portion coupled to the second semiconductor die 208 via the second conductive component 204-2. For example, the conductive layer portion 226 may be coupled to a top conductive pad of the second semiconductor die 208 via the second conductive component 204-2.

In other implementations, the capacitive isolation circuit 206 (e.g., the isolation substrate bridge) may be disposed between the first semiconductor die 202 and the second semiconductor die 208. Further, the capacitive isolation circuit 206 may be disposed between the first lead frame portion 210 and the second lead frame portion 212.

In the example of FIG. 2, the conductive transmission line 222 may be disposed across a length of the dielectric material 220. In other examples, the conductive transmission line 222 may be shorter than the length of the dielectric material 220. The conductive transmission line 222 may be configured to communicate data from the first semiconductor die 202 to the second semiconductor die 208 or vice versa.

In some implementations, the first semiconductor die 202 may be configured to communicate data with the second semiconductor die 208 (or vice versa). In particular, the signal may modulate through the dielectric material 220 (via the first capacitor network explained above) (via D1), transfer across the conductive transmission line 222, and module through the dielectric material 220 (via the second capacitor network explained above) (via D2). In FIG. 2, the path (D1+D2) is shown in one direction for clarity purposes only. For example, the path (D1+D2) is shown with respect to one direction, but the path could also be in the opposite direction (D2+D1). Also, it is noted that this may be the situation for any of the other figures. In this example, the distance through insulation (2T) may be defined based on the thickness (T) of the dielectric material 220. As explained above, if the thickness (T) of the dielectric material 220 is 0.5 mm (the combined thickness (2T) would be 1 mm—due to the fact that the signal modulates through the dielectric material 220 via D1 and modulates through the dielectric material 220 via D2 via this serial transmission path), the distance through insulation would be 1 mm. Therefore, according to the embodiments, the distance (D3) between the first lead frame portion 210 and the second lead frame portion 212 may be equal to or greater than the minimum combined thickness (2T), which, in this example, would be 1 mm. However, the distance through insulation may be equal or greater than 0.1 mm.

Figure 3C:
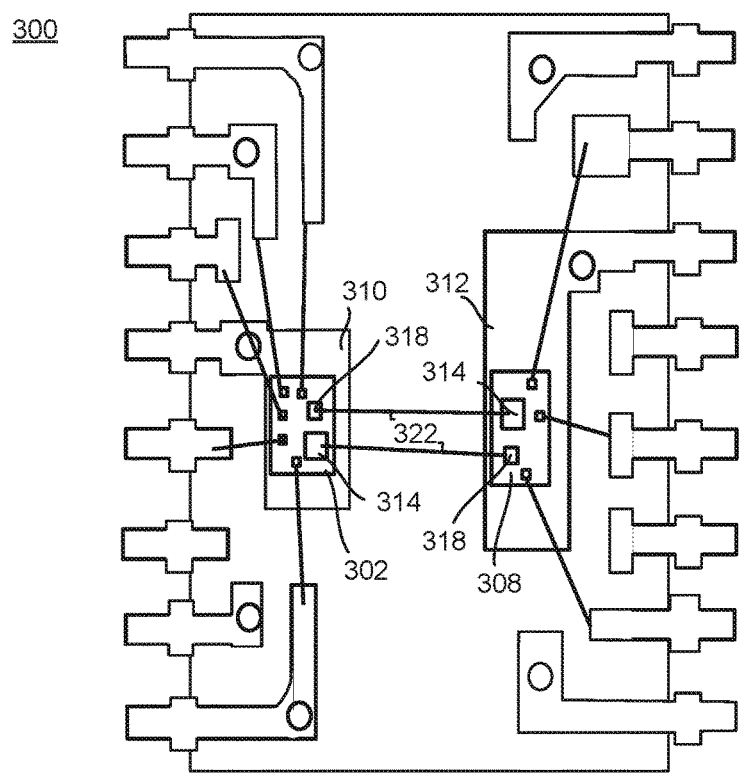
FIG. 3C illustrates a top view of the semiconductor apparatus of either FIG. 3A or FIG. 3B according to the embodiment.

Further, the capacitive isolation circuit 106 may define a differential communication channel (e.g., a pair of conductive transmission lines 222 for communicating data in a single direction) or a bi-directional differential communication channel (e.g., at least two pairs of conductive transmission lines 222 for communicating differential data bi-directionally) that are used for differential sensing at the first semiconductor die 202 and/or the second semiconductor die 208. In regards to the bi-directional communication, the bi-directional differential communication channel may include a first pair of conductive transmission lines 222 and a second pair of conductive transmission lines 222, where the first pair may be associated with the transmission of data from the first semiconductor die 202 to the second semiconductor die 208 for differential communication, and the second pair may be associated with the transmission of data from the second semiconductor die 208 to the first semiconductor die 202 for differential communication. Regardless of the type of communication, multiple conductive transmission lines 222 may be disposed on the top or bottom surface or embedded within the dielectric substrate. Also, the conductive transmission lines 222 of each pair and/or pairs of conductive transmission lines 222 may be disposed adjacent to each other (e.g., aligned parallel, but separated (not in physical contact)) and/or disposed in a staggered fashion (e.g., staggered laterally along direction A3 or A2). It is noted that the embodiments may include more or less than four conductive transmission lines. Also, it is noted that any of the pairs of conductive transmission lines 222 described anywhere in the description can be similarly staggered, shaped, disposed, etc. FIGS. 3A-3C illustrates a semiconductor apparatus 300 having a capacitive isolation circuit formed on top of a semiconductor die according to the embodiments. The semiconductor apparatus 300 can be variation of the embodiments described in connection with. FIG. 1 or FIG. 2. In the example of FIGS. 3A-3C, the capacitive isolation circuit may include one or more capacitor networks formed on (e.g., disposed on) top of each of a first semiconductor die 302 and a second semiconductor die 308. FIG. 3A illustrates a cross-section of the capacitor networks 314 that are coupled to the semiconductor die via solder balls 316. FIG. 3B illustrates a cross-section of the capacitor networks 314 that are coupled to the semiconductor die via conductive epoxy 317. FIG. 3C illustrates a top view of the semiconductor apparatus of either FIG. 3A or FIG. 3B according to the embodiments.

Referring to FIGS. 3A-3C, the semiconductor apparatus 300 may include a first semiconductor die 302 disposed on a top surface of a first lead frame portion 310, and a second semiconductor die 308 disposed on a top surface of a second lead frame portion 312. The first semiconductor die 302 may include a conductive pad 318 disposed on a top surface of the first semiconductor die 302, and the second semiconductor die 308 may include a conductive pad 318 disposed on a top surface of the second semiconductor die 308. A capacitor network 314 may be disposed on top of the first semiconductor die 302, and a capacitor network 314 may be disposed on top of the second semiconductor die 308. Generally, each capacitor network 314 may include a dielectric material and a first conductive layer (top conductive layer) and a second conductive layer (bottom conductive layer). The dielectric material may be any type of material described herein.

Referring to FIG. 3A, with respect to the first semiconductor die 302, the second conductive layer of the capacitor network 314 may be coupled to the conductive pad 318 of the first semiconductor die 302 via solder balls 316. Still referring to FIG. 3A, with respect to the second semiconductor die 308, the second conductive layer of the capacitor network 314 may be coupled to the conductive pad 318 of the second semiconductor die 308 via solder balls 316.

Referring to FIG. 3B, with respect to the first semiconductor die 302, the second conductive layer of the capacitor network 314 may be coupled to the conductive pad 318 of the first semiconductor die 302 via conductive epoxy 317. Still referring to FIG. 3B, with respect to the second semiconductor die 308, the second conductive layer of the capacitor network 314 may be coupled to the conductive pad 318 of the second semiconductor die 308 via conductive epoxy 317. However, it is noted that the first semiconductor die 302 and/or the second semiconductor die 308 may be coupled to the capacitor network 314 using any type of die attachments methods including eutectic die attach, for example.

Referring to FIGS. 3A-3C, bond wires 322 may be used to connect the top conductive layers of the capacitor networks 314 to the conductive pads 318 on the first semiconductor die 302 and the second semiconductor die 308. For example, the first conductive layer of the capacitor network 314 disposed on the first semiconductor die 302 may be connected to the conductive pad 318 of the second semiconductor die 308 via a bond wire 322. Although not shown, the first conductive layer of the capacitor network 314 disposed on the second semiconductor die 308 may be connected to the conductive pad 318 of the first semiconductor die 302 via another bond wire 322.

Also, as shown in FIGS. 3A and 3B, the first semiconductor die 302 may be connected to the first lead frame portion 310 via the bond wire 322, and the second semiconductor die 308 may be connected to the second lead frame portion 312 via the bond wire 322. In particular, one end of the bond wire 322 may be connected to a top surface of the first semiconductor die 302, and the other end of the bond wire 322 may be connected to a top surface of the first lead frame portion 310. Similarly, one end of the bond wire 322 may be connected to a top surface of the second semiconductor die 308, and the other end of the bond wire 322 may be connected to a top surface of the second lead frame portion 312.

In some implementations, referring to FIG. 3A, the first semiconductor die 302 may be configured to communicate data with the second semiconductor die 308 (or vice versa). In particular, the signal may modulate through the thickness (T) of the dielectric material of the capacitor network 314 associated with the first semiconductor die 302, and transfer across the bond wire 322 to the second semiconductor die 308. In this example, the distance through insulation (T) may be defined based on the thickness (T) of the dielectric material of the capacitor network 314. In some implementations, a distance between two conductive elements may be equal to or greater than the thickness (T) of the dielectric material of the implementations of FIG. 3. For example, as indicated above, the shortest transmission path may define the distance through insulation. As such, in this example, the distance (D2) between the first lead frame portion 310 and the second lead frame portion 312 may be equal to or greater than the minimum thickness (T). Also, in some implementations, the distance through insulation (T) may be greater or equal to 0.1 mm. The same concepts regarding distance through insulation may be extended to FIG. 3B.

FIG. 4A illustrates an example of a capacitor network 414. FIG. 4B illustrates another example of the capacitor network 414. Referring to FIGS. 4A and 4B, the capacitor network 414 may include a first conductive layer 403, a dielectric material 405, and a second conductive layer 407. The dielectric material may be any type of dielectric material having a dielectric constant greater or equal to air. In some implementations, the dielectric material 405 may be glass or ceramic. Also, the dielectric material 405 may have a certain length and thickness, as well as width (however, since FIGS. 4A-4B are cross-sections, the width of the dielectric material 405 is not illustrated in FIGS. 4A-4B). The first conductive layer 403 may be disposed on a first side (or surface) of the dielectric material 405, and the second conductive layer 407 may be disposed on second side (or surface) opposite to the first side of the dielectric material.

Referring to FIG. 4A, in some implementations, the second conductive layer 407 may be disposed on the bottom surface of the dielectric material 405 such that the second conductive layer 407 extends from one end (e.g., terminal end) of the dielectric material 405 to the other end (e.g., terminal end) of the dielectric material 405 along the length of the dielectric material 405. For example, the second conductive layer 407 may be the conductive layer that is coupled to the conductor (also referred to as conductive pad) of the semiconductor die. In the example, of FIG. 4A, the second conductive layer 407 that forms the bottom conductor of the capacitor network 414 may extend from one edge (e.g., terminal edge) of the dielectric material 405 until the other edge (e.g., terminal edge) of the dielectric material. In other words, a length (or surface area if viewed in a plan view) of the second conductive layer 407 may be approximately equal to the length (or surface area if viewed in a plan view) of the dielectric material 405. However, the first conductive layer 403 that forms the top conductor of the capacitor network 414 may be smaller than the length (or surface area) of the dielectric material 405. For example, the first conductive layer 403 may be disposed on a portion of the dielectric material 405. In some implementations, the first conductive layer 403 may be disposed on a middle portion of the dielectric material 405, where the edge portions of the dielectric material are not coated with conductors. In some implementations, the first conductive layer 403 may be off-center from the middle portion of the dielectric material 405, e.g., shifted to the left or right.

Referring to FIG. 4B, in some implementations, the first conductive layer 403 and the second conductive layer 407 may be smaller than the dielectric material 405. For example, the length (or surface area) of the first conductive layer 403 and the length (or surface area) of the second conductive layer 407 may be smaller than the length (or surface area) of the dielectric material 405. In particular, the first conductive layer 403 may be disposed on a portion of the top surface of the dielectric material 405, and the second conductive layer 407 may be disposed on a portion of the bottom surface of the dielectric material 405. Still further, the first conductive layer 403 may be disposed on a middle portion of the top surface of the dielectric material 405, and the second conductive layer 407 may be disposed on a middle portion of the bottom surface of the dielectric material, where the edge portions of the top and bottom surfaces of the dielectric material are not coated with conductors. For example, to increase breakdown voltage due to the fringing electric field at the outside edges, the first conductive layer 403 and/or the second conductive layer 407 can be made smaller than the dielectric material 405. In some implementations, the first conductive layer 403 may be off-center from the middle portion of the dielectric material 405, e.g., shifted to the left or right. The capacitor networks 414 of FIGS. 4A and 4B may be used within any of the implementations of any of the figures.

Figure 5A:
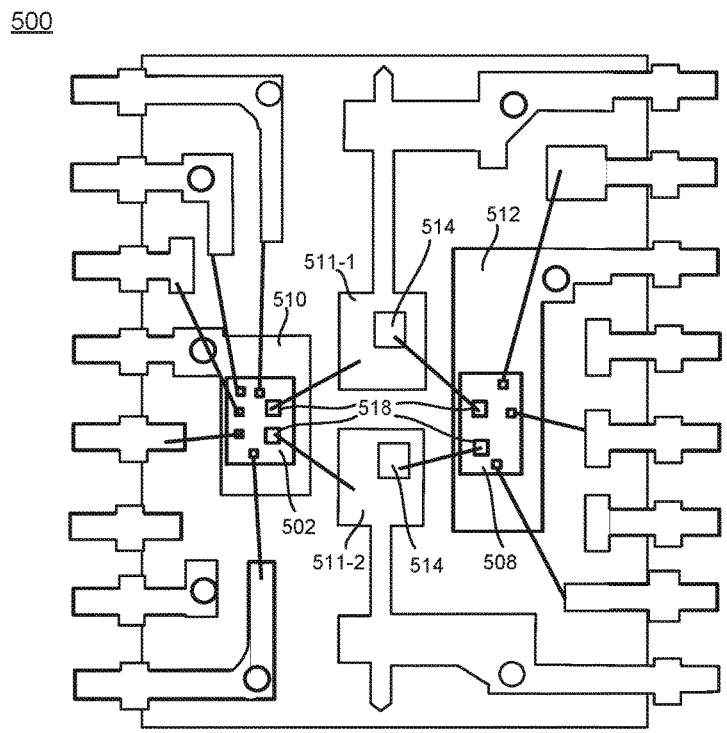
FIG. 5A illustrates a top view of a semiconductor apparatus according to an embodiment.
Figure 5B:
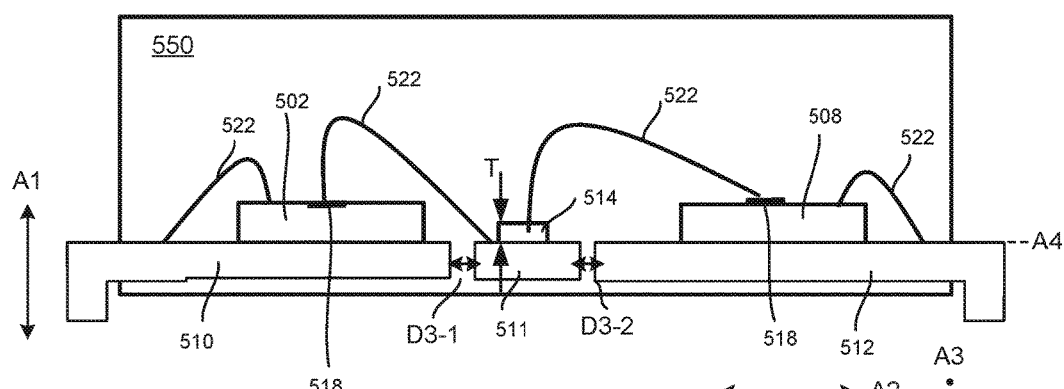
FIG. 5B illustrates a cross-section of the semiconductor apparatus of FIG. 5A according to an embodiment.

FIGS. 5A and 5B illustrate a semiconductor apparatus 500 having a capacitive isolation circuit formed on package frames (e.g., lead frames) according to the embodiments. In the example of FIGS. 5A and 5B, the capacitive isolation circuit may include capacitor networks 514 formed on top of frame portions 511 that are separate from a first lead frame portion 510 having (or coupled to) a first semiconductor die 502 and a second lead frame portion 512 having (or coupled to) a second semiconductor die 508. FIG. 5A illustrates a top view (or plan view) of the semiconductor apparatus 500. FIG. 5B illustrates a cross-section of the semiconductor apparatus 500.

Referring to FIGS. 5A and 5B, the semiconductor apparatus 500 may include the first semiconductor die 502 disposed on a top surface of the first lead frame portion 510, and the second semiconductor die 508 disposed on a top surface of the second lead frame portion 512. The first semiconductor die 502 may include a conductor 518 disposed on a top surface of the first semiconductor die 502, and the second semiconductor die 508 may include a conductor 518 disposed on a top surface of the second semiconductor die 508. In some implementations, the conductors 518 may be considered conductor pads.

The semiconductor apparatus 500 may include a first frame portion 511-1 and a second frame portion 511-2, where the first frame portion 511-1 and the second frame portion 511-2 are separate from the first lead frame portion 510 and the second lead frame portion 512. The first frame portion 511-1 and the second frame portion 511-1 may be considered lead frame portions or generally package frames. For example, the first frame portion 511-1 and the second frame portion 511-2 may be separate package frames (including separate lead frames) or different portions on the same package frame. The first frame portion 511-1 may be disposed between the first lead frame portion 510 and the second lead frame portion 512. Also, the second frame portion 511-1 may be disposed between the first lead frame portion 510 and the second lead frame portion 512.

As shown in FIG. 5A, a capacitor network 514 may be built on (e.g., disposed on) top of the first frame portion 511-1, and a separate capacitor network 514 may be built on (e.g., disposed on) top of the second frame portion 511-2. FIG. 5B illustrates a cross-section of one of the capacitor networks 514 of FIG. 5A. Each capacitor network 514, disposed on either the first frame portion 511-1 or the second frame portion 511-2, may be connected to the first semiconductor die 502 and the second semiconductor die 508. Generally, each capacitor network 514 may include a dielectric material and a first conductive layer (top conductive layer) and a second conductive layer (bottom conductive layer)—as discussed with reference to FIGS. 4A and 4B.

Generally, the bottom conductive layer of the capacitor network 514 corresponding to the first lead frame portion 511-1 may be coupled to the top surface of the first frame portion 511-1 via any type of conductive component such as conductive epoxy. Also, the bottom conductive layer of the capacitor network 514 corresponding to the second lead frame portion 511-2 may be coupled to the top surface of the second frame portion 511-2 via any type of conductive component such as conductive epoxy. In one implementation, the conductors 518 of the second semiconductor die 508 may be connected to the top conductive layers of the capacitor networks 514 via bond wires 522. For example, the conductor 518 of the second semiconductor die 508 may be connected to the top conductive layer of the capacitor network 514 disposed on the first frame portion 511-1 via a bond wire 522, and another conductor 518 of the second semiconductor die 508 may be connected to the top conductive layer of the capacitor network 514 disposed on the second frame portion 511-2 via another bond wire.

Also, the conductors 518 of the first semiconductor die 502 may be connected to the frame portions 511 via bond wires 522. For example, the conductors 518 of the first semiconductor die 502 may be connected to the first frame portion 511-1 via a bond wire 522, and another conductor 518 of the first semiconductor die 502 may be connected to the second frame portion 511-2 via another bond wire 522.

In some implementations, referring to FIG. 5B, the first semiconductor die 502 may be configured to communicate data with the second semiconductor die 508 (or vice versa). In particular, the signal may be transferred from the first semiconductor die 502 via the bond wire 522, modulate through the thickness (T) of the dielectric material of the capacitor network 514, and then transfer across the bond wire 522 to the second semiconductor die 508. In this example, the distance through insulation (T) may be defined based on the thickness (T) of the dielectric material of the capacitor network 514. In some implementations, a distance between two conductive elements may be equal to or greater than the thickness (T) of the dielectric material of the implementations of FIG. 5. For example, as indicated above, the shortest transmission path may define the distance through insulation. According to the embodiments, a distance (D3-1) between the first lead frame portion 510 and the frame portion 511 and a distance (D3-2) between the frame portion 511 and the second lead frame portion 512 may be equal to or greater than the minimum thickness (T). Also, in some implementations, the distance through insulation (T) may be greater or equal to 0.1 mm.

Figure 6:
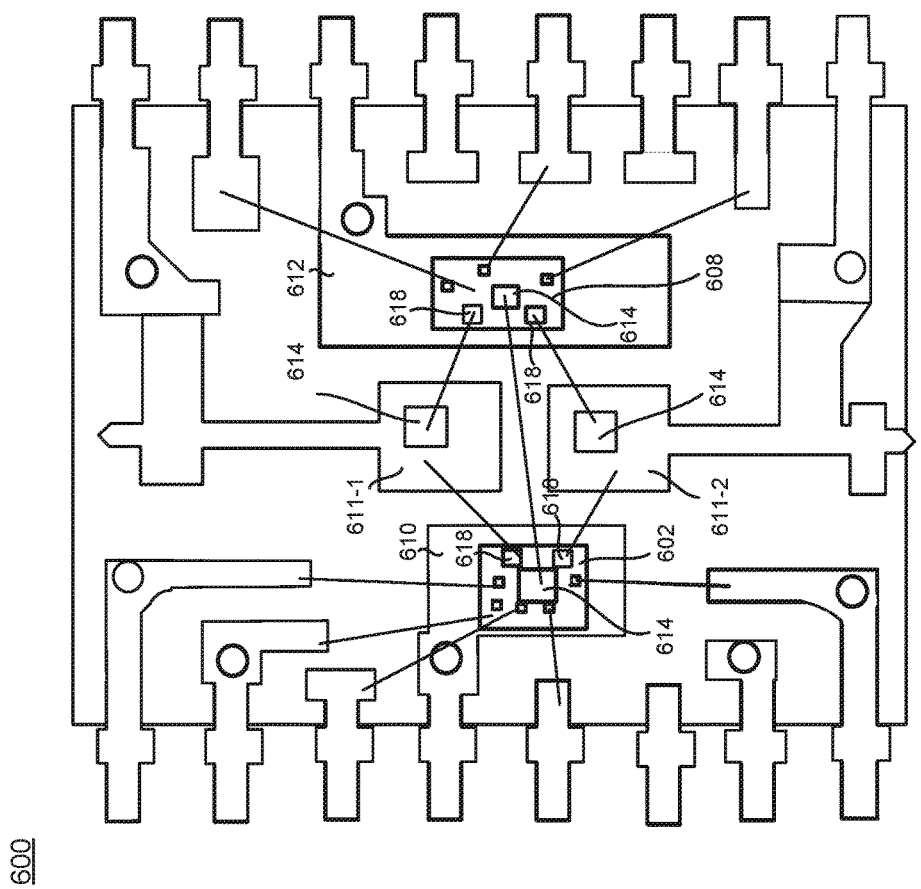
FIG. 6 illustrates a semiconductor apparatus having a capacitive isolation circuit formed on package frames and semiconductor die according to an embodiment.

FIG. 6 illustrates a semiconductor apparatus 600 having a capacitive isolation circuit formed on package frames and semiconductor die according to the embodiments. In the implementation of FIG. 6, capacitor networks 614 are formed on first and second frame portions 611 and a first semiconductor die 602 and a second semiconductor die 608. In some implementations, FIG. 6 may be considered a hybrid of the implementations of FIGS. 3A-3C and FIGS. 5A-B.

For example, the semiconductor apparatus 600 may include the first semiconductor die 602 disposed on a top surface of a first lead frame portion 610, and the second semiconductor die 608 disposed on a top surface of a second lead frame portion 612. The first semiconductor die 602 may include conductors 618 (e.g., two conductive pads as shown in FIG. 6) disposed on a top surface of the first semiconductor die 502, and the second semiconductor die 608 may include conductors 618 (e.g., two conductive pads as shown in FIG. 6) disposed on a top surface of the second semiconductor die 608.

The semiconductor apparatus 600 may include a first frame portion 611-1 and a second frame portion 611-2, where the first frame portion 611-1 and the second frame portion 611-2 are separate from the first lead frame portion 610 and the second lead frame portion 612. The first frame portion 611-1 and the second frame portion 611-1 may be considered lead frame portions or generally package frames. For example, the first frame portion 611-1 and the second frame portion 611-2 may be separate package frames (including separate lead frames) or different portions on the same lead frame.

In some implementations, capacitor networks 614 are disposed on the first frame portion 611-1, the second frame portion 611-2, the first semiconductor die 602, and the second semiconductor die 608 in the same manner as discussed with reference to FIGS. 3A-3C, and FIGS. 5A-5B. For example, bond wires 622 are used to connect the top conductive layers of the capacitor networks 614 to the conductors 618 on the second semiconductor die 608. The bottom conductive layers of the capacitor networks 614 are connected to either the frame portions 611 or the semiconductor die 602, 608 via any type of capacitive component. Bond wires 622 may be used to connect the conductors 618 on the first semiconductor die 602 to the frame portions 611. Further, the capacitors networks 614 disposed on the first semiconductor die 602 and the second semiconductor die 608 may be connected in the same manner as described with reference to FIGS. 3A-3C, e.g., the top conductive layer of the capacitor network 614 disposed on the first semiconductor die 602 may be connected to the top conductive layer of the capacitor network 614 disposed on the second semiconductor die 608 via a bond wire, and bond wires are used to connect each semiconductor die to its respective lead frame portion.

Figure 7A:
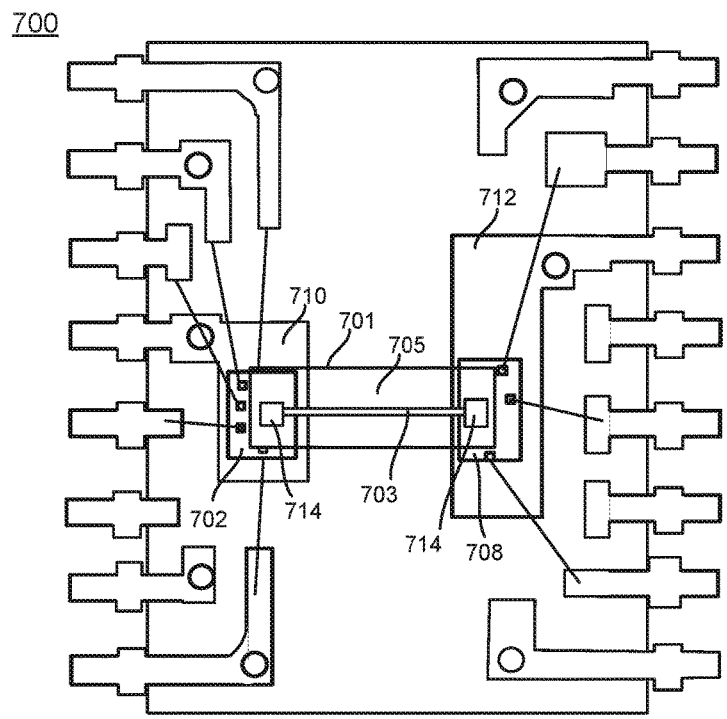
FIG. 7A illustrates a top view of a semiconductor apparatus having an isolation substrate bridge according to an embodiment.
Figure 7B:
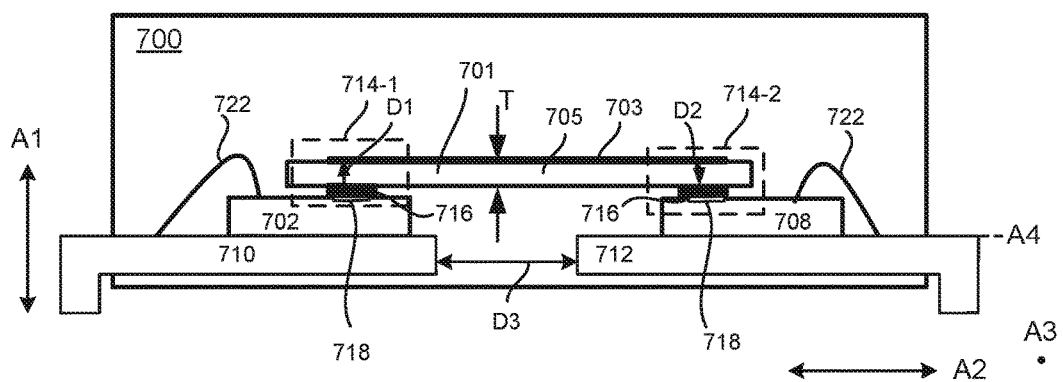
FIG. 7B illustrates a cross-sectional view of the semiconductor apparatus depicting capacitor networks coupled to one or more of the semiconductor die via conductive epoxy according to an embodiment.
Figure 7C:
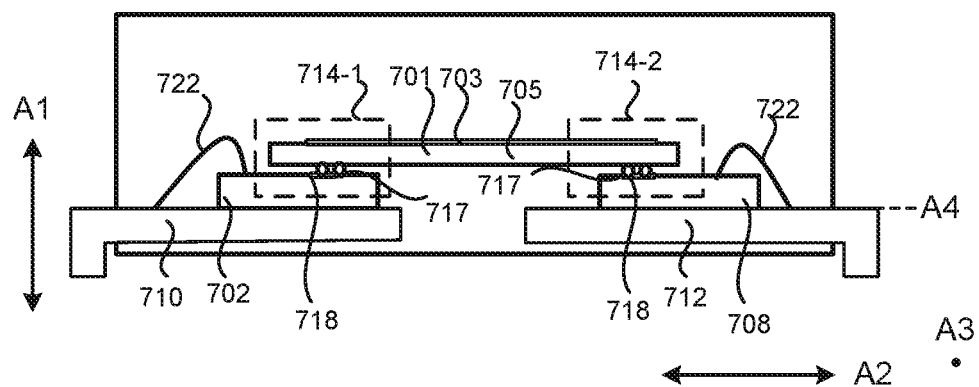
FIG. 7C illustrates a cross-sectional view of the semiconductor apparatus depicting capacitor networks coupled to one or more of the semiconductors die via solder balls according to an embodiment.
Figure 7D:
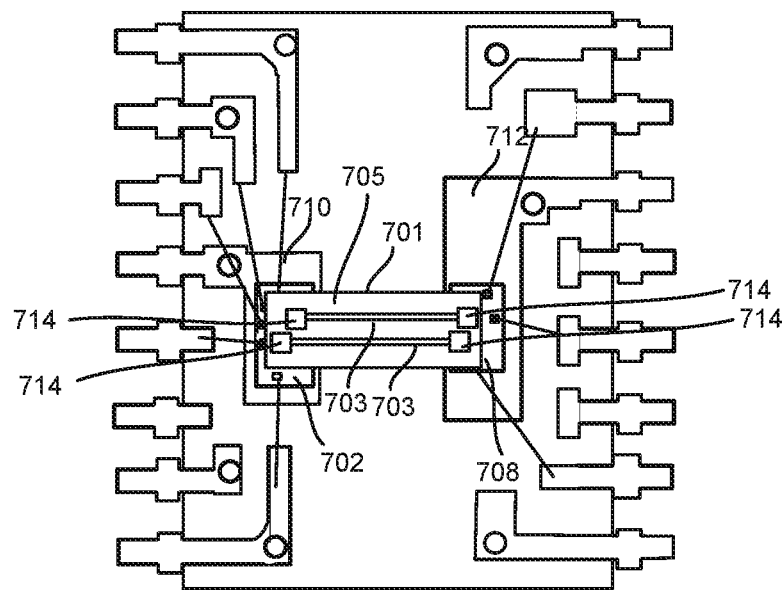
FIG. 7D illustrates a top view of the semiconductor apparatus depicting multiple transmission channels functioning as a differential sense circuit according to an embodiment.

FIGS. 7A-7D illustrates a semiconductor apparatus 700 having a capacitive isolation circuit having an isolation substrate bridge 701 that connects a first semiconductor die 702 to a second semiconductor die 708 according to the embodiments. FIG. 7A illustrates a top view of the semiconductor apparatus 700 having the isolation substrate bridge 701 according to an embodiment. FIG. 7B illustrates a cross-sectional view of the semiconductor apparatus 700 depicting capacitor networks 714 coupled to one or more of the semiconductor die via conductive epoxy. FIG. 7C illustrates a cross-sectional view of the semiconductor apparatus 700 depicting capacitor networks 714 coupled to one or more of the semiconductors die via solder balls. FIG. 7D illustrates a top view of the semiconductor apparatus 700 depicting multiple transmission channels functioning as a differential sense circuit according to an embodiment.

Referring to FIGS. 7A-7D, the semiconductor apparatus 700 may include a first semiconductor die 702 disposed on a top surface of a first lead frame portion 710, and a second semiconductor die 708 disposed on a top surface of a second lead frame portion 712. The first semiconductor die 702 may include a conductor 718 disposed on a top surface of the first semiconductor die 702, and the second semiconductor die 708 may include a conductor 718 disposed on a top surface of the second semiconductor die 708.

In some implementations, the isolation substrate bridge 701 may be connected the first semiconductor die 702 and the second semiconductor die 708. For example, the isolation substrate bridge 701 may include a dielectric material 705 having conductors (not shown) on each side of the dielectric material 705. The conductor on each side of the dielectric material 705 may create a first network capacitor 714-1 proximate to the first semiconductor die 702 and a second network capacitor 714-2 proximate to the second semiconductor die 708, as further explained below. In some implementations, the first network capacitor 714-1 at one end of the isolation substrate bridge 701 and the second network capacitor 714-2 at the other end of the isolation substrate bridge 701 may be in series, thereby allowing thinner capacitors to be used for the same isolation voltage.

The dielectric material 705 of the isolation substrate bridge 701 may have a length sufficient to be disposed on at least a portion of the first semiconductor die 702, extend to the second semiconductor die 708, and be disposed on at least a portion of the second semiconductor die 708. In some implementations, the dielectric material 705 can be any of the dielectric materials described above.

The conductors on the dielectric material 705 may include a top conductive coating and a bottom conductive coating in an area proximate to the conductor 718 of the first semiconductor die 702—which may be referred to as a top plate and a bottom plate of the first capacitor 714-1. The conductors on the dielectric material 705 may include a top conductive coating and a bottom conductive coating in an area proximate to the conductor 718 of the second semiconductor die 708—which may be referred to as a top plate and a bottom plate of the second capacitor 714-2. In some implementations, the isolation substrate bridge 701 may include one or more conductive transmission lines 703 that functions as the top plate for the first capacitor network 714-1 and the second capacitor network 714-2.

Generally, the conductive transmission line 703 can be shaped according to any number of ways. In some implementations, the conductive transmission line 703 may be an elongated strip of conductor that extends along most of the length of the dielectric material 705. The conductive transmission line 703 may have a length (in the A2 direction) sufficient to extend from the first semiconductor die 702 to the second semiconductor die 708. In some implementations, the conductive transmission line 703 may have a width (in the A3 direction) smaller than the top and/or bottom plate of the capacitor network 714. In some implementations, the conductive transmission line 703 may be rectangular in shape where the width of the conductive transmission line 703 is substantially the same along its length. Also, the thickness (in the A1 direction) may be substantially uniform throughout its length. In other embodiments, the conductive transmission line 703 may have a non-uniform shape such that one or more portions may have a different width and/or thickness. In some implementations, the conductive transmission line 703 may narrow as it nears a conductor of the isolation substrate bridge 701. In other implementations, the conductive transmission line 703 may zigzag to maximize length within a fixed length of substrate. In some implementations, the conductive transmission line 703 may function as a transmission channel that communicates data between the first semiconductor die 702 and the second semiconductor die 708.

The bottom plates of the capacitor networks 714 are connected to the conductor 718 of the first semiconductor die 702 and the conductor 718 of the second semiconductor die 708. For example, referring to FIG. 7B, the bottom conductive plate of the first capacitor 714-1 may be connected to the conductor 718 of the first semiconductor die 702 via conductive epoxy 716, and the bottom conductive plate of the second capacitor network 714-2 may be connected to the conductor 718 of the second semiconductor die 708 via conductive epoxy 716. In other implementations, referring to FIG. 7C, the bottom conductive plate of the first capacitor network 714-1 may be connected to the conductor 718 of the first semiconductor die 702 via solder balls 717, and the bottom conductive plate of the second capacitor network 714-2 may be connected to the conductor 718 of the second semiconductor die 708 via solder balls 717.

Referring to FIG. 7D, in some implementation, the dielectric material 705 may support a differential communication network capable of transmitting data in a direction (e.g., from the first semiconductor die 702 to the second semiconductor die 708 or vice versa). However, the isolation substrate bridge 701 may be configured to support a bi-directional differential communication network as described above. For example, with respect to a first communication channel, the isolation substrate bridge 701 may integrate a capacitor network 714 disposed on one end of the isolation substrate bridge 701, and another capacitor network 714 disposed on the other end of the isolation substrate bridge 701, and these two capacitor networks may be connected with the conductive transmission line 703 that functions as a transmission line. With respect to a second communication link, the isolation substrate bridge 701 may integrate another capacitor network 714, and these capacitor networks may be connected with another conductive transmission line 703 that also functions as a communication channel. This pair of conductive transmission lines 703 may support differential communication or permit bi-directional communication if differential communication techniques are not used. Also, in some implementations, the conductive transmission lines 703 may be staggered in parallel as shown in FIG. 7D, however, the alignment between conductive transmission lines 703 may vary.

Referring to FIG. 7B, in some implementations, the first semiconductor die 702 may be configured to communicate data with the second semiconductor die 708 (or vice versa). In particular, the signal may modulate through the dielectric material 705 (via D1), transfer across the conductive transmission line 703, and module through the dielectric material 705 (via D2). In this example, the distance through insulation (2T) may be defined based on the thickness (T) of the dielectric material 705. As explained above, if the thickness (T) of the dielectric material 705 is 0.5 mm (the combined thickness (2T) would be 1 mm—due to the fact that the signal modulates through the dielectric material 705 via D1 and modulates through the dielectric material 705 via D2), the distance through insulation would be 1 mm.

In some implementations, a distance between two conductive elements may be equal to or greater than the combined thickness (2T) of the dielectric material of the implementations of FIG. 7. For example, as indicated above, the shortest transmission path may define the distance through insulation. Therefore, according to the embodiments, the distance (D3) between the first lead frame portion 710 and the second lead frame portion 712 may be equal to or greater than the minimum combined thickness (2T). Also, in some implementations, the distance through insulation (T) may be greater or equal to 0.1 mm. The concepts relating to distance through insulation may be extended to FIG. 7D.

Figure 8:
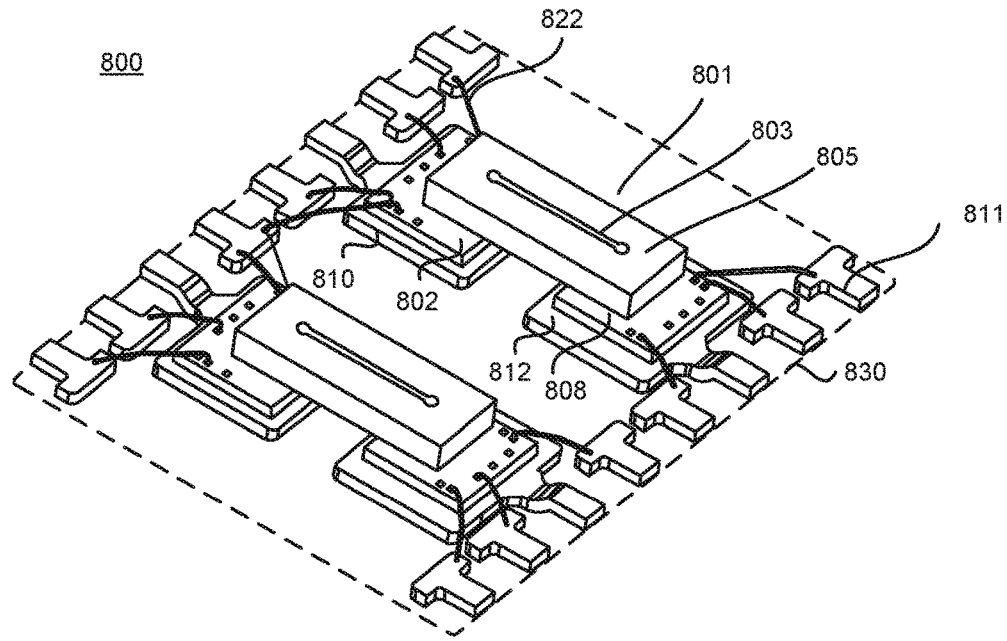
FIG. 8 illustrates an assembly layout of a semiconductor package having isolation substrate bridges according to an embodiment.

FIG. 8 illustrates an assembly layout of a semiconductor package 800 having isolation substrate bridges 801 according to an embodiment. The semiconductor package 800 of FIG. 8 may include a JEDEC-standard small-outline integrated circuit (SOIC) leaded and molded package. The semiconductor package 800 may include a dual-channel device with two integrated circuits (e.g., semiconductor die 802, 808) attached on substrate (e.g., a one-channel substrate). In other implementations, the semiconductor package 800 may include a single piece of dielectric substrate with multiple channels constructed on the substrate. In some implementations, the semiconductor package 800 may include the isolation substrate bridge of FIGS. 7A-7D.

Referring to FIG. 8, within a package outline 830, the semiconductor package 800 may include a pair of semiconductor die 802, 808 and an isolation substrate bridge 801 for the pair. Further, the semiconductor package 800 may include another pair of semiconductor die with an isolation substrate bridge that may be the same as the semiconductor die 802, 808 and the isolation substrate bridge 801 (or different). This figure is explained with reference to one pair of semiconductor die and isolation substrate bridge, but it understood that this description (or the description for one or more of the other figures) may be extended to the other pair of semiconductor die and isolation substrate bridge.

The semiconductor package 800 may include a first semiconductor die 802 disposed on top of a first lead frame portion 810, and a second semiconductor die 808 disposed on top of a second lead frame portion 812. An isolation substrate bridge 801 may be connected to the first semiconductor die 802 and the second semiconductor die 808. Also, the semiconductor die (e.g., 802, 808) may be connected to one or more other frame portions 811 via bond wires 822.

The isolation substrate bridge 801 may be the same as previously described with reference to FIGS. 7A-7C or be an isolation substrate bridge discussed with reference to any of the other figures. The isolation substrate bridge 801 may include a dielectric material 805 having embedded capacitor networks at each end of the isolation substrate bridge 801. Further, each isolation substrate bridge 801 may include a conductive transmission line 803 that extends along a top surface of the dielectric material 805.

Figure 9:
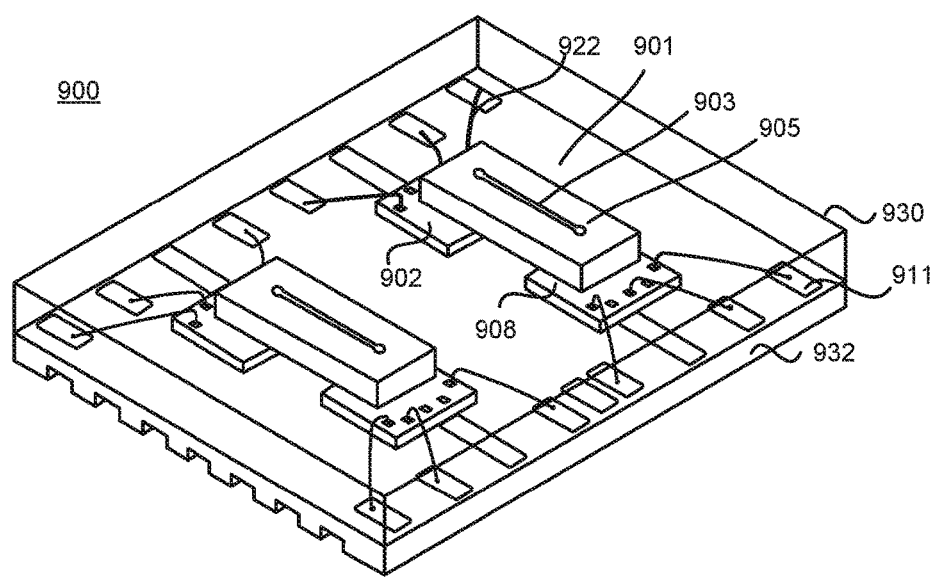
FIG. 9 illustrates an assembly layout of a semiconductor package having isolation substrate bridges according to an embodiment.

FIG. 9 illustrates an assembly layout of a semiconductor package 900 having isolation substrate bridges 901 according to an embodiment. The semiconductor package 900 of FIG. 9 may include a base substrate 932 having a normal bonded integrated circuit configuration. In some implementations, the base substrate 932 may be a ceramic base substrate. Referring to FIG. 9, within a package outline 930, the semiconductor package 900 may include a pair of semiconductor die 902, 908 and an isolation substrate bridge 901 for the pair. Further, the semiconductor package 900 may include another pair of semiconductor die with an isolation substrate bridge that may be the same as the semiconductor die 902, 908 and the isolation substrate bridge 901 (or different). This figure is explained with reference to one pair of semiconductor die and isolation substrate bridge, but it understood that this description (or the description for one or more of the other figures) may be extended to the other pair of semiconductor die and isolation substrate bridge.

The semiconductor package 900 may include a first semiconductor die 902 disposed on the base substrate 932, and a second semiconductor die 908 disposed on the base substrate 932, and an isolation substrate bridge 901 connected to the first semiconductor die 902 and the second semiconductor die 908. Also, each semiconductor die (e.g., 902, 908) may be connected to one or more other frame portions 911 via bond wires 922.

The isolation substrate bridge 901 may be the same as previously described with reference to FIGS. 7A-7C. For example, the isolation substrate bridge 901 may include a dielectric material 905 having embedded capacitor networks at each end of the isolation substrate bridge 901. Further, each isolation substrate bridge 901 may include a conductive transmission line 903 that extends along a top surface of the dielectric material 905, and connects the top plate of the capacitor networks. Again, it is noted that all references to conductive transmission lines cover the scenario of communicating data across one, two, three, or any number of channels of data communication which may or may not function as a differential communication network (either uni-directionally or bi-directionally).

Figure 10:
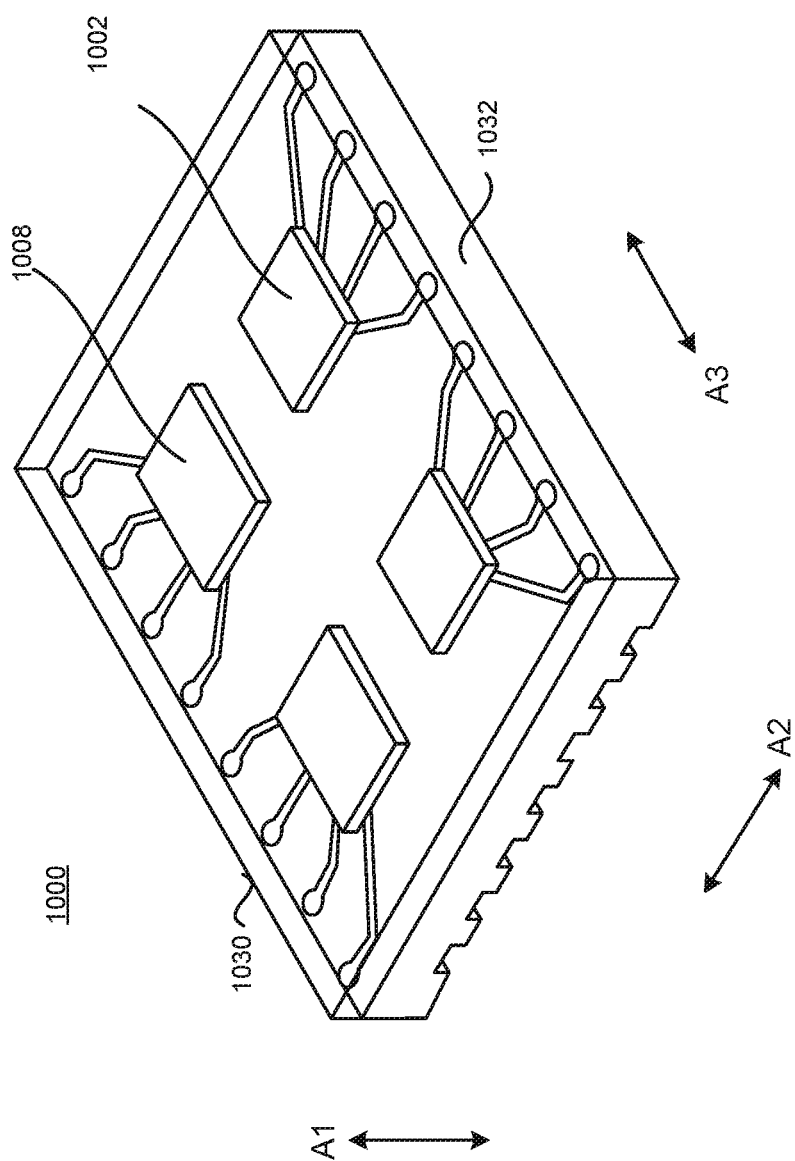
FIG. 10 illustrates an assembly layout of a semiconductor package having a flip-chip integrated circuit configuration according to an embodiment.

FIG. 10 illustrates an assembly layout of a semiconductor package 1000 having a flip-chip integrated circuit configuration according to an embodiment. For example, in contrast to the implementations of FIGS. 8-9, the semiconductor package 1000 includes semiconductor die 1008, 1002 having flip-chip configurations (as opposed to normal integrated circuit configurations). For example, in the flip-chip configuration, the pair of semiconductor die 1008, 1002 is flipped such that their conductors (e.g., conductive pads) are positioned downward (along vertical direction A1). Further, the semiconductor package 1000 may include another pair of semiconductor die that may be the same as the semiconductor die 1008, 1002 or different. The semiconductor package 1000 of FIG. 10 may include a base substrate 1032 with two pairs of semiconductor die disposed on top surface of the base substrate 1032. In some implementations, the base substrate 1032 may be ceramic. In some implementations, the semiconductor package 1000 may be a leadless package configuration.

Within a package outline 1030, the pair of semiconductor die may include a first semiconductor die 1002 and a second semiconductor die 1008, and an isolation substrate bridge (not shown in FIG. 10—embedded in the substrate) that is connected to the first semiconductor die 1002 and the second semiconductor die 1008 for the pair. The other pair of semiconductor die and isolation substrate bridge may be the same or different as described in FIGS. 10-11. The embedded isolation bridge is further explained with reference to FIGS. 11A and 11B. In some implementations, the semiconductor package 1000 may provide several benefits such as shorter process steps (e.g., as compared to FIGS. 8 and 9), no wire bonding, and no die back metal.

FIGS. 11A and 11B illustrate a cross-sectional view of a semiconductor package 1100 having an embedded isolation substrate bridge for a flip-chip integrated circuit configuration within a molding compound 1111. FIG. 11A illustrates a cross-sectional view of the semiconductor package 1100. FIG. 11B illustrates a more detailed view of a portion of the cross-section view of FIG. 11A.

Referring to FIG. 11A, the isolation substrate bridge 1101 may be disposed between the semiconductor die 1102, 1108 and the lead frame portions 1110, 1112. The construction of the capacitor networks 114 within the isolation substrate bridge 1101 are further described with reference to FIGS. 11D-11E. The isolation substrate bridge 1101 may be disposed on top surface of the first lead frame portion 1110 and the second lead frame portion 1112 in the manner shown with respect to FIG. 11A. Then, a first semiconductor die 1102 may be disposed on a top surface of one end of the isolation substrate bridge 1101 (e.g., on the portion of surface opposite to the first lead frame portion 1110), and a second semiconductor die 1108 may be disposed on a top surface of the other end of the isolation substrate bridge 1101 (e.g., on the portion of surface opposite to the second lead frame portion 1112).

Still referring to FIG. 11A, the isolation substrate bridge 1101 may include a dielectric substrate (e.g., ceramic) such that a first capacitor network 1114-1 is constructed within a portion of the isolation substrate bridge 1101 and a second capacitor network 1114-2 is constructed within another portion of the isolation substrate bridge 1101. Further, the isolation substrate bridge 1101 may include one or more embedded conductive transmission line 1103 that functions as a transmission line(s). In some implementations, the conductive transmission line 1103 may be entirely embedded within the isolation substrate bridge 1101 (e.g., entirely within the substrate). In some implementations, the embedded conductive transmission line 1103 may be copper. However, generally, the embedded conductive transmission line 1103 may be composed of any type of material that can transmit a signal. The embedded conductive transmission line 1103 may have a structure or shape similar to any of the conductive transmission lines previously discussed with reference to the other figures. For example, the embedded conductive transmission line 1103 may be a thin strip of conductive transmission lines extending from a location within the dielectric material to another location within the dielectric substrate. In some implementations, the conductive transmission line 1103 may be substantially rectangular in shape where the width of the conductive transmission line 1103 is substantially the same along its length. Also, the thickness (in the A1 direction) may be substantially uniform throughout its length. In other embodiments, the conductive transmission line 1103 may have a non-uniform shape such that one or more portions may have a different width and/or thickness. In other implementations, the isolation substrate bridge 1101 may include multiple embedded conductive transmission lines.

FIG. 11B illustrates a more detailed view of the portion (e.g., depicted by the rectangular box having dashed lines) of the semiconductor package 1100. For example, FIG. 11B illustrates the connections between the top surface of the isolation substrate bridge 1101 and the second semiconductor die 1108 and the connections between the bottom surface of the isolation substrate bridge 1101 and the second lead frame portion 1112 with respect to one end portion of the isolation substrate bridge 1101. The other end portion of the isolation substrate bridge 1101 may be disposed between and connected to the first semiconductor die 1102 and the first lead frame portion 1110 in the same manner, and therefore these details will be omitted for the sake of brevity.

Referring to FIG. 11B, the second semiconductor die 1108 may be raised from the dielectric substrate via conductive components 1130. In some implementations, the conductive components 1130 may be metal bumps such as copper bumps. As shown in FIG. 11B, a conductive component 1130 may be coupled to an upper conductor 1134 via conductive material 1132 such as conductive solder. The upper conductor 1134 may be an metal layer (e.g., copper) in the direction A2 that is disposed on an end portion of the top surface of the dielectric substrate. The dimensions of the upper conductor 1134 are further explained later in the disclosure. The upper conductor 1134 may be considered a pad or plate. In other implementations, the conductive components 1130 are omitted, and the second semiconductor die 1108 may be coupled to the upper conductor 1134 via the conductive material 1132 such as conductive epoxy, solder, adhesive, or any other types of conductive material.

Still referring to FIG. 11B, the isolation substrate bridge 1101 may include one or more embedded conductive transmission lines 1103. In some implementations, the embedded conductive transmission line 1103 may be disposed within a middle portion of the dielectric substrate. In other implementations, the embedded conductive transmission line 1103 may be disposed within the dielectric substrate at any locations having a distance from the bottom surface of the dielectric substrate and a distance from the top surface of the dielectric substrate. In other implementations, the isolation substrate bridge 1101 may include multiple conductive transmission lines 1103 that may be aligned or staggered. Still referring to FIG. 11B, a lower conductor 1136 may be disposed on a portion of the top surface of the first lead frame portion 1110. The lower conductor 1136 may be coupled to the first lead frame portion 1110 via non-conductive material 1138 such as any type of ceramic attach solder or adhesive. The lower conductor 1136 may be considered a pad or plate, and is further explained later in the disclosure.

In some implementations, referring to FIG. 11A, the first semiconductor die 1102 may be configured to communicate data with the second semiconductor die 1108 (or vice versa). In particular, the signal may be modulate through a portion (t) of the thickness (T) of the dielectric material of the isolation substrate bridge 1101 (via D1), transfer across the conductive transmission line 1103, and then modulate through a portion (t) of the thickness (T) of the dielectric material of the isolation substrate bridge 1101 (via D2). The thickness (t) may refer to the thickness of the dielectric material from the top surface of the dielectric material to the location of the conductive transmission line 1103 embedded within the isolation substrate bridge 1101.

In some implementations, a distance between two conductive elements may be equal to or greater than the thickness (2t) of the dielectric material of the implementations of FIG. 11. For example, as indicated above, the shortest transmission path may define the distance through insulation. Therefore, according to the embodiments, the distance (D3) between the first lead frame portion 1110 and the second lead frame portion 1112 may be equal to or greater than the minimum thickness (2t). Also, the distance between the inner edges of the semiconductor 1102, 1108 may be equal to or greater than the thickness (2t). Also, in some implementations, the distance through insulation (2t) may be greater or equal to 0.1 mm.

Figure 11C:
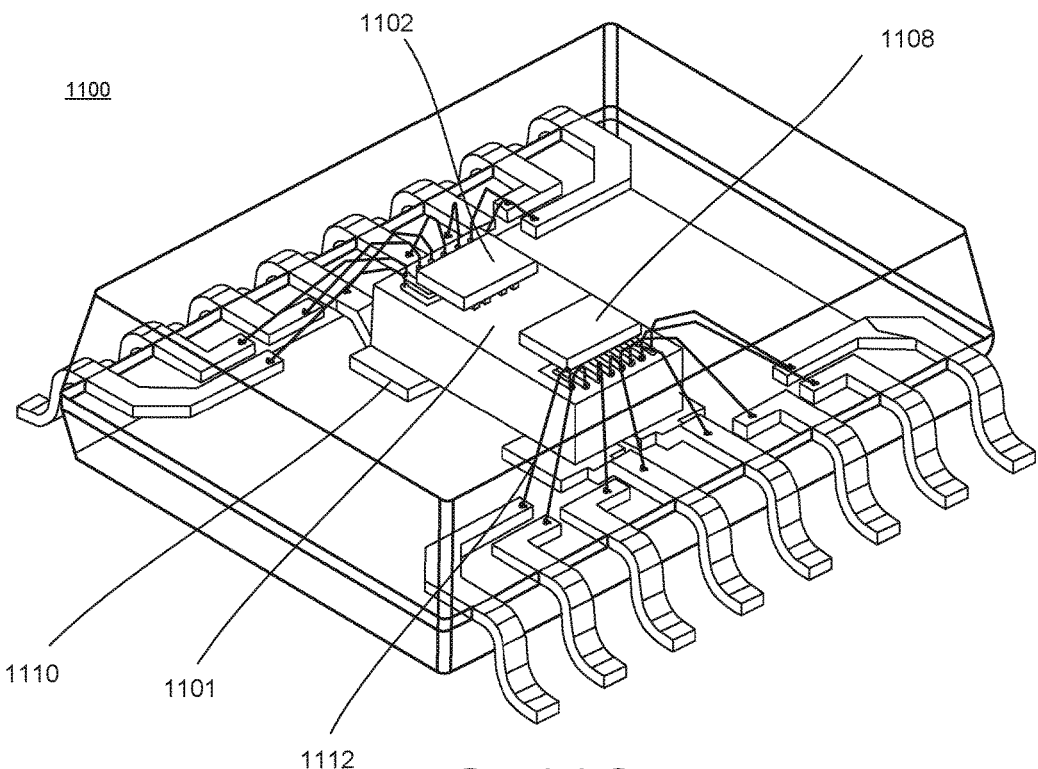
FIG. 11C illustrates a package assembly layout including a two-channel isolation substrate bridge according to an embodiment.
Figures 11D, 11E:
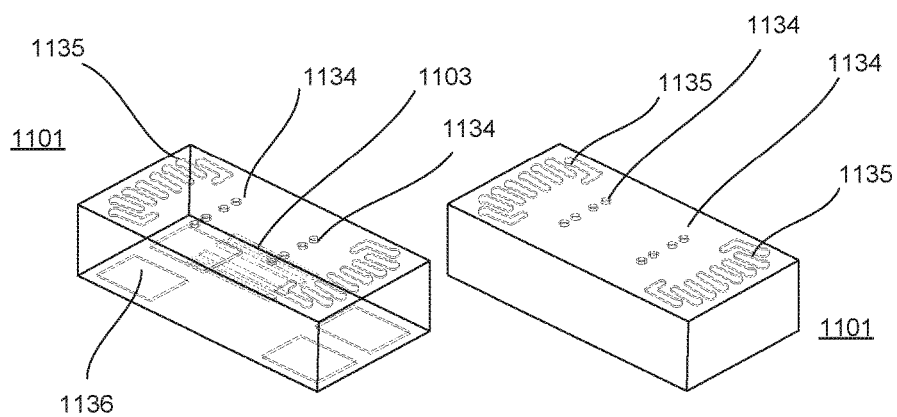
FIG. 11D illustrates a perspective of the two-channel isolation substrate bridge according to an embodiment.
FIG. 11E illustrates another perspective of the two-channel isolation substrate bridge according to an embodiment.

FIGS. 11C-11E illustrate the semiconductor package 1100 within a semiconductor die pair configuration attached on a two-channel substrate according to an embodiment. FIG. 11C illustrates a package assembly layout including a two-channel isolation substrate bridge 1101 disposed between the semiconductor die 1102, 1108 and lead frame portions 1110, 1112—e.g., the flip-chip configuration. FIG. 11D illustrates a perspective of the two-channel isolation substrate bridge 1101 according to an embodiment. FIG. 11E illustrates another perspective of the two-channel isolation substrate bridge 1101 according to an embodiment.

Referring to FIG. 11C, the isolation substrate bridge 1101 (e.g., having the dielectric substrate) is disposed between the semiconductor die 1102, 1108 and the lead frame portions 1110, 1112. In this implementation, the isolation substrate bridge 1101 may form two-channels such that data may be transmitted from the first semiconductor die 1102 to the second semiconductor die 1108 (or vice versa) along either communication channel, which are further explained with reference to FIGS. 11D and 11E.

For example, referring to FIGS. 11D and 11E, the isolation substrate bridge 1101 may include a first end portion having two bottom conductors 1136 and two sets of upper conductors 1134, a middle portion having two sets of embedded conductive transmission lines 1103, and a second end portion having two bottom conductors 1136 and two sets of top conductors 1134. Further, the first end portion may include a number of wire bond pads 1135 that may be connected to the frames of the first semiconductor die 1102 via wire bonds, and the second end portion may include a number of wire bond pads 1135 that may be connected to the frames of the second semiconductor die 1108 via bond wires. In some implementations, the conductors 1136 may be plates or pads having a rectangular shape. In some implementations, the upper conductors 1134 may be plates or pads having a circular shape. The upper conductors 1134 may be considered capacitance conductors because they form part of the capacitor networks.

In the example of FIGS. 11D and 11E, the capacitor networks are constructed with the isolation substrate bridge 1101. For example, the capacitor networks may be formed using the set of conductors 1134 disposed on a top surface of the dielectric substrate and the corresponding embedded conductive transmission lines 1103, and the portion of the dielectric material disposed between the conductors 1134 and the conductive transmission lines 1103. In some implementations, the conductive transmission lines 1103 may be configured as a bi-directional differential transmission channel, e.g., two pairs of conductive transmission lines 1103.

Figures 12A, 12B:
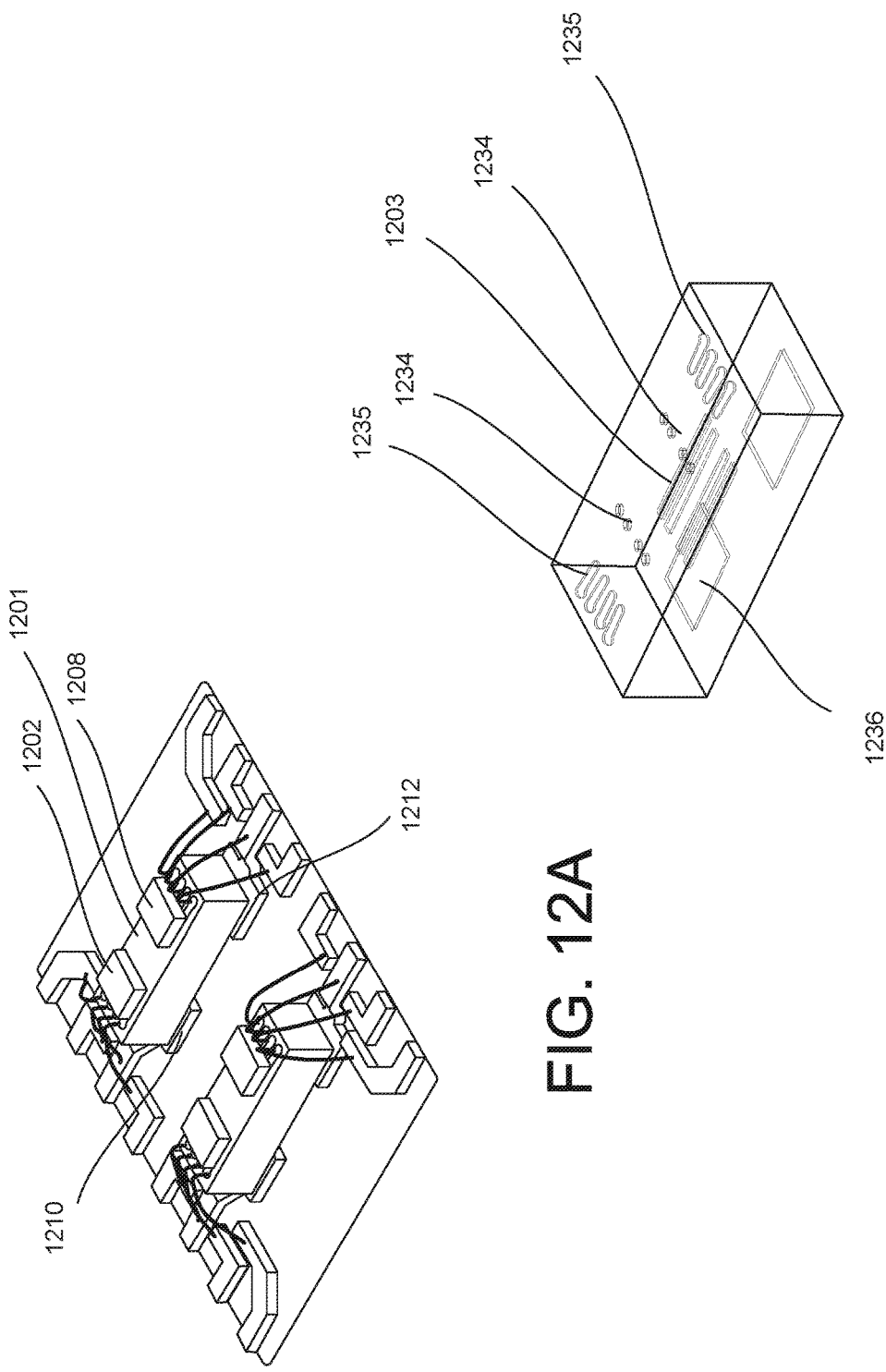
FIG. 12A illustrates a semiconductor package including two pairs of semiconductor die where each pair is attached to an isolation substrate bridge configured as a single channel substrate carrier according to an embodiment.
FIG. 12B illustrates a perspective of the isolation substrate bridge of FIG. 12A according to an embodiment.

FIGS. 12A and 12B illustrate a dual-channel semiconductor package 1200 with pairs of semiconductor die attached on a single-channel substrate according to an embodiment. FIGS. 12A and 12B may be considered a variation of FIGS. 11C-11E, but having the flip-chip configuration of FIGS. 11A-11B. FIG. 12A illustrates the semiconductor package 1200 including two pairs of semiconductor die where each pair is attached to an isolation substrate bridge 1201 configured as a single channel substrate carrier. FIG. 12B illustrates a perspective of the isolation substrate bridge 1201 of FIG. 12A according to an embodiment.

Referring to FIG. 12A, an isolation substrate bridge 1201 (e.g., having the dielectric substrate) is disposed between the semiconductor die 1202, 1208 and the lead frame portions 1210, 1212, and another isolation substrate bridge (which may be the same or different from the isolation substrate bridge 1201) is disposed between another pair of semiconductor die and another lead frame portions. In this implementation, the isolation substrate bridge 1201 may form a communication channel having transmission lines 1203 such that data may be transmitted from the first semiconductor die 1202 to the second semiconductor die 1108 (or vice versa).

Referring to FIG. 12B, the isolation substrate bridge 1201 may include a first end portion having a bottom attachment member 1236 and sets of top conductors 1234, a middle portion having sets of embedded conductive transmission lines 1203, and a second end portion having a bottom attachment member 1236 and sets of top conductors 1234. In some implementations, the attachment members 1236 may be any type of non-conductive plates or pads having a rectangular shape. Alternatively, the attachment members 1236 may be conductive materials. In some implementations, the top conductors 1234 may be plates or pads having a circular shape. The conductors 1234 may be considered capacitance conductors because they form part of the capacitor networks, as further described below.

Further, the first end portion may include a number of wire bond pads 1235 that may be connected to the frames of the first semiconductor die 1202 via wire bonds, and second end portion may include a number of wire bond pads 1235 that may be connected to the frames of the second semiconductor die 1208 via bond wires. In the example of FIG. 12B, the capacitor networks are constructed within the isolation substrate bridge 1201. For example, the capacitor networks may be built within the isolation substrate bridge 1201 using the top conductors 1234, the corresponding embedded conductive transmission lines 1203, and the portions of the substrate disposed between the top conductors 1234 and the embedded conductive transmission lines 1203. In some implementations, the conductive transmission lines 1103 may be configured as bi-directional differential transmission lines for providing communication along a communication channel.

FIG. 13 illustrates a process flow for constructing the semiconductor packages of FIGS. 11-12 according to an embodiment. Although FIG. 13 is illustrated as a sequential, ordered listing of operations, it will be appreciated that some or all of the operations may occur in a different order, or in parallel, or iteratively, or may overlap in time.

Solder (or another conductive material) may be disposed (e.g., dispensed) on lead frame portions (1302), and the substrate of the isolation substrate bridge may be attached to the lead frame portions via the solder (1304). For example, the isolation substrate bridge may be disposed on top of a first lead frame portion and a second lead frame portion, where the isolation substrate bridge is attached to the top surface on the first and second lead frame portions via the disposed solder. Then, solder may be disposed on the substrate of the isolation substrate bridge (1306), and the semiconductor die may be attached to the substrate in the flip-chip configuration (1308). For example, a first semiconductor die may be attached on the top surface of the isolation substrate bridge using the disposed solder, and a second semiconductor die may be attached to the top surface of the isolation substrate bridge using the disposed solder. Solder can be heated to reflow (1310) and flux cleaning can be performed (1312). The top plates of isolation substrate bridge may be connected to their respective lead frame portions via wire bonding (or another conductor) (1314). Then, a plasma clean (1316) may be performed. The semiconductor package may be coated in (or encapsulated via) a molding and PMC (1318). Post-plate and stress relief bake (e.g., an annealing process of pure Sn plating in order to avoid Sn whiskers forming) (SRB) (1320), trim and form (1322), electrical testing (1324), and finishing including marking and tape and reel (TNR) (1326) may be performed.

In some implementations, the semiconductor package of FIGS. 11-13 may provide several advantages such as totally insulated transmission lines (e.g., higher isolation protection), one time solder reflow, die size can be increased on one side (horizontal axis) only, (copper) bonding on (ceramic) metal pads and leads (e.g., no risks of cratering), smaller substrate size, universal substrate design regardless of die size (if various die size follow common bump location through re-distribution layer (RDL) (e.g., the RDL on Si die is the redistribution of Cu conductive layer), and/or one leadframe design for various die sizes, among other benefits.

FIG. 14A illustrates a cross-sectional view of a semiconductor package 1400 using an inverted substrate and a flip-chip configuration according to the embodiments. FIG. 14B illustrates a more detailed view of a portion of the cross-sectional view of FIG. 14A. In this configuration, an end portion 1413 of an isolation substrate bridge 1401 is coupled to the top surface of a first lead frame portion 1410 and the other end portion 1415 of the isolation substrate bridge 1401 is coupled to a top surface of a second lead frame portion 1412. Further, instead of coupling semiconductor die 1402, 1408 to the top surface of the isolation substrate bridge 1401 (e.g., that is opposite to the lead frame portions 1410, 1412), the semiconductor die 1402, 1408 are coupled to the same bottom surface (e.g., within a same plane A4) of the isolation substrate bridge 1401 that is used for attaching the lead frame portions 1410, 1412. In this context, the configuration of the isolation substrate bridge 1401 of FIGS. 14A-14B may be considered to be inverted as compared with the configurations of FIGS. 11 and 12.

Referring to FIG. 14A, the isolation substrate bridge 1401 may be coupled to and disposed on a top surface of the lead frame portions 1410, 1412. A first semiconductor die 1402 may be coupled to and disposed on a portion of the isolation substrate bridge 1401 proximate to the first lead frame portion 1410 via conductive components (e.g., 1432, 1430, and/or 1436). In particular, the first semiconductor die 1402 may be disposed on the same bottom surface of the isolation substrate bridge 1401 that connects to the first lead frame portion 1410. In some implementations, the first semiconductor die 1402 may be disposed at a location on the bottom surface of the isolation substrate bridge 1401 having a certain distance (D4) from the first lead frame portion 1410. A second semiconductor die 1408 may be coupled to and disposed on a portion of the isolation substrate bridge 1401 proximate to the second lead frame portion 1412. In particular, the second semiconductor die 1408 may be disposed on the same bottom surface of the isolation substrate bridge 1401 that connects to the second lead frame portion 1412. In some implementations, the second semiconductor die 1408 may be disposed at a location on the bottom surface of the isolation substrate bridge 1401 having a certain distance (D5) from the second lead frame portion 1412. The distance (D4) and the distance (D5) may be the same or different, and be encompass any value. In some implementations, the first semiconductor die 1402 and the second semiconductor die 1408 may be disposed on and coupled to the same bottom surface of the isolation substrate bridge 1401 in a manner that the first semiconductor die 1402 is approximately aligned to but located at a distance (D4) from the first lead frame portion 1410 and the second semiconductor die 1408 is approximately aligned to but located at a distance (D5) from the second lead frame portion 1412.

Still referring to FIG. 14A, the isolation substrate bridge 1401 may include a dielectric substrate having integrated capacitor networks 1414 such as a first capacitor network 1414-1 constructed within a portion of the isolation substrate bridge 1401 and a second capacitor network 1414-2 constructed within another portion of the isolation substrate bridge 1401. The construction of the capacitor networks 1414 are further described with reference to FIGS. 18 and 19. The isolation substrate bridge 1401 may include one or more conductive transmission lines 1403 disposed on a top surface of the isolation substrate bridge 1401 (e.g., a surface that is opposite to the surface having the semiconductor die 1402, 1408). In some implementations, the conductive transmission line 1403 may be disposed on the surface of the isolation substrate bridge 1401 at a location towards a middle portion of the isolation substrate bridge 1401. In some implementations, a portion of the conductive transmission line 1403 may be disposed on the top surface of the isolation substrate bridge 1401 at any location between the first semiconductor die 1402 and the second semiconductor die 1408. In some implementations, the conductive transmission line 1403 may be copper. However, generally, the conductive transmission line 1403 may be composed of any type of material that can transmit a signal. The conductive transmission line 1403 may be a relatively thin and long strip of conductor extending from a location within the dielectric material to another location on the dielectric substrate. However, the conductive transmission line 1403 may have a structure explained with reference to any of the figures. In other implementations, the isolation substrate bridge 1401 may include multiple conductive transmission lines such that the conductive transmission lines are configured as multiple communication channels, as further described below.

Referring to FIG. 14A, in some implementations, the first semiconductor die 1402 may be configured to communicate data with the second semiconductor die 1408 (or vice versa). In particular, the signal may modulate through the dielectric material (via D1), transfer across the one or more conductive transmission lines 1403, and module through the dielectric material (via D2). In this example, the distance through insulation (2T) may be defined based on the thickness (T) of the dielectric material. As explained above, if the thickness (T) of the dielectric material is 0.5 mm (e.g., the combined thickness (2T) would be 1 mm—due to the fact that the signal modulates through the dielectric material via D1 and modulates through the dielectric material via D2), the distance through insulation would be 1 mm. Therefore, according to the embodiments, the distance (D3) between the first semiconductor die 1402 and the second semiconductor die 1408 may be equal to or greater than the minimum combined thickness (2T). Also, in some implementations, the distance through insulation (T) may be greater or equal to 0.1 mm.

FIG. 14B illustrates a more detailed view of portion 1417 (e.g., depicted by the rectangular box having dashed lines) of the semiconductor package 1400 of FIG. 14A. For example, FIG. 14B illustrates the connections between a portion of the bottom surface of the isolation substrate bridge 1401, the second lead frame portion 1412, and a portion of the second semiconductor die 1408.

Generally, each semiconductor die 1402, 1408 may be attached to the surface of the isolation substrate bridge 1401 using any type of conductive material such as solder. In some embodiments, each semiconductor die 1402, 1408 may be attached to the bottom surface of the isolation substrate bridge 1401 using two conductive components disposed on end portions of a respective semiconductor die 1402 or 1408. In some embodiments, each semiconductor die 1402, 1408 may be attached to the isolation substrate bridge 1401 using (1) a conductive component 1430 (e.g., a bump), conductive material 1432 (e.g., solder), and a conductive component 1436 stacked between an end portion of the semiconductor die 1402, 1408 that is proximate to its respective lead frame portion 1410, 1412, and the bottom surface of the isolation substrate bridge 1401, and (2) a conductive component 1430 (e.g., bump) and conductive material 1432 (e.g., solder) formed between the other end portion of the semiconductor die 1402, 1402 that is proximate to the other semiconductor die 1402, 1408, and the bottom surface of the isolation substrate bridge 1401.

FIG. 14B illustrates a more detailed view of the connections between a portion of the second semiconductor die 1408, the second lead frame portion 1412, and an end portion of the isolation substrate bridge 1401. Referring to FIG. 14B, a conductive component 1436 may be disposed on the bottom surface of the isolation substrate bridge 1401 towards the end portion of the isolation substrate bridge 1401 that is proximate to the second lead frame portion 1412. In some embodiments, the conductive component 1436 may be considered a conductive plate that extends in the direction A2. The conductive component 1436 may be disposed on or cover (e.g., coat) only a portion of the isolation substrate bridge 1401. In some implementations, the conductive component 1436 may be coupled to the second lead frame portion 1412 via any type of solder or adhesive connection material, and extend along a portion of the bottom surface of the isolation substrate bridge 1401, where the other end portion of the conductive component 1436 is used to connect to the second semiconductor die 1408.

The second semiconductor die 1408 may be displaced from the dielectric substrate via a conductive component 1430. In some implementations, the conductive component 1430 may be a metal bump such as a copper bump. In some implementations, the conductive components 1430 may be an extension of the second semiconductor die 1408, and may be considered the conductive pad providing an outside contact point for the second semiconductor die 1408. The conductive component 1430 may be coupled to the conductive component 1436 via the conductive material 1432 such as conductive solder. In other implementations, the conductive components 1430 are omitted, and the conductors of the second semiconductor die 1408 may be coupled to the conductive components 1436 via the conductive material such as conductive epoxy, solder, or any other types of conductive material.

FIGS. 14C-14E illustrate the semiconductor package 1400 having pairs of semiconductor die communicating on a single channel substrate according to an embodiment. FIG. 14C illustrates a top view of the semiconductor package 1400, FIG. 14D illustrates a bottom view of the semiconductor package 1400, and FIG. 14E illustrates another perspective of the semiconductor package 1400. Generally, FIGS. 14C-14E illustrate the semiconductor package 1400 having the inverted substrate and flip-chip configuration for pairs of semiconductor die 1402, 1408 and each pair communicates along transmission lines forming a single channel substrate. In some implementations, each substrate may include two transmission lines for uni-directional differential communications. The two substrates may communicate a signal in opposite directions.

Referring to FIGS. 14C-14E, an isolation substrate bridge 1401 (e.g., having the dielectric substrate) may connect the first semiconductor die 1402 and the second semiconductor die 1408. Also, the semiconductor package 1400 may include another pair of semiconductor die connected with an isolation substrate bridge that may be the same or different than the semiconductor die 1402, 1408 and the isolation substrate bridge 1401. As shown in FIG. 14C, the isolation substrate bridge 1401 may include multiple conductive transmission lines 1403 disposed on a surface of the isolation substrate bridge 1401. In some implementations, each isolation substrate bridge 1401 may include two conductive transmission lines 1403. Further, additional channels or conductive transmission lines 1403 can be integrated into the same set of semiconductor die 1402, 1408 and the same isolation substrate bridge 1401 in addition to the physically separated option shown in FIG. 14.

FIG. 15 illustrates a pre-process flow 1500 for constructing the semiconductor packages 1400 of FIGS. 14A-14E according the embodiments. Although FIG. 15 is illustrated as a sequential, ordered listing of operations, it will be appreciated that some or all of the operations may occur in a different order, or in parallel, or iteratively, or may overlap in time.

Solder may be printed on an isolation substrate bridge (1502), and a first semiconductor die and a second semiconductor die may be attached to the isolation substrate bridge (1504). Solder reflow (1506) and flux clean (1508) may be performed. Substrate (e.g., ceramic substrate) singulation (1510) may be performed by cutting the substrate into portions having a first semiconductor die and a second semiconductor die. As a result, the pre-process flow may produce a number of portions, where each portion includes the first semiconductor die and the second semiconductor die disposed on the isolation substrate bridge. Referring to FIG. 15, in (1511), the topside of a single portion is illustrated on the upper figure, and the backside of that portion is illustrated on the lower figure. FIG. 16 illustrates a package assembly flow 1600 for constructing the semiconductor packages 1400 of FIGS. 14A-14E according to an embodiment. FIG. 16 may be a continuation of FIG. 15.

Although FIG. 16 is illustrated as a sequential, ordered listing of operations, it will be appreciated that some or all of the operations may occur in a different order, or in parallel, or iteratively, or may overlap in time.

Solder or adhesive may be printed on the lead frame portions (1602), and the isolation substrate bridge loaded with the semiconductor die may be attached (1604). For example, the loaded isolation substrate bridge may be the isolation substrate bridge having the pair of coupled semiconductor die, as shown in (1511) of FIG. 15. Solder reflow/adhesive cure (1606), flux clean (if solder is used) (1608), and plasma clean (1610) may be performed. Then, the semiconductor apparatus may be molded and post mold bake (PMB) (1612). Trim and form (1614), electrical testing (1616), trim and form (1618), and finishing (1620) including marking and TNR may be performed. FIGS. 17A-17B illustrate a semiconductor package 1700 having a pair of semiconductor die 1702, 1708 with an isolation substrate bridge 1701 configured as a dual channel communication device according to an embodiment. FIG. 17A illustrates a top view of the semiconductor package 1700, and FIG. 17B illustrates a bottom view of the semiconductor package 1700. The semiconductor package 1700 may be the semiconductor package of FIGS. 14A-B having the inverted substrate and flip-chip configuration, but being configured as a dual communication channel.

Referring to FIGS. 17A-17B, an isolation substrate bridge 1701 (e.g., having the dielectric substrate) may connect the first semiconductor die 1702 and the second semiconductor die 1708. As shown in FIG. 17A, the isolation substrate bridge 1701 may include multiple conductive transmission lines 1703 disposed on a surface of the isolation substrate bridge 1701. In some implementations, the isolation substrate bridge 1701 may include two sets of two conductive transmission lines 1703, where each set of conductive transmission lines 1703 may operate as differential transmission network.

FIGS. 18A-18C illustrate various perspectives of an isolation substrate bridge 1801 that may be used to provide isolation between a pair of semiconductor die. The isolation substrate bridge 1801 may be various implementations of the isolation substrate bridge 1401 of FIGS. 14C-14E (e.g., a pair of semiconductor die disposed on a single isolation substrate bridge) that may include an inverted substrate with a flip-chip configuration. FIG. 18A illustrates a perspective of the isolation substrate bridge 1801. FIG. 18B illustrates a top view of the isolation substrate bridge 1801. FIG. 18C illustrates a bottom view of the isolation substrate bridge 1801. It is noted that the isolation substrate bridge 1801 is inverted as compared with the views of FIGS. 14C-14E. (e.g., in FIGS. 18A-18C, conductive transmission lines 1803 appear on the bottom of the substrate—as opposed on the top surface of the substrate of FIGS. 14C-14E).

Referring to FIGS. 18A-18C, the isolation substrate bridge 1801 may include a plurality of frame conductors 1822 disposed on both ends portions of the upper surface of the isolation substrate bridge 1801. In some implementations, the frame conductors 1822 may be conductive plates (e.g., copper) that are used to connect to lead frame portions. Further, the isolation substrate bridge 1801 may include two die conductors 1836 disposed on the upper surface for connection to a first semiconductor die, and two die conductors 1836 on the upper surface for connection to a second semiconductor die. In some implementations, the die conductors 1836 may be considered capacitor pads, capacitor plates, and/or capacitor conductors. In some implementations, the conductors 1836 may have a circulator-based structure. Further, the isolation substrate bridge 1801 may include two conductive transmission lines 1803 on the bottom surface. The conductive transmission lines 1803 may have a structure described with reference to any of the figures. The two conductive transmission lines 1803 formed on the isolation substrate bridge 1801 may function as a communication channel to exchange data between the semiconductor die 1802, 1808.

In some implementations, the capacitor networks of the isolation substrate bridge 1801 may be formed from the die conductors 1836 and the conductive transmission lines 1803, and the dielectric material disposed between the die conductors 1836 and the conductive transmission lines 1803.

FIGS. 19A-19C illustrate various perspectives of an isolation substrate bridge 1901 that may be used to provide isolation between a pair of semiconductor die. The isolation substrate bridge 1901 may be various implementations of the isolation substrate bridge 1701 of FIGS. 17A-17B that may include an inverted substrate with a flip-chip configuration for multiple differential channels communicating data bi-directionally. FIG. 19A illustrates a perspective of the isolation substrate bridge 1901. FIG. 19B illustrates a top view of the isolation substrate bridge 1901. FIG. 19C illustrates a bottom view of the isolation substrate bridge 1901. It is noted that the isolation substrate bridge 1901 is inverted as compared with the views of FIGS. 17A-17B. (e.g., in FIGS. 19A-19C, conductive transmission lines 1903 appear on the bottom of the substrate—as opposed on the top surface of the substrate of FIGS. 17A-17A).

Referring to FIGS. 19A-19C, the isolation substrate bridge 1901 may include a plurality of frame conductors 1922 disposed on both ends portions of the upper surface of the isolation substrate bridge 1901. In some implementations, the frame conductors 1922 may be conductive plates (e.g., copper) that are used to connect to lead frame portions. Further, the isolation substrate bridge 1901 may include two sets of two die conductors 1936 on the upper surface for connection to a first semiconductor die, and two sets of two die conductors 1936 on the upper surface for connection to a second semiconductor die. In some implementations, the die conductors 1936 may be considered capacitor pads, capacitor plates, and/or capacitor conductors. The die conductors 1936 may include a circular-based structure. Further, the isolation substrate bridge 1901 may include two sets of two conductive transmission lines 1903 disposed on the bottom surface. The conductive transmission lines 1903 may have a structure explained with reference to the other figures.

In some implementations, the capacitor networks of the isolation substrate bridge 1901 may be formed from the die conductors 1936 and the conductive transmission lines 1903, and the dielectric material disposed between the die conductors 1936 and the conductive transmission lines 1903.

In some implementations, the semiconductor packages of FIGS. 14-19 may provide several benefits such as transmission lines are isolated on other side of the substrate and from other metal structures (e.g., provides relatively good isolation protection), structural center of gravity around the middle of the package, simple substrate layout (e.g., may decrease cost of substrate material, e.g., ceramic), pre-plated lead frames, and/or no wire bonding, among other benefits.

FIG. 20A illustrates a cross-sectional view of a semiconductor package 2000 having an isolation substrate bridge 2001 using a conductive connection (e.g., via) within a flip-chip configuration according to the embodiments. FIG. 20B illustrates a more detailed view of a portion of the cross-sectional view of FIG. 20A. The semiconductor package 2000 may be similar to the semiconductor package 1100 of FIGS. 11A and 11B (e.g., flip-chip configuration) except that one or more conductive transmission lines 2003 are not embedded within isolation substrate bridge 2001 but rather are attached to a bottom surface of the isolation substrate bridge 2001 and a conductive connection 2037 (also can be referred to as a via) connects and is disposed between two conductive components (e.g., 2034, 2036).

Referring to FIG. 20A, the isolation substrate bridge 2001 may be disposed between the semiconductor die 2002, 2008 and the lead frame portions 2010, 2012. The isolation substrate bridge 2001 may be disposed on the top surface of the first lead frame portion 2010 and the top surface of the second lead frame portion 2012 in the manner shown with respect to FIG. 20A. A first semiconductor die 2002 may be disposed on a top surface of a portion 2013 of the isolation substrate bridge 2001, and a second semiconductor die 2008 may be disposed on the top surface of another portion 2015 of the isolation substrate bridge 2001.

Still referring to FIG. 20A, the isolation substrate bridge 2001 may include a dielectric substrate having conductors such that a first capacitor network 2014-1 is constructed within a portion of the isolation substrate bridge 2001 and a second capacitor network 2014-2 is constructed within another portion of the isolation substrate bridge 2001. The constructions of the capacitor networks 2014 are further described with reference to FIGS. 22-23.

One or more conductive transmission lines 2003 may be coupled to and disposed on a bottom surface of the isolation substrate bridge 2001. The conductive transmission lines 2003 may have a structure described with reference to the other figures. The conductive transmission lines 2003 may be disposed on the bottom surface towards a middle of the isolation substrate bridge 2001. Further, end portions of the conductive transmission lines 2003 may be disposed on the bottom surface at location proximate to where the inner end portions of the semiconductor die 2002, 2008 reside on the top surface of the isolation substrate bridge 2001.

The conductive transmission lines 2003 may be configured to operate as a communication lines and/or (bi-directional) differential transmission lines in the case of multiple conductive transmission lines 2003. In some implementations, the conductive transmission lines 2003 may be copper. However, generally, the conductive transmission lines 2003 may be composed of any type of material that can transmit a signal. The conductive transmission lines 2003 may be a thin strip of conductor extending from a location on the dielectric substrate to another location on the dielectric substrate. However, the conductive transmission lines 2003 may have a structure described with reference to any of the figures.

Referring to FIG. 20A, in some implementations, the first semiconductor die 2002 may be configured to communicate data with the second semiconductor die 2008 (or vice versa). In particular, the signal may modulate through the dielectric material (via D1), transfer across the one or more conductive transmission lines 2203, and module through the dielectric material (via D2). In this example, the distance through insulation (2T) may be defined based on the thickness (T) of the dielectric material. As explained above, if the thickness (T) of the dielectric material is 0.5 mm (e.g., the combined thickness (2T) would be 1 mm—due to the fact that the signal modulates through the dielectric material via D1 and modulates through the dielectric material via D2), the distance through insulation would be 1 mm. In some embodiments, the thickness (T) of the dielectric material may be greater than the distance between two possible conductive components that may provide the shortest transmission path included in the semiconductor apparatus. In this example, the combined thickness (2T) may be equal to greater than the distance (D3) between the first semiconductor die 2002 and the second semiconductor die 2008. Also, in some implementations, the distance through insulation (2T) may be greater or equal to 0.1 mm.

FIG. 20B illustrates a more detailed view of a portion 2017 (e.g., depicted by the rectangular box having dashed lines) of the semiconductor package 2000 of FIG. 20A. For example, FIG. 20B illustrates the connections between the top and bottom surfaces of the isolation substrate bridge 2001, the second lead frame portion 2012, and a portion of the second semiconductor die 2008.

Generally, each semiconductor die 2002, 2008 may be attached to the top surface of the isolation substrate bridge 2001 using any type of conductive components. In some embodiments, each semiconductor die 2002, 2008 may be attached to the top surface of the isolation substrate bridge 2001 using two conductive components disposed on end portions of a respective semiconductor die 2002 or 2008. In some implementations, each semiconductor die 2002, 2008 may be attached to the top surface of the isolation substrate bridge 2001 using (1) a conductive component 2030 (e.g., bump), conductive material 2032 (e.g., solder), and a conductive component 2034 stacked between an end portion of the semiconductor die 2002, 2008 that is proximate to its respective lead frame portion 2010, 2012 and the top surface of the isolation substrate bridge 2001, and (2) a conductive component 2030 (e.g., bump) and conductive material 2032 (e.g., solder) formed between the other end portion of the semiconductor die 2002, 2002 that is proximate to the other semiconductor die 2002, 2008 and the top surface of the isolation substrate bridge 2001. Furthermore, as further explained with reference to FIG. 20B, a conductive connection 2037 may be connected to and disposed between two conductive components (2034, 2036).

FIG. 20B illustrates a more detailed view of the connections between a portion of the second semiconductor die 2008, the second lead frame portion 2012, and an end portion of the isolation substrate bridge 2001. Referring to FIG. 20B, an upper conductive component 2034 may be disposed on the top surface of the isolation substrate bridge 2001 towards the end portion of the isolation substrate bridge 2001 that is proximate to the second lead frame portion 2012. The upper conductive component 2034 may be an elongate conductive plate that extends in the direction A2, and is disposed on a portion of the top surface of the substrate.

The second semiconductor die 2008 may be displaced from the dielectric substrate via a conductive component 2030. In some implementations, the conductive component 2030 may be a metal bump such as a copper bump. In some implementations, the conductive component 2030 may be an extension of the second semiconductor die 2008. The conductive component 2030 may be coupled to the conductive component 2034 via conductive material 2032 such as conductive solder, adhesive, or generally any type of conductive material used for attaching components. In other implementations, the conductive component 2030 (e.g., the bump) is omitted, and the conductor of the second semiconductor die 2008 may be coupled to the upper conductive component 2034 via any type of conductive material such as conductive epoxy, solder, adhesive, or any other types of conductive material.

Still referring to FIG. 20B, a bottom conductive component 2036 may be disposed on and coupled to a portion of the second lead frame 2012 via conductive material 2038. In some implementations, the bottom conductive component 2036 may be an elongate conductive plate disposed on a bottom surface of the substrate. The conductive material 2038 may be any type of conductive discussed herein such as conductive solder, adhesive, or generally any type of conductive material used for attaching components. In some implementations, a conductive connection 2037 may be connected to and disposed between the upper conductive component 2034 and the bottom conductive component 2036. The conductive connection 2037 may be a via. A via may be a small opening in the substrate that functions as a conductive connection between the upper conductive component 2034 and the bottom conductive component 2036.

FIGS. 20C-20D illustrate the semiconductor package 2000 having pairs of semiconductor die 2002, 2008 communicating on a single channel substrate according to an embodiment. FIG. 20C illustrates a top view of the semiconductor package 2000 according to one perspective, and FIG. 20D illustrates a top view of the semiconductor package 2000 according to another perspective. Generally, the semiconductor package 2000 of FIGS. 20C-20D illustrate the semiconductor package 2000 having the isolation substrate bridge 2001 using the conductive connection 2037 within the flip-chip configuration according to the embodiments.

Referring to FIGS. 20C-20D, an isolation substrate bridge 2001 (e.g., having the dielectric substrate) may connect the first semiconductor die 2002 and the second semiconductor die 2008. Also, the semiconductor package 2000 may include another pair of semiconductor die with an isolation bridge that may be the same or different than the semiconductor die 2002, 2008, and the isolation substrate bridge 2001. As shown in FIG. 20C, the isolation substrate bridge 2001 may include multiple conductive transmission lines 2003 disposed on a bottom surface of the isolation substrate bridge 2001.

FIG. 21 illustrates a process flow 2100 for constructing the semiconductor packages of FIGS. 20A-20D according to an embodiment. Although FIG. 21 is illustrated as a sequential, ordered listing of operations, it will be appreciated that some or all of the operations may occur in a different order, or in parallel, or iteratively, or may overlap in time.

Solder (or another conductive material) may be disposed (e.g., dispensed) on the lead frame portions (2102), and the isolation substrate bridge may be attached to (e.g., coupled to) the lead frame portions (2104). Then, solder may be disposed (e.g., dispended) on the isolation substrate bridge, and the semiconductor die may be attached to the substrate in the flip-chip configuration (2106). For example, the first semiconductor die may be attached on the top surface of the isolation substrate bridge using the disposed solder, and the second semiconductor die may be attached to (e.g., coupled to) the top surface of the isolation substrate bridge using the disposed solder. Solder can be heated to reflow (2108) and flux clean (2110) may be performed. Then, plasma clean (2112) may be performed. The semiconductor package may be coated in (or encapsulated via) a molding and post mold cure (PMC) (2114). Trim and form (2116), electrical testing (2118), and finishing including marking and TNR (2120) may be performed.

FIGS. 22A-22C illustrate various perspectives of an isolation substrate bridge 2201 according to the embodiments. The isolation substrate bridge 2201 may be various implementations of the isolation substrate bridge 2001 of FIGS.

20A-20D using a conductive connection (e.g., via) within a flip-chip configuration for a single differential communication channel. FIG. 22A illustrates a perspective of the isolation substrate bridge 2201. FIG. 22B illustrates a top view of the isolation substrate bridge 2201. FIG. 22C illustrates a bottom view of the isolation substrate bridge 2201.

Referring to FIGS. 22A-22C, the isolation substrate bridge 2201 may include a plurality of conduction assemblies 2235 disposed within both ends portions of the isolation substrate bridge 2201. Each conduction assembly 2235 may include a top conductive component 2234 disposed on an upper surface of the isolation substrate bridge 2201, a bottom conductive component 2236 disposed on a bottom surface of the isolation substrate bridge 2201, and a conduction via 2237 connected to and disposed between the top conductive component 2234 and the bottom conductive component 2236. In some implementations, each top conductive component 2234 may be a contact point for connection to a semiconductor die. Each bottom conductive component 2236 may be a contact point for lead frame portions. In some implementations, the top conductive component 2234 may be considered a metal plate or pad (e.g., similar to 2034 in FIG. 20B), and the bottom conductive component 2236 may be considered a metal plate or pad (e.g., similar to 2036 in FIG. 20B). In some implementations, the top conductive component 2234 may be larger than the bottom conductive component 2236.

Also, the isolation substrate bridge 2201 may include two die conductors 2240 on the upper surface for connection to a first semiconductor die, and two die conductors 2240 on the upper surface for connection to a second semiconductor die. In some implementations, the die conductors 2240 may be considered capacitor pads, capacitor plates, and/or capacitor conductors. In some implementations, the die conductors 2240 may have a circular-based structure. Further, the isolation substrate bridge 2201 may include two or more conductive transmission lines 2203 on the bottom surface. The two conductive transmission lines 2203 formed on the isolation substrate bridge 2201 may function as differential transmission lines. The conductive transmission lines 2203 may have a structure discussed with reference to any of the figures. In some implementations, the capacitor networks may be constructed from the die conductors 2240, the conductive transmission lines 2203, and the dielectric material disposed between the die conductors 2240 and the conductive transmission lines 2203.

FIGS. 23A-23C illustrate various perspectives of an isolation substrate bridge 2301 according to the embodiments. The isolation substrate bridge 2301 may be various implementations of the isolation substrate bridge 2001 of FIGS. 20A-20B using a conductive connection (e.g., via) within a flip-chip configuration for dual bi-directional communication channels. An assembly layout view of the isolation substrate bridge 2301 is further illustrated in FIGS. 24A-B. FIG. 23A illustrates a perspective of the isolation substrate bridge 2301. FIG. 23B illustrates a top view of the isolation substrate bridge 2301. FIG. 23C illustrates a bottom view of the isolation substrate bridge 2301.

Referring to FIGS. 23A-23C, the isolation substrate bridge 2301 may include a plurality of conduction assemblies 2335 disposed within both ends portions of the isolation substrate bridge 2301. Each conduction assembly 2335 may include a top conductive component 2334 disposed on an upper surface of the isolation substrate bridge 2301, a bottom conductive component 2336 disposed on a lower surface of the isolation substrate bridge 2301, and a conduction via 2337 connected to and disposed between the top conductive component 2334 and the bottom conductive component 2336. Each top conductive component 2334 may be a contact point for connection to a semiconductor die. Each bottom conductive component 2336 may be a contact point for lead frame portions. In some implementations, the top conductive component 2334 may be considered a metal plate or pad (e.g., similar to 2034 in FIG. 20B), and the bottom conductive component 2336 may be considered a metal plate or pad (e.g., similar to 2036 in FIG. 20B). In some implementations, the top conductive component 2334 may be larger than the bottom conductive component 2336.

Also, the isolation substrate bridge 2301 may include two sets of two die conductors 2340 on the upper surface for connection to a first semiconductor die, and two sets of two die conductors 2340 on the upper surface for connection to a second semiconductor die. In some implementations, the die conductors 2340 may be considered capacitor pads, capacitor plates, and/or capacitor conductors. In some implementations, the die conductors 2340 may have a circular-based structure. Further, the isolation substrate bridge 2301 may include two sets of two conductive transmission lines 2303 on the bottom surface. The conductive transmission lines 2303 may have a structure discussed with any of the figures. In some implementations, the two sets of two conductive transmission lines 2303 formed on the isolation substrate bridge 2301 may function as differential transmission lines. In some implementations, the capacitor networks may be constructed from the die conductors 2340, the conductive transmission lines 2303, and the dielectric material disposed between the die conductors 2340 and the conductive transmission lines 2303.

FIGS. 24A-24B illustrate top views of a semiconductor package 2400 having a pair of semiconductor die 2402, 2408 with an isolation substrate bridge 2401 configured as a dual channel communication substrate according to an embodiment. The semiconductor package 2400 of FIG. 24A is similar to the semiconductor package 2400 of FIG. 24B except that the semiconductor die 2402, 2408 of FIG. 24B are larger than the semiconductor die 2402, 2408 of FIG. 24A. The semiconductor package 2400 may be the semiconductor package of FIGS. 23A-23B using the conductive connection and flip-chip configuration, but the isolation substrate bridge 2401 is configured as a dual bi-directional communication channel.

Referring to FIGS. 24A-24B, the isolation substrate bridge 2401 (e.g., having the dielectric substrate) may connect the first semiconductor die 2402 and the second semiconductor die 2408. The isolation substrate bridge 2401 may include multiple conductive transmission lines (not shown because they are disposed on the bottom surface of the isolation substrate bridge 2401). In some implementations, the isolation substrate bridge 2401 may include two sets of two conductive transmission lines, where each set of conductive transmission lines operates as unidirectional differential transmission lines forming a single communication channel, thereby providing a bi-direction, multi-channel communication network.

In some implementations, the semiconductor packages of FIGS. 20-24 may provide several benefits such as shorter process steps, one time solder reflow, pre-plated leadframe, no wire bonds, die size can be increased on both sides, relatively small (ceramic) substrate size, universal (ceramic) design regardless of die size (if various die size follow common bump location through RDL), and/or one leadframe design for various die sizes, among other benefits.

FIG. 25A illustrates a cross-sectional view of a semiconductor package 2500 using an inverted substrate and flip-chip configuration with wire bonds according to the embodiments. FIG. 25B illustrates a more detailed view of a portion 2517 of the cross-sectional view of FIG. 25A. The semiconductor package 2500 may be similar to the semiconductor package 1400 of FIGS. 14A-B except that wire bonds 2540 are additional used to connect conductive components of the isolation substrate bridge 2501 to lead frame portions 2510, 2512.

In this configuration, a portion 2513 of an isolation substrate bridge 2501 is coupled to and disposed on the top surface of a first lead frame portion 2510 and a portion 2515 of the isolation substrate bridge 2501 is coupled to and disposed on the top surface of a second lead frame portion 2512. A first semiconductor die 2502 may be coupled to and disposed on a bottom surface of a portion of the isolation substrate bridge 2501 proximate to the first lead frame portion 2510 via component components. In particular, the first semiconductor die 2502 may be disposed on the same bottom surface of the isolation substrate bridge 2501 that connects to the first lead frame portion 2510. In some implementations, the first semiconductor die 2502 may be disposed at a location on the bottom surface of the isolation substrate bridge 2501 having a certain distance from the end of the isolation substrate bridge 2501.

A second semiconductor die 2508 may be coupled to and disposed on a portion of the bottom surface of the isolation substrate bridge 2501 proximate to the second lead frame portion 2512. In particular, the second semiconductor die 2508 may be disposed on the same bottom surface of the isolation substrate bridge 2501 that connects to the second lead frame portion 2512. In some implementations, the second semiconductor die 2508 may be disposed at a location on the bottom surface of the isolation substrate bridge 2501 having a certain distance from the end of the isolation substrate bridge 2501. In some implementations, the first semiconductor die 2502 and the second semiconductor die 2508 may be disposed on and coupled to the same bottom surface of the isolation substrate bridge 2501 in a manner that the first semiconductor die 2502 is approximately aligned with but located at a distance from the first lead frame portion 2510 and the second semiconductor die 2508 is approximately aligned with but located at a distance from the second lead frame portion 2512.

Figure 25D:
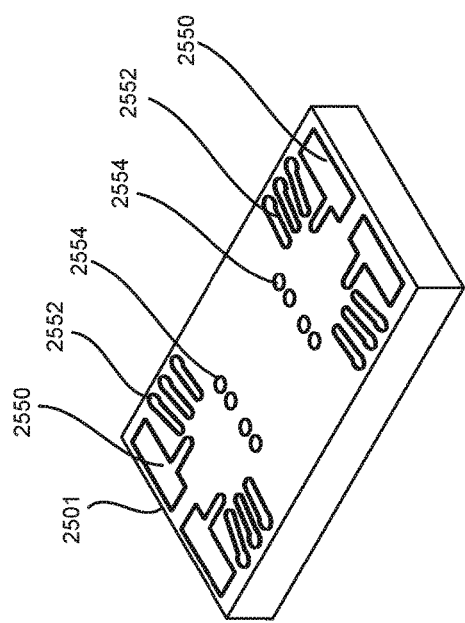
FIG. 25D illustrates a top view of the isolation substrate bridge according to an embodiment.

Still referring to FIG. 25A, the isolation substrate bridge 2501 may include a dielectric substrate (e.g., ceramic) such that a first capacitor network 2514-1 is constructed within one portion of the isolation substrate bridge 2501 and a second capacitor network 2514-2 is constructed within another portion of the isolation substrate bridge 2501. The constructions of the capacitor networks 2514 are further described with reference to FIGS. 25C-25E.

Further, one or more conductive transmission lines 2503 may be disposed on a top surface of the isolation substrate bridge 2501 that is opposite to the surface having the coupled semiconductor die 2502, 2508. In some implementations, the conductive transmission lines 2503 may be disposed on the top surface of the isolation substrate bridge 2501 at a location towards the middle of the substrate. In some implementations, the conductive transmission line 2503 may be disposed on the top surface of the isolation substrate bridge 2501 at a location at or between where the first semiconductor die 2502 and the second semiconductor die 2508 are disposed on the bottom surface. In some implementations, the conductive transmission lines 2503 may be copper. However, generally, the conductive transmission lines 2503 may be composed of any type of material that can transmit a signal, and may include a structure discussed with reference to any of the figures. The conductive transmission lines 2503 may be strips of metal extending from a location on the dielectric material to another location on the dielectric substrate. In other implementations, the isolation substrate bridge 2501 may include multiple conductive transmission lines 2503 on the top surface of the substrate such that the conductive transmission lines 2503 are configured as communication channels.

Referring to FIG. 25A, in some implementations, the first semiconductor die 2502 may be configured to communicate data with the second semiconductor die 2508 (or vice versa). In particular, the signal may modulate through the dielectric material (via D1), transfer across the one or more conductive transmission lines 2503, and modulate through the dielectric material (via D2). In this example, the distance through insulation (2T) may be defined based on the thickness (T) of the dielectric material. As explained above, if the thickness (T) of the dielectric material is 0.5 mm (e.g., the combined thickness (2T) would be 1 mm—due to the fact that the signal modulates through the dielectric material via D1 and modulates through the dielectric material via D2), the distance through insulation would be 1 mm. In some embodiments, the thickness (T) of the dielectric material may be greater than the distance between two possible conductive components that may provide the shortest transmission path included in the semiconductor apparatus. In this example, the combined thickness (2T) may be equal to greater than the distance (D3) between the first semiconductor die 2502 and the second semiconductor die 2508. Also, in some implementations, the distance through insulation (2T) may be greater or equal to 0.1 mm.

FIG. 25B illustrates a more detailed view of a portion 2517 (e.g., depicted by the rectangular box having dashed lines) of the semiconductor package 2500 of FIG. 25A. For example, FIG. 25B illustrates the connections between top and bottom surfaces of the isolation substrate bridge 2501, the second lead frame portion 2512, and a portion of the second semiconductor die 2508.

Referring to FIG. 25B, a conductive component 2536 may be disposed on the bottom surface of the isolation substrate bridge 2501 towards the end portion of the isolation substrate bridge 2501 that is proximate to the second lead frame portion 2512. The conductive component 2536 may be an elongated conductive plate or pad that extends in the direction A2, and is disposed on a portion of the bottom surface.

The second semiconductor die 2508 may be displaced from the dielectric substrate via a conductive component 2530. In some implementations, the conductive component 2530 may be a metal bump such as a copper bump. In some implementations, the conductive component 2530 may be an extension of the second semiconductor die 2508. The conductive component 2530 may be coupled to the conductive component 2536 via conductive material 2532 such as conductive solder. In other implementations, the conductive component 2530 is omitted, and the conductor of the second semiconductor die 2508 may be coupled to the conductive components 2536 via any type of conductive material such as conductive epoxy, or solder.

Furthermore, the semiconductor package 2500 may include bond wires 2540 for connecting the conductive components 2536 to the frame lead portions 2510, 2512. For example, one end of a bond wire 2540 may be connected to the first frame lead portion 2510 and the other end of the bond wire 2540 may be connected to the conductive component 2536 corresponding to the first semiconductor die

2502. Additionally, one end of a bond wire 2540 may be connected to the second lead frame portion 2512 and the other end of the bond wire 2540 may be connected to the conductive component 2536 corresponding to the second semiconductor die 2508.

Figure 25C:
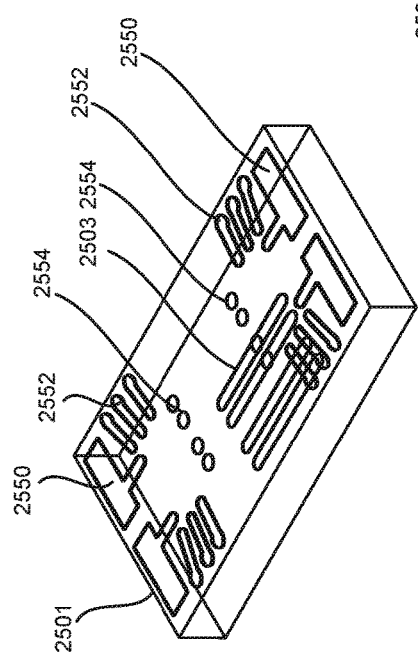
FIG. 25C illustrates a perspective of an isolation substrate bridge according to an embodiment.
Figure 25E:
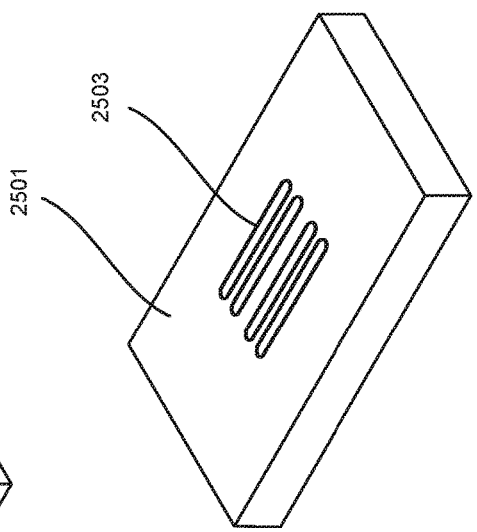
FIG. 25E illustrates a bottom view of the isolation substrate bridge according to an embodiment.

FIGS. 25C-25E illustrate various perspectives of an isolation substrate bridge 2501 that may be used to provide isolation between a pair of semiconductor die. The isolation substrate bridge 2501 may be various implementations of the isolation substrate bridge 2501 of FIGS. 25A-B that may include an inverted substrate with a flip-chip and wire bond configuration. FIG. 25C illustrates a perspective of the isolation substrate bridge 2501. FIG. 25D illustrates a top view of the isolation substrate bridge 2501. FIG. 25E illustrates a bottom view of the isolation substrate bridge 2501. It is noted that the isolation substrate bridge 2501 is inverted as compared with the views of FIGS. 25A-25B— e.g., the isolation substrate bridge 2501 of FIGS. 25C-25E show the substrate in the upright position during pre-assembly.

Referring to FIGS. 25C-25E, the isolation substrate bridge 2501 may include two frame conductors 2550 disposed on an end portion of the upper surface of the isolation substrate bridge 2501, and two frame conductors 2550 disposed on the other end portion of the upper surface of the isolation substrate bridge 2501. The frame conductors 2550 may be conductive plates (e.g., copper) that are used to connect to lead frame portions. Further, the isolation substrate bridge 2501 may include a plurality of wire bond conductors 2552 disposed on the upper surface. The wire bond conductors 2552 may be used to connect the wire bonds 2540 of FIGS. 25A-25B. Also, the isolation substrate bridge 2501 may include two sets of die conductors 2554 on the upper surface for connection to a first semiconductor die, and two sets of die conductors 2554 on the upper surface for connection to a second semiconductor die. In some implementations, the die conductors 2554 may be considered capacitor pads, capacitor plates, and/or capacitor conductors. In some implementations, the die conductors 2554 may have a circular-based structure. Further, the isolation substrate bridge 2501 may include two sets of two conductive transmission lines 2503 on the bottom surface. In some implementations, the two sets of two conductive transmission lines 2503 formed on the isolation substrate bridge 2501 may function as differential transmission lines that form dual bi-directional channels. In some implementations, the capacitor networks may be constructed from the die conductors 2554, the conductive transmission lines 2503, and the dielectric material disposed between the die conductors 2554 and the conductive transmission lines 2503.

FIG. 26 illustrates a process flow 2600 for constructing the semiconductor packages of FIGS. 25A-25E according to an embodiment. Although FIG. 26 is illustrated as a sequential, ordered listing of operations, it will be appreciated that some or all of the operations may occur in a different order, or in parallel, or iteratively, or may overlap in time.

In a pre-processing assembly, solder (or another conductive material) may be disposed (e.g., dispensed) on the isolation substrate bridge (2602), and the first and second semiconductor die may be attached to the isolation substrate bridge (2604). Solder can be heated to reflow (2606) and flux clean (2608) may be performed. Substrate singulation (2610) may be performed by cutting the substrate into portions having a first semiconductor die and a second semiconductor die.

In a package assembly process flow, solder or adhesive may be disposed (e.g., dispensed) on the lead frame portions (2612), and the isolation substrate bridge having the pair of semiconductor die may be attached (2614). Solder reflow/adhesive cure (2616), flux clean (if solder is used) (2618), wire bonding (2620), and plasma clean (2622) may be performed. Then, the semiconductor package may be coated in (or encapsulated via) a molding and PMC (2624). Postplate and SRB (2626), trim and form (2628), electrical testing (2630), and finishing (2632) including marking and TNR may be performed.

In some implementations, the semiconductor packages of FIGS. 24-26 may provide several benefits such as transmission lines are isolated on other side of the substrate and from other metal structures (e.g., provides relatively good isolation protection), structural center of gravity around the middle of the package, simple substrate layout (e.g., may decrease cost of substrate or ceramic substrate), (copper) bonding on (ceramic) metal pads and leads (e.g., reduced (or no) risk of cratering), universal ceramic design regardless of die size, one leadframe design for various die sizes, and/or minimal cantilever issues of the leadposts, among other benefits.

Figure 27:
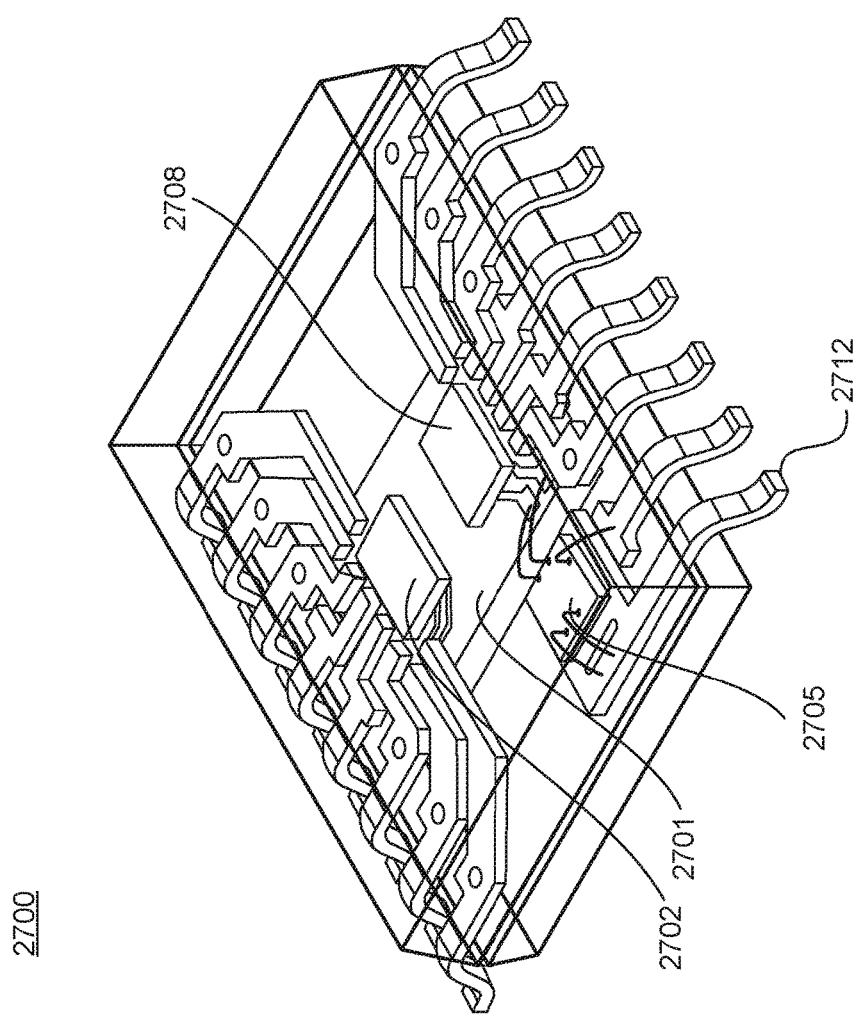
FIG. 27 illustrates an assembly layout of a semiconductor package having a three-die configuration according to an embodiment.
Figure 28:
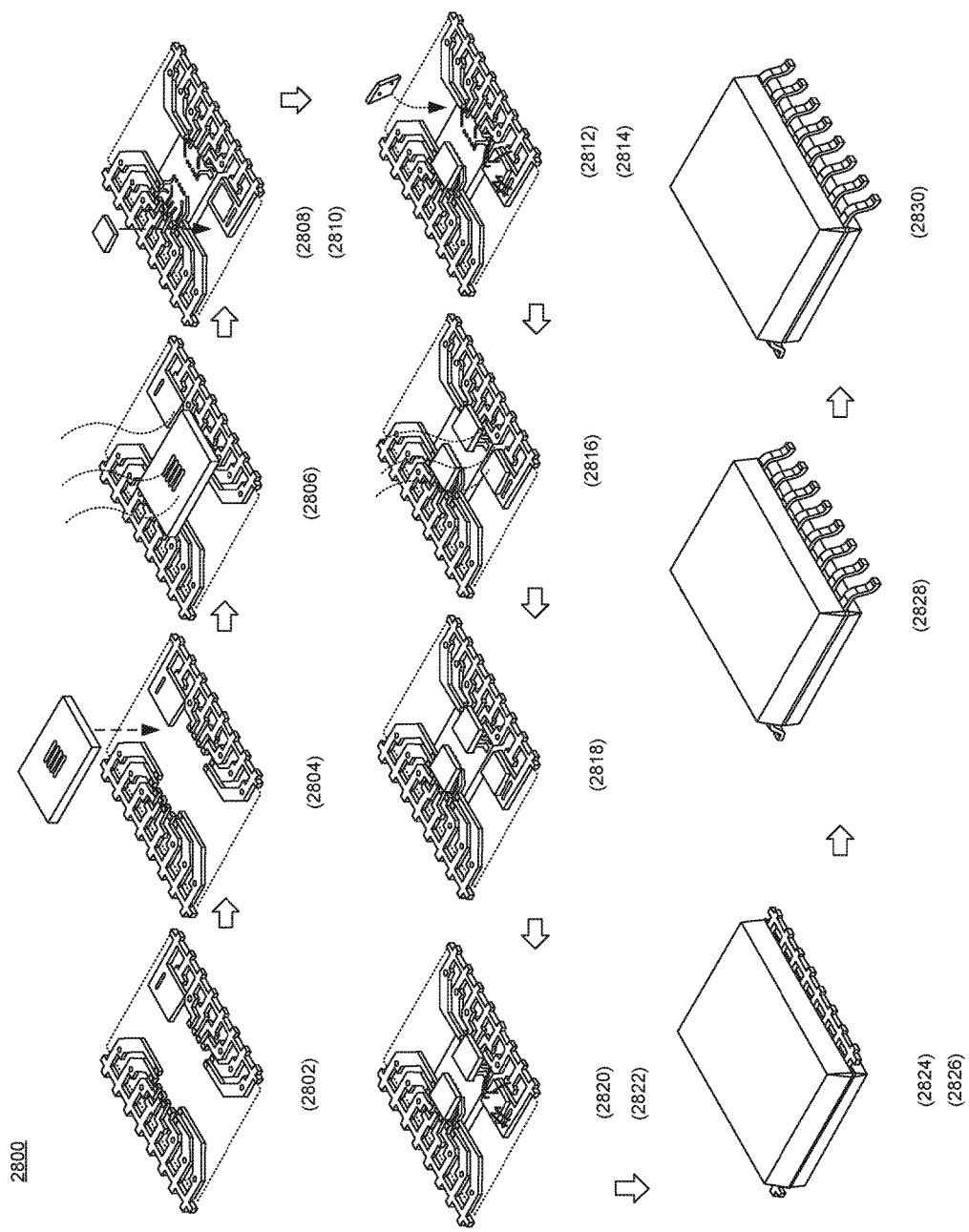
FIG. 28 illustrates a process flow for constructing the semiconductor package of FIG. 27 according an embodiment.

FIG. 27 illustrates an assembly layout of a semiconductor package 2700 having a three-die configuration according to an embodiment. In some implementations, the semiconductor package 2700 may be the same as the semiconductor package 2400 of FIG. 24 except an additional semiconductor die 2705 is provided in the semiconductor package 2700 as further described above. The semiconductor package 2700 may include an isolation substrate bridge 2701 with a first semiconductor die 2702 and a second semiconductor die 2708 within a flip-chip and wire-bond assembly such as the arrangement described with reference to FIG. 24. The additional semiconductor 2705 may be any of the previously described semiconductor die. In one implementation, the second semiconductor die 2708 may operate as a specific-device function integrated circuit (IC), and the additional semiconductor 2705 may operate as a gate driver IC that is separately disposed on another portion of the second lead frame portion 2712. In this example, the second semiconductor die 2708 may perform at a relatively high speed with relatively low voltage isolated bit detection while the additional semiconductor die 2705, disposed location on the second lead frame portion 2712, may be operating at a higher voltage gate drive IC. FIG. 28 illustrates a process flow 2800 for constructing the semiconductor package 2700 of FIG. 27 according the embodiments. Although FIG. 28 is illustrated as a sequential, ordered listing of operations, it will be appreciated that some or all of the operations may occur in a different order, or in parallel, or iteratively, or may overlap in time.

Solder may be printed (2802), and an isolation substrate bridge may be attached to the solder print (2804). Solder reflow may be performed (2806). Then, solder may be dispensed to eventually attach the semiconductor die (2808), and the additional semiconductor die may be attached on a lead frame portion (2810). Fluxing (or solder) may be dispensed (2812), and the semiconductor die (e.g., first, second semiconductor die) may be attached (2814). Then, solder reflow (2816) and flux clean (2818) may be performed, and wire bond (2820) and plasma clean (2822) may be performed. Then, the semiconductor package may be molded and post mold baked (PMB) (2824), and postplate and SRB may be performed (2826). Then, trim and form (2828) and testing and finishing (2830) may be performed.

Figure 29:
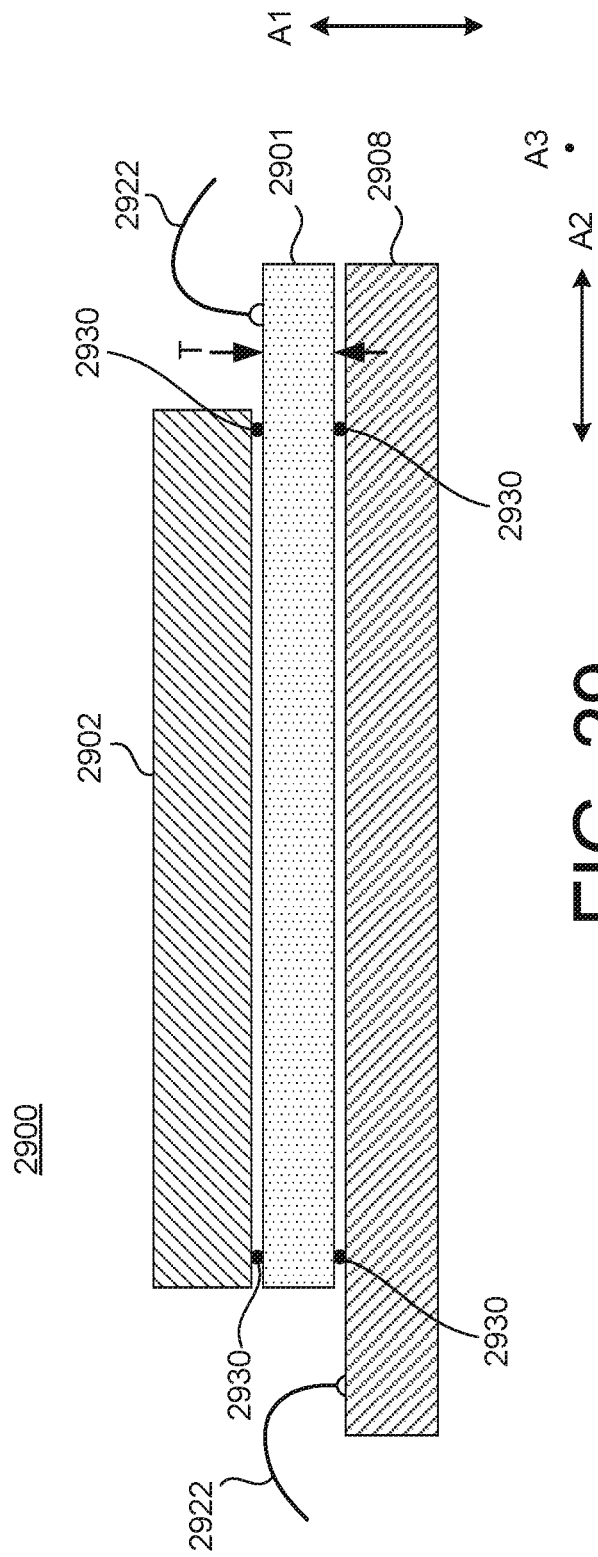
FIG. 29 illustrates a semiconductor apparatus having an isolation substrate bridge in a stacked semiconductor die configuration according to an embodiment.

FIG. 29 illustrates a semiconductor apparatus 2900 having an isolation substrate bridge 2901 in a stacked semiconductor die configuration according to an embodiment. In some implementations, a first semiconductor die 2902, an isolation substrate bridge 2901, and a second semiconductor 2908 may be stacked in a manner as shown in FIG. 29. For example, the isolation substrate bridge 2901 may be disposed between the first semiconductor die 2902 and the second semiconductor die 2908. In particular, the first semiconductor die 2902 may be disposed on top of the isolation substrate bridge 2901, and the second semiconductor die 2908 may be disposed below the isolation substrate bridge 2901 such that the first semiconductor die 2902, the second semiconductor die 208, and the isolation substrate bridge 2901 are within a stacked configuration.

In some implementations, the first semiconductor die 2902 may be attached to the top surface of the isolation substrate bridge 2901 using attachment component 2930. The attachment component 2930 may be any type of conductive material that can be used for attaching semiconductor components. In some implementations, the attachment component 2930 may be conductive bumps (e.g., metal bumps, solder, etc.). For example, a conductive bump may be disposed towards each end portion of the bottom surface of the first semiconductor die 2902 such that the first semiconductor die 2902 is slightly spaced apart from the isolation substrate bridge 2901 but coupled to the isolation substrate bridge 2901 via the conductive bumps.

Also, the second semiconductor die 2908 may be attached to the bottom surface of the isolation substrate bridge 2901 using the attachment component 2930. For example, conductive bumps may be disposed on the top surface of the second semiconductor die 2908 such that the second semiconductor die 2908 is slightly spaced apart from the isolation substrate bridge 2901 but coupled to the isolation substrate bridge 2901 via the conductive bumps. In some implementations, the conductive bumps that attach the second semiconductor die 2908 to the isolation substrate bridge 2901 may substantially align with the conductive bumps that attach the first semiconductor die 2902 to the isolation substrate bridge 2901 in the A1 direction. In other implementations, the conductive bumps that attach the second semiconductor die 2908 to the isolation substrate bridge 2901 may be offset from the conductive bumps associated with the first semiconductor die 2902.

In some implementations, one or more portions of the second semiconductor die 2908 may be disposed on the lead frame portions or one or more portions of the first semiconductor die 2902 may be disposed on the lead frame portions in a manner shown with respect to any of the relevant previous figures. Also, a bond wire 2922 may couple the isolation substrate bridge 2922 to any of the lead frame portions, and another bond wire 2922 may couple the second semiconductor die 2908 to any of the lead frame portions in a manner shown with respect to the relevant previous figures.

In some implementations, the first semiconductor die 2902, the second semiconductor die 2908, and the isolation substrate bridge 2901 may be any of the semiconductor die and isolation substrate bridges discussed with reference to any of the other figures. In some implementations, the isolation substrate bridge 2901 may include a glass substrate having conductive components (e.g., metallization) on each side of the glass substrate. In this configuration, the first semiconductor die 2902 may be capacitively coupled to the second semiconductor die 2908 via the glass capacitance of the isolation substrate bridge 2901.

In some implementations, the first semiconductor die 2902 may be configured to communicate data with the second semiconductor die 2908 (or vice versa). In this example, the distance through insulation may be defined based on the thickness (T) of the dielectric material. For example, the thickness (T) of the dielectric substrate is ½ the distance through insulation because there are two capacitors (or capacitor networks) in this implementation. Each capacitor is in series with the other and each has a thickness T as shown in FIG. 29. In some implementations, the capacitor conductors (e.g., capacitor plates) may be located proximate to the conductor bumps. In some implementations, the distance through insulation (2T) may be greater or equal to 0.1 mm.

Figure 30:
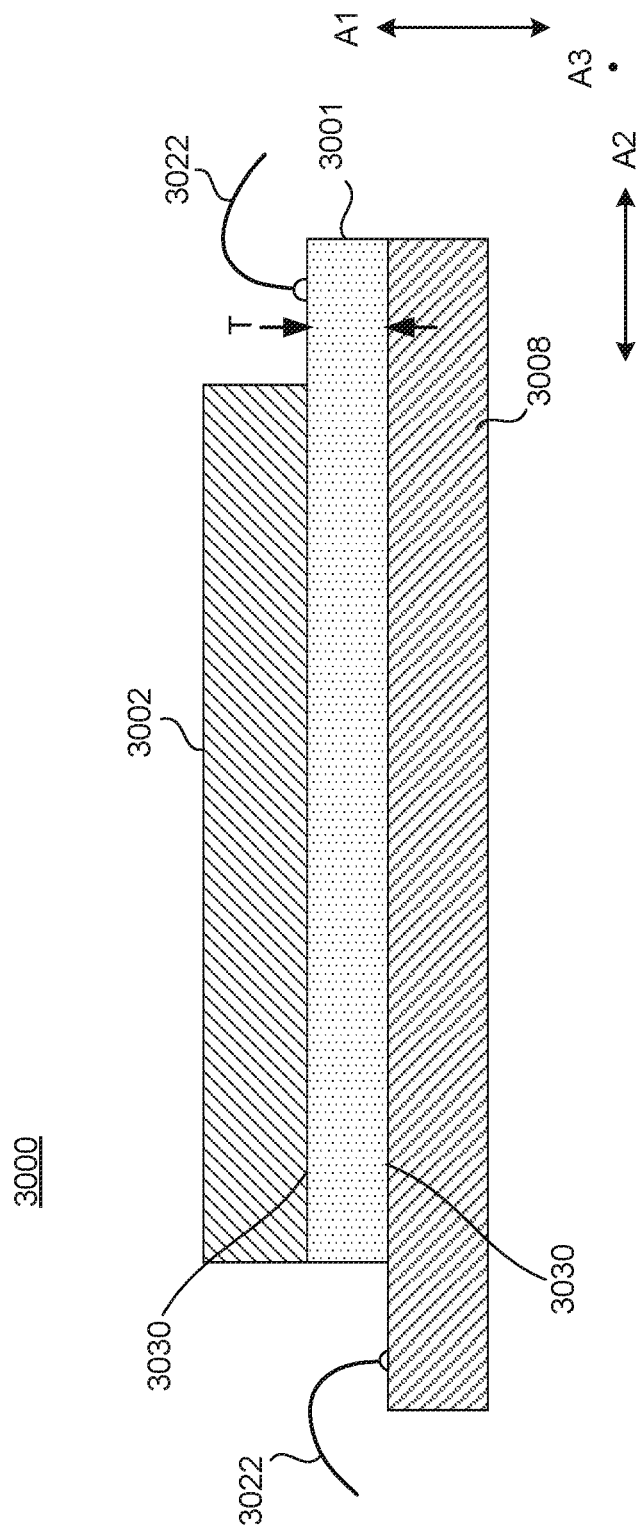
FIG. 30 illustrates a semiconductor apparatus having an isolation substrate bridge in a stacked semiconductor die configuration according to another embodiment.

FIG. 30 illustrates a semiconductor apparatus 3000 having an isolation substrate bridge 3001 in a stacked semiconductor die configuration according to another embodiment. In some implementations, a first semiconductor die 3002, an isolation substrate bridge 3001, and a second semiconductor 3008 may be stacked in a manner as shown in FIG. 30. The semiconductor apparatus 3000 of FIG. 30 is the same as the semiconductor apparatus 2900 of FIG. 29 except that the first semiconductor die 3002 and the second semiconductor die 3008 are bonded to the surfaces of the isolation substrate bridge 3001 via attachment material 3030. The attachment material 3030 may be any type of bonding material to attach the semiconductor die 3002, 3008 to the isolation substrate bridge 3001. Also, the semiconductor apparatus 3000 includes bond wires 3022 that are configured to the same manner as described with reference to FIG. 29, and the distance through insulation may be defined based on the thickness (2T) of the dielectric material. For example, similar to FIG. 29, For example, the thickness (T) of the dielectric substrate is ½ the distance through insulation because there are two capacitors (or capacitor networks) in this implementation. In some implementations, the distance through insulation (2T) may be greater or equal to 0.1 mm.

Figure 31:
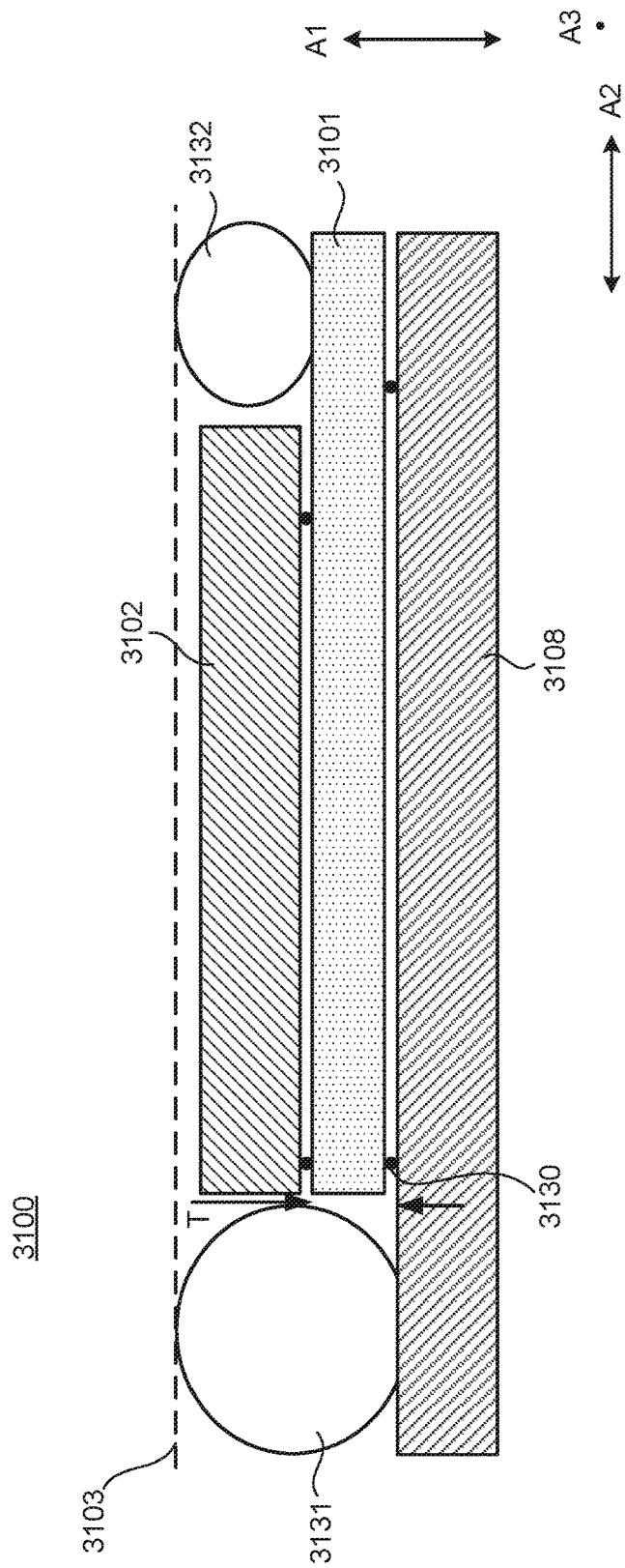
FIG. 31 illustrates a semiconductor apparatus having an isolation substrate bridge in a stacked semiconductor die configuration according to another embodiment.

FIG. 31 illustrates a semiconductor apparatus 3100 having an isolation substrate bridge 3101 in a stacked semiconductor die configuration according to another embodiment. In some implementations, a first semiconductor die 3102, an isolation substrate bridge 3101, and a second semiconductor 3108 may be stacked in a manner as shown in FIG. 31. The semiconductor apparatus 3100 of FIG. 30 is the same as the semiconductor apparatus 2900 of FIG. 29 except that conductive bumps 3131, 3132 are provided in the semiconductor apparatus 3100 (instead of bond wires). For example, a conductive bump 3131 may be disposed on a top surface of an end portion of the second semiconductor die 3108. The conductive bump 3131 may have a size that extends to line 3103. The line 3103 may be disposed in the A2 direction that is slightly above the top surface of the first semiconductor die 3102. Also, a conductive bump 3132 may be disposed on the top surface of the isolation substrate bridge 3101. The conductive bump 3132 may have a size that extends to the line 3103. In some implementations, the conductive bump 3131 may be larger than the conductive bump 3132. Also, similar to the semiconductor apparatus 2900, the distance through insulation may be defined based on the thickness (T) of the dielectric material of the isolation substrate bridge 3101. In some implementations, the distance through insulation (T) may be greater or equal to 0.1 mm.

Figure 32:
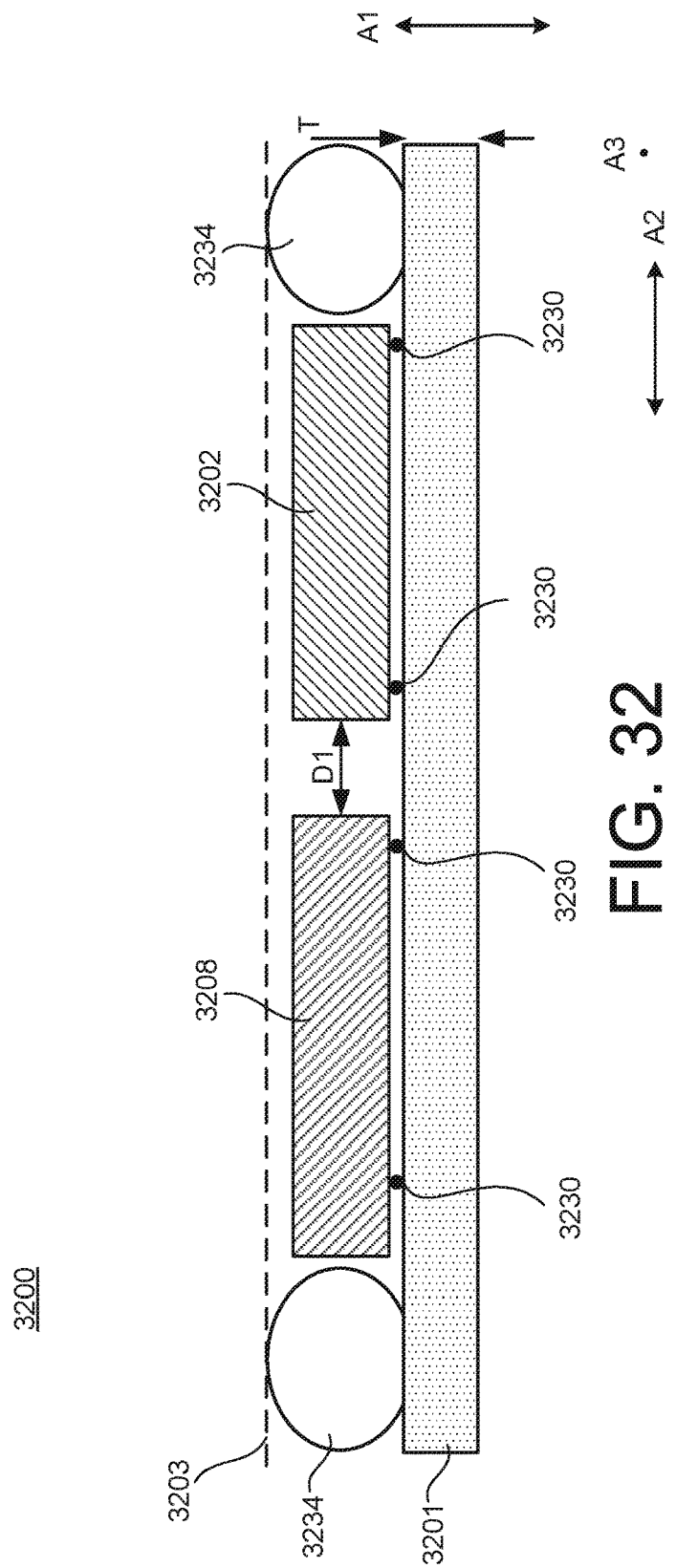
FIG. 32 illustrates a semiconductor apparatus having semiconductor die that are disposed on an isolation substrate bridge according to an embodiment.

FIG. 32 illustrates a semiconductor apparatus 3200 having semiconductor die 3208, 3202 that are disposed on an isolation substrate bridge 3201 according to an embodiment. For example, a first semiconductor die 3208 may be disposed on a top surface of the isolation substrate bridge 3201, and a second semiconductor die 3208 may be disposed on the top surface of the isolation substrate bridge 3201. The first semiconductor die 3202 may be spaced apart from the second semiconductor die 3208 by a distance D1. Further, conductive bumps 3234 may be disposed on the top surface of the isolation substrate bridge, and the conductive bumps 3234 may have sizes sufficient to extend to the line 3203.

In some implementations, the semiconductor die 3202, 3208 may be attached to the top surface of the isolation substrate bridge 2901 using attachment component 3230. The attachment component 3230 may be any type of conductive material that can be used for attaching semiconductor components. In some implementations, the attachment component 3230 may be conductive bumps (e.g., metal bumps, solder, etc.). For example, a conductive bump may be disposed towards each end portion of the bottom surface of the semiconductor die 3202, 3208 such that the semiconductor die 3202, 3208 are slightly spaced apart from the isolation substrate bridge 3201 but coupled to the isolation substrate bridge 3201 via the conductive bumps.

In some implementations, the first semiconductor die 3202 may be configured to communicate data with the second semiconductor die 3208 (or vice versa). In particular, the signal may modulate through the dielectric material, transfer across the transmission network of the isolation substrate bridge 3201, and modulate through the dielectric material. In this example, the distance through insulation (2T) may be defined based on the thickness (T) of the dielectric material. As explained above, if the thickness (T) of the dielectric material is 0.5 mm (e.g., the combined thickness (2T) would be 1 mm—due to the fact that the signal modulates through the dielectric material on one side and modulates through the dielectric material on the other side. In some embodiments, the thickness (T) of the dielectric material may be greater than the distance between two possible conductive components that may provide the shortest transmission path included in the semiconductor apparatus. In this example, the combined thickness (2T) may be equal to greater than the distance (D1) between the first semiconductor die 3202 and the second semiconductor die 3208. Also, in some implementations, the distance through insulation (2T) may be greater or equal to 0.1 mm.

It is noted that any of the configurations in any of the figures (e.g., FIGS. 7-12, 14, 17-20 and 22-24) can be combined in a semiconductor package. In one example, the semiconductor package can include the isolation substrate bridge of FIGS. 25A and 25 for a pair of semiconductor die, and the isolation substrate bridge of FIGS. 20A and B for another pair of semiconductor die. In another example, the semiconductor package can include the isolation substrate bridge of FIGS. 14A and 14B for a pair of semiconductor, and the isolation substrate bridge of FIGS. 11A and 11B. However, the embodiments encompass the combination(s) of any of the configurations in any of the figures.

Figure 33A:
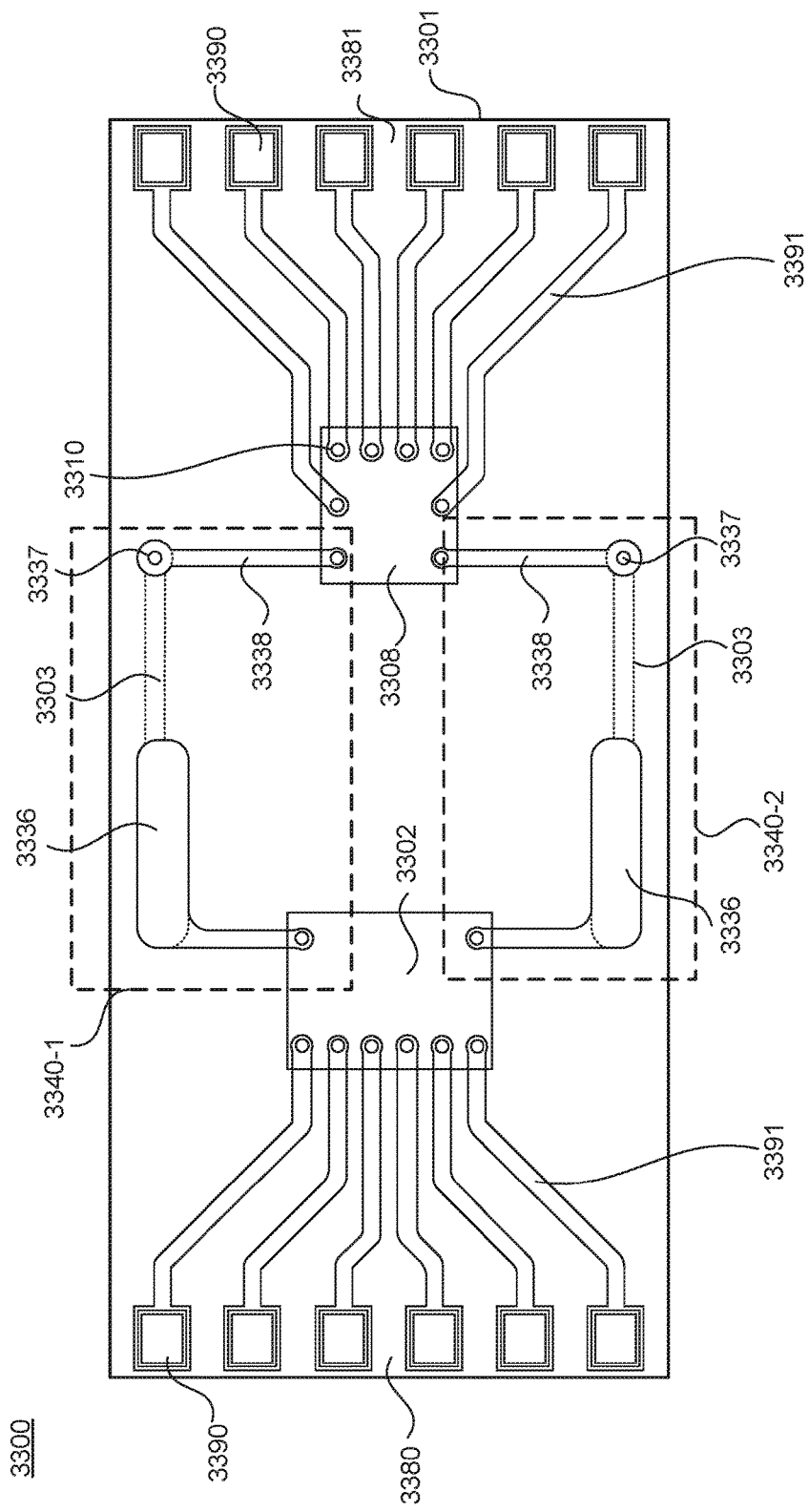
FIG. 33A illustrates a plan view of a semiconductor package having first and second semiconductor die coupled to a leadless substrate in a flip-chip configuration according to an embodiment.
Figure 33B:
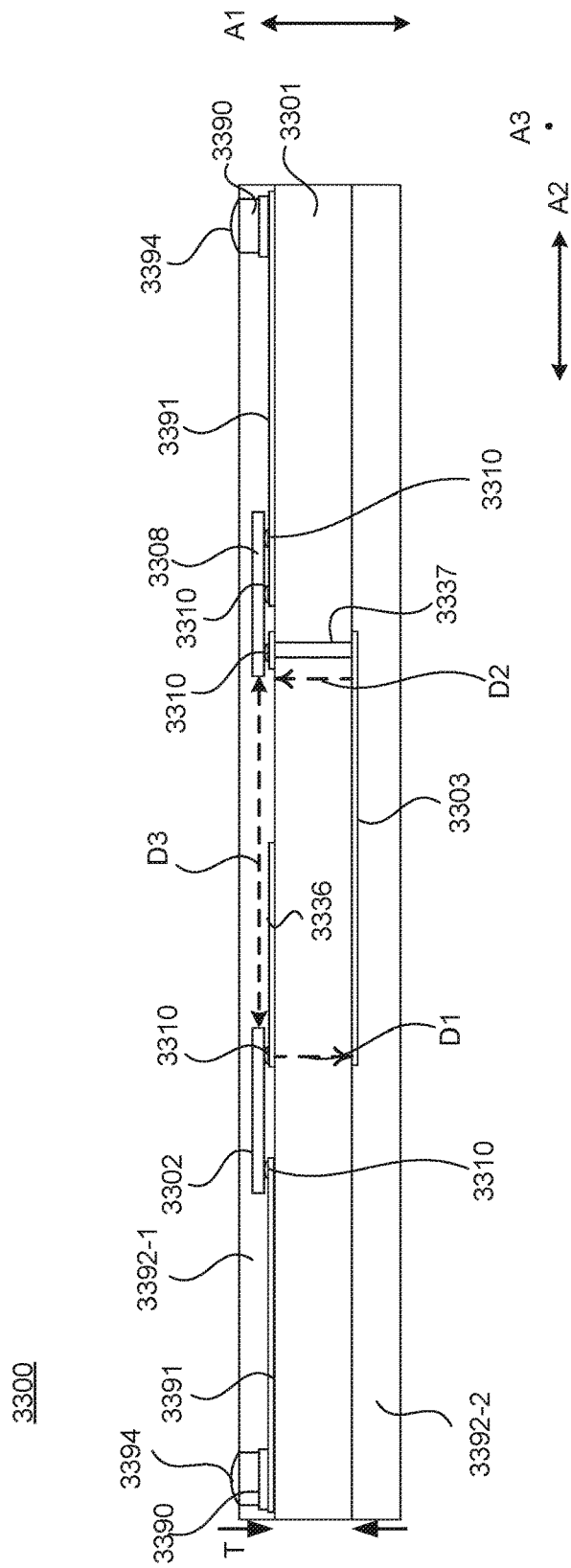
FIG. 33B illustrates a side view of the semiconductor package according to an embodiment.
Figure 33C:
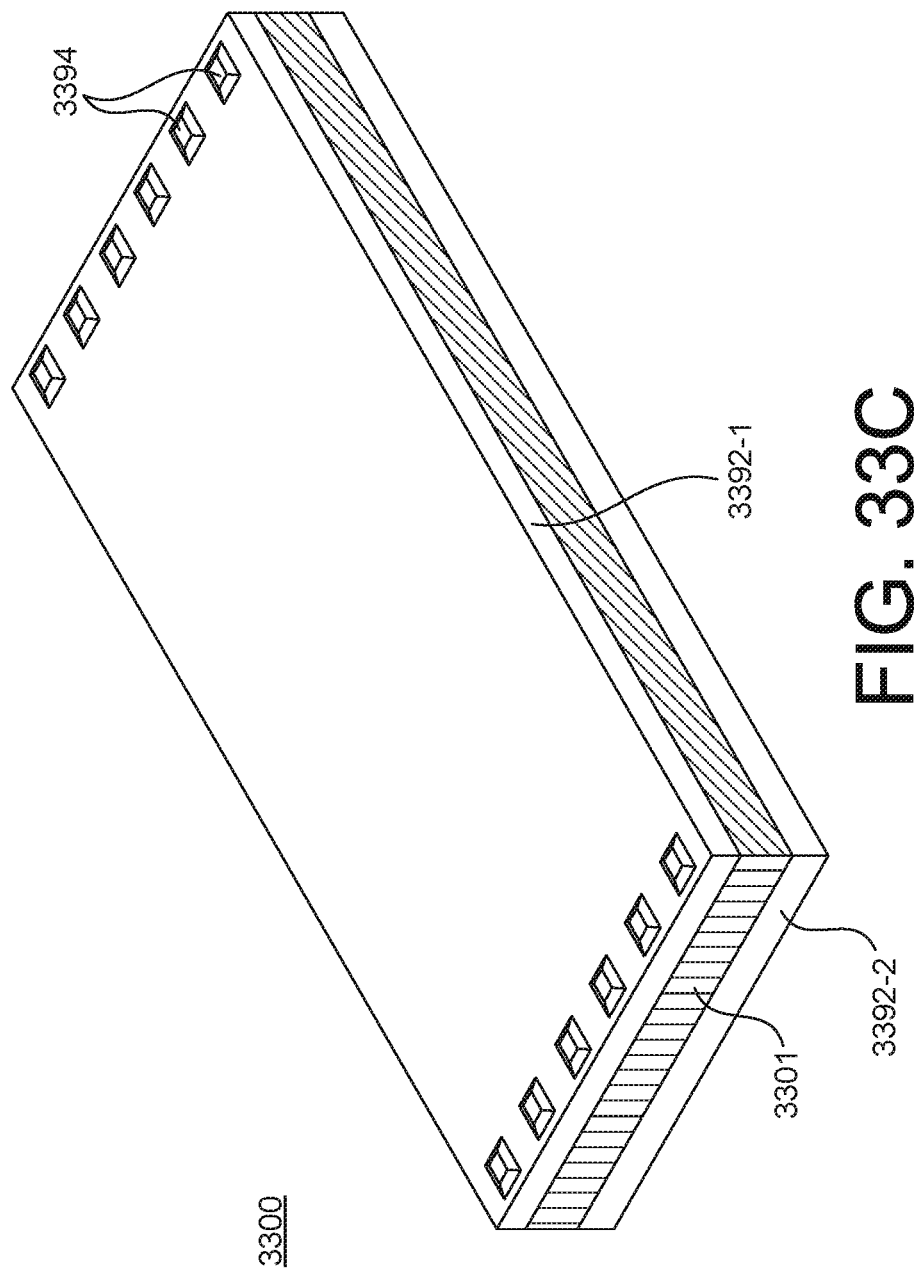
FIG. 33C illustrates a finished view of the semiconductor package according to an embodiment.
Figure 33D:
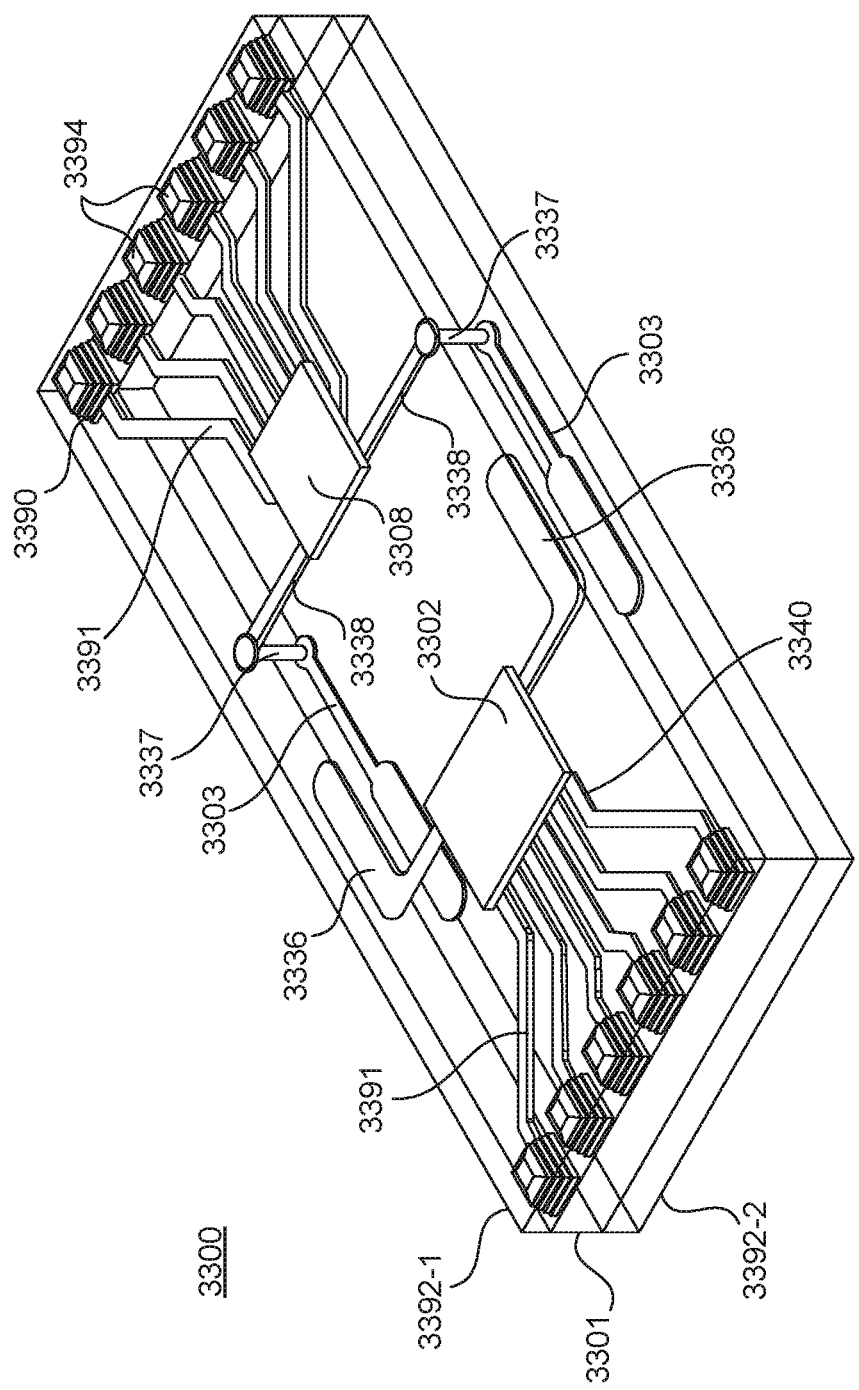
FIG. 33D illustrates an interior view of the semiconductor package according to an embodiment.
Figure 33E:
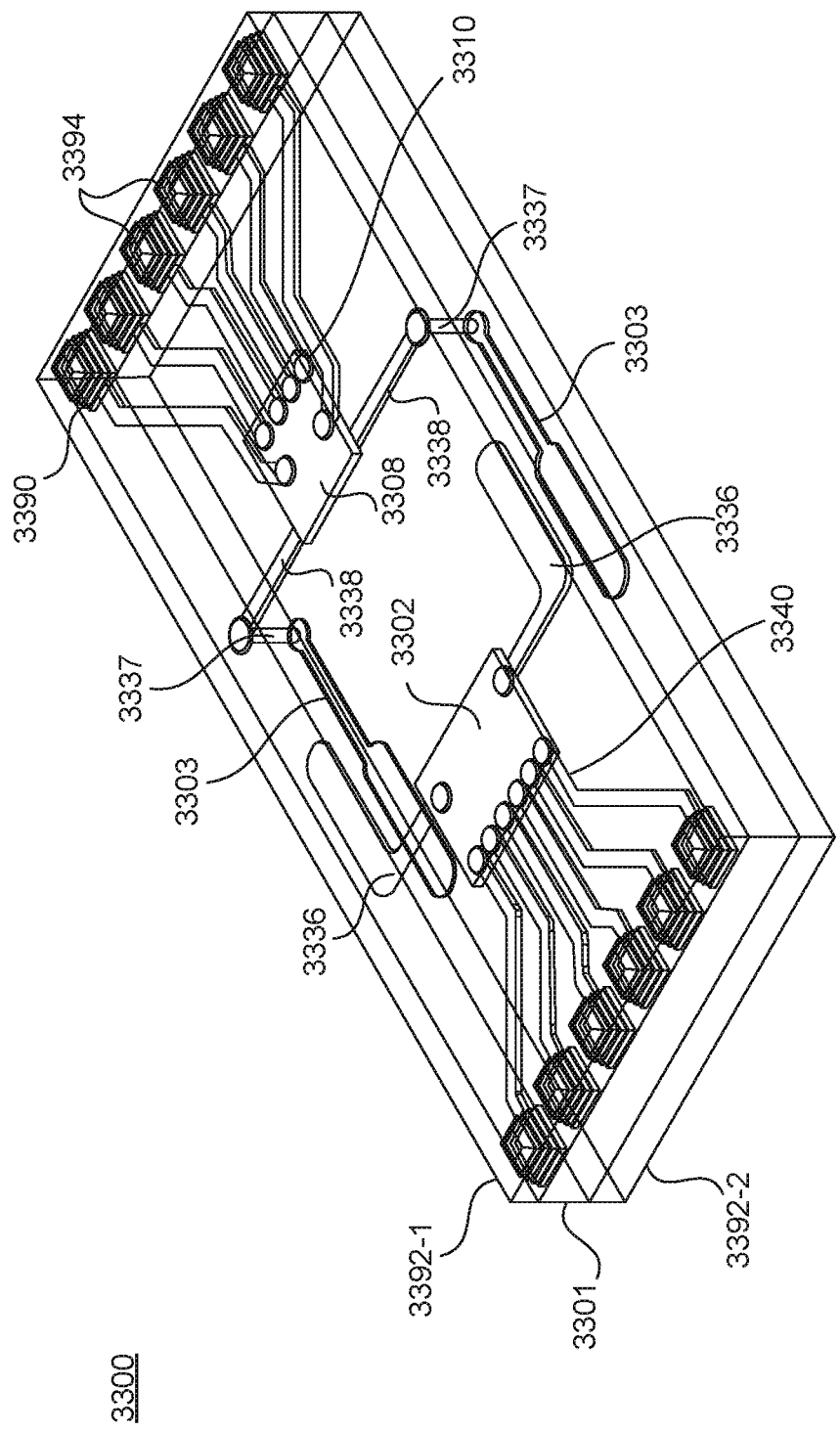
FIG. 33E illustrates another interior view of the semiconductor package according to an embodiment.

FIGS. 33A-33E illustrate various views of a semiconductor package 3300 having first and second semiconductor die 3302, 3308 coupled to a leadless substrate 3301 in a flip-chip configuration. FIG. 33A illustrates a plan view of the semiconductor package 3300. FIG. 33B illustrates a side view of the semiconductor package 3300. Also, FIG. 33B illustrates a "dead bug" orientation. The contacts for soldering the PCB are on the top surface in this orientation. FIG. 33C illustrates a finished view of the semiconductor package 3300. FIG. 33D illustrates an interior view of the semiconductor package 3300. FIG. 33E illustrates another interior view of the semiconductor package 3300. In the flip-chip configuration, the first and second semiconductor die 3302, 3308 are flipped such that their conductors (e.g., conductive pads) are positioned downward (along vertical direction A1). The semiconductor package 3300 may be a leadless package configuration.

As shown in FIGS. 33B-33E, the semiconductor package 3300 includes a substrate 3301. The substrate 3301 may be any of the isolation substrate bridges discussed with reference to the previous figures. In some examples, the substrate 3301 is a dielectric substrate having a thickness T. The semiconductor package 3300 may include a first molding compound 3392-1 disposed on the top surface of the isolation substrate 3301 and a second molding compound 3392-2 disposed on the bottom surface of the isolation substrate 3301. The first and second molding compounds 3391-1, 3392-2 may be an epoxy molding compound (EMC).

The semiconductor package 3300 may include a plurality of stacks 3390 disposed on a first end portion 3380 and a second end portion 3381 of the semiconductor package 3300. The stacks 3390 may be ceramic copper redistribution (RDL) stacks. Each stack 3390 is connected to a different terminal of the first and second semiconductor die 3302, 3308 via a trace 3391. The traces 3391 may be metal-based conductors that provide connectivity between the stacks 3390 and the first and second semiconductor die 3302, 3308. The traces 3391 may be arranged on the top surface of the substrate 3301, where the stacks 3390 are disposed on end portions of the traces 3391, and the first and second semiconductor die 3302, 3308 are disposed on the other end portions of the traces 3391. In some examples, the first and second semiconductor die 3302, 3308 are coupled to the traces 3391 via attachment components 3310. The attachment components 3310 may be an adhesive, solder, or a pillar and solder combination (e.g., such that the first and second semiconductor die 3302, 3308 are slightly raised from the top surface of the substrate 3301). Each stack 3390 includes a solder terminal 3394 that at least partially protrudes above the outer surface of the first molding compound 3392-1.

The first semiconductor die 3302 may be isolated from the second semiconductor die 3308 to prevent or substantially prevent current flow (e.g., no direct conduction path) between the first semiconductor die 3302 and the second semiconductor die 3308, but allows the exchange of information via a first capacitor network 3340-1 and a second capacitor network 3340-2. Information may be transferred by similar network(s) described in previous figures. The first capacitor network 3340-1 may include a capacitor formed by a capacitor plate 3336, a transmission line 3303, and the substrate 3301 disposed between the capacitor plate 3336 and the transmission line 3303. Because the second capacitor network 3340-2 includes the same components, the details the second capacitor network 3340-2 are omitted for the sake of brevity. Also, in some examples, the second capacitor network 3340-2 is optional and used in the case of differential mode communication. Additional capacitor networks can be added for multi-channel product offerings.

Referring to FIG. 33B, the first semiconductor die 3302 and the second semiconductor die 3308 may be disposed on the top surface of the substrate 3301, where the first semiconductor die 3302 is separated from the second semiconductor die 3308 by a distance D3. The capacitor plate 3336 is disposed on the substrate 3301 such that the capacitor plate 3336 is disposed between the first semiconductor die 3302 and the top surface of the substrate 3301. The capacitor plate 3336 may be a conductive metal-based material. The capacitor plate 3336 may extend towards the second semiconductor die 3308. In some examples, the capacitor plate 3336 extends in two or more directions and has two or more widths. The first semiconductor die 3302 is coupled to the capacitor plate 3336 via the attachment component 3310.

The transmission line 3303 may be coupled to the bottom surface of the substrate 3301 such that the transmission line 3303 and the capacitor plate 3336 are separated by the thickness T of the substrate 3301. The transmission line 3303 may be a conductive metal-based material. The transmission line 3303 may be an elongated member having one or more enlarged sections. In some examples, the transmission line 3303 may be considered a capacitor plate. The second semiconductor die 3308 may be coupled to an embedded conductor 3337 and a conductor extension 3338. The conductor extension 3338 is coupled to the second semiconductor die 3308 via the attachment component 3310. The embedded conductor 3337 may extend through the substrate 3301 in the direction A2 between the second semiconductor die 3308 and the transmission line 3303. In some examples, the embedded conductor 3337 is a metal-filled (e.g., copper-filled) via.

Through the first capacitor network 3340-1, the first semiconductor die 3302 may be configured to communicate data with the second semiconductor die 3308 (or vice versa). For example, the signal may transmit across the capacitor plate 3336, modulate through thickness T of the substrate 3301 (in the direction D1), transfer across the transmission line 3303, transfer across the embedded conductor 3337 (in the direction D2), and then transfer across the conductor extension 3338 to the second semiconductor die 3308. In this example, the isolation thickness is the thickness T of the substrate 3301. However, according to another embodiment, the embedded conductor 3337 and/or conductor extension 3338 may be replaced with a capacitor plate 3436, as shown in FIG. 34, thereby doubling the isolation thickness (2T).

Figure 34:
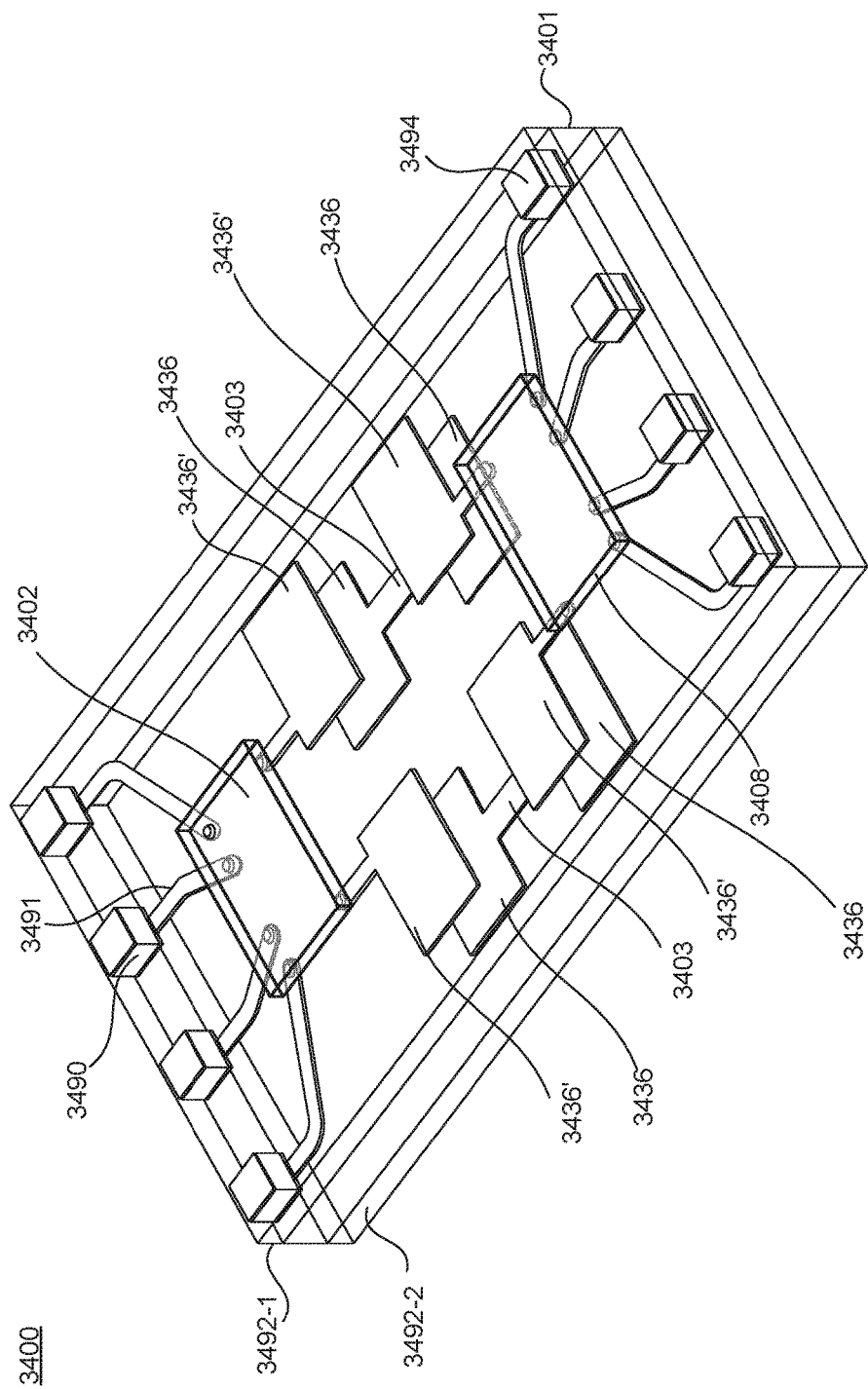
FIG. 34 illustrates a semiconductor package according to another embodiment.
Figure 35:
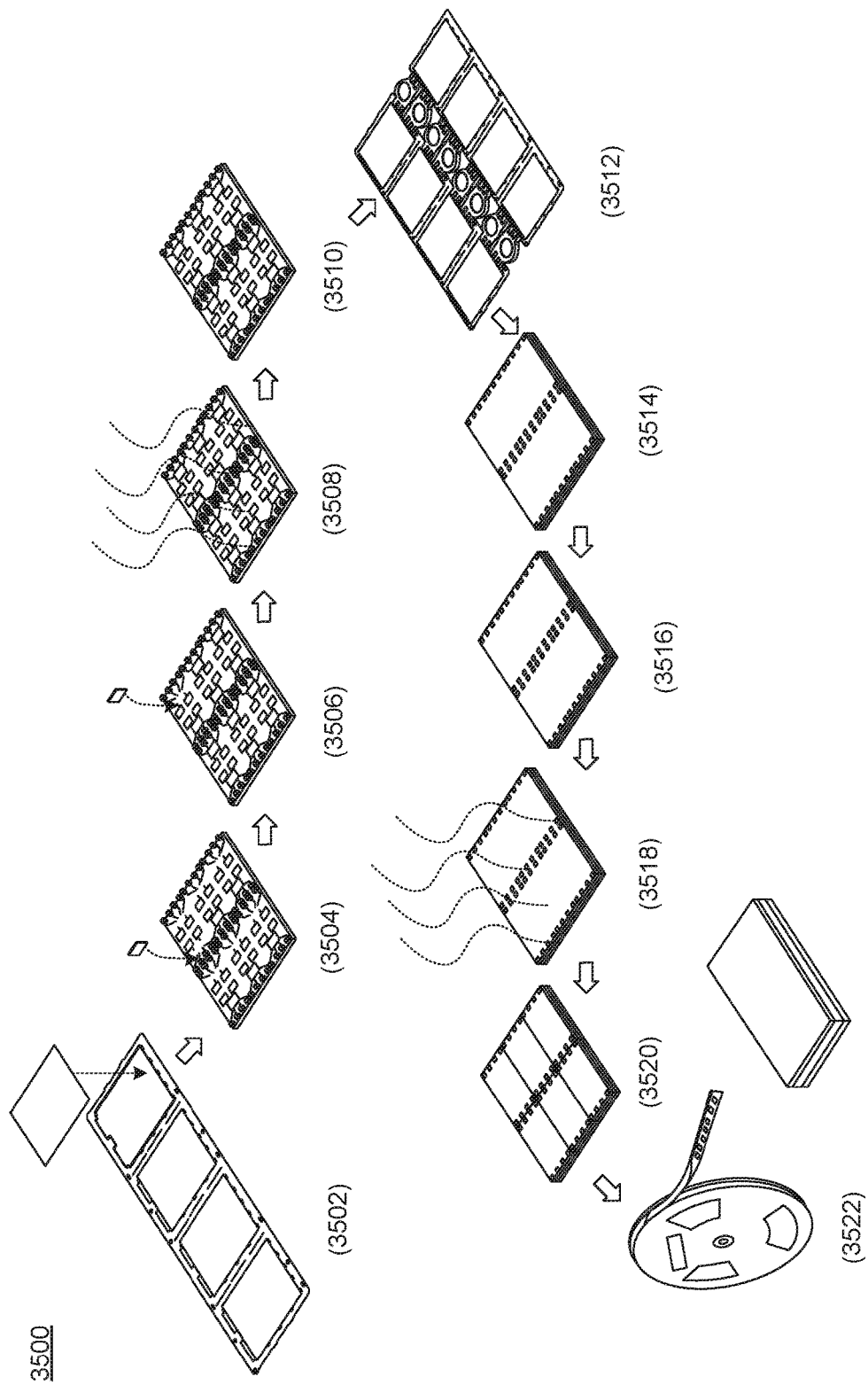
FIG. 35 illustrates a process flow for constructing the semiconductor package of FIG. 33 or 34.

FIG. 34 illustrates a semiconductor package 3400 having first and second semiconductor die 3402, 3408 coupled to a substrate 3401 that uses capacitor plates 3436 for the second semiconductor die 3408. The semiconductor package 3400 may be similar to the semiconductor package 3300 of FIG. 33 except that the embedded conductor 3337 of FIG. 33 is replaced with a capacitor plate 3436. The semiconductor package 3400 includes the substrate 3401 disposed between a first molding compound 3492-1 and a second molding compound 3492-2. The first and second semiconductor die 3402, 3408 are connected to stacks 3490 via traces 3491, and the stacks 3490 have solder (mound) terminals 3494. The first semiconductor die 3402 is isolated but capacitively coupled to the second semiconductor die 3408 via two capacitor networks. With respect to one capacitor network, the first semiconductor die 3402 may transmit a signal across the substrate 3401 (e.g., from the first semiconductor's capacitor plate 3436 to transmission line 3403), across the transmission line 3403, and then back across the substrate 3401 (e.g., from the transmission line 3403 to the second semiconductor's capacitor plate 3436). In some examples, with respect to one capacitor network, one of the capacitor plates 3436 may be smaller than the other capacitor plate 3436. For instance, in the case of misalignment, as long as the smaller capacitor plate 3436 is in parallel with the larger capacitor plate 3436, the capacitance remains the same although the capacitor plates 3436 are not entirely aligned. As such, the smaller capacitor plate 3436 can move around in the area of the larger capacitor plate 3436, and the capacitance would remain the same or substantially the same. FIG. 35 illustrates a process flow 3500 for constructing the semiconductor package 3300 of FIG. 33 or the semiconductor package 3400 of FIG. 34 according the embodiments. Although FIG. 35 is illustrated as a sequential, ordered listing of operations, it will be appreciated that some or all of the operations may occur in a different order, or in parallel, or iteratively, or may overlap in time. Pre-assembly may be performed such as solder print, ceramic panel attach, and solder reflow (3502). Flux may be dispensed with the first flip chip (3504), and flux may be dispensed with the second flip chip (3508). FC solder reflow (3508) and flow and plasma clean (3510) may be performed. Frame-assisted ceramic panel mold and PMC (3515), bottom package grind (3514), PB free solder print (3516), terminal solder reflow (3518), package saw singulation (3520), and testing, marking, and TNR (3522) may be performed.

Figure 36:
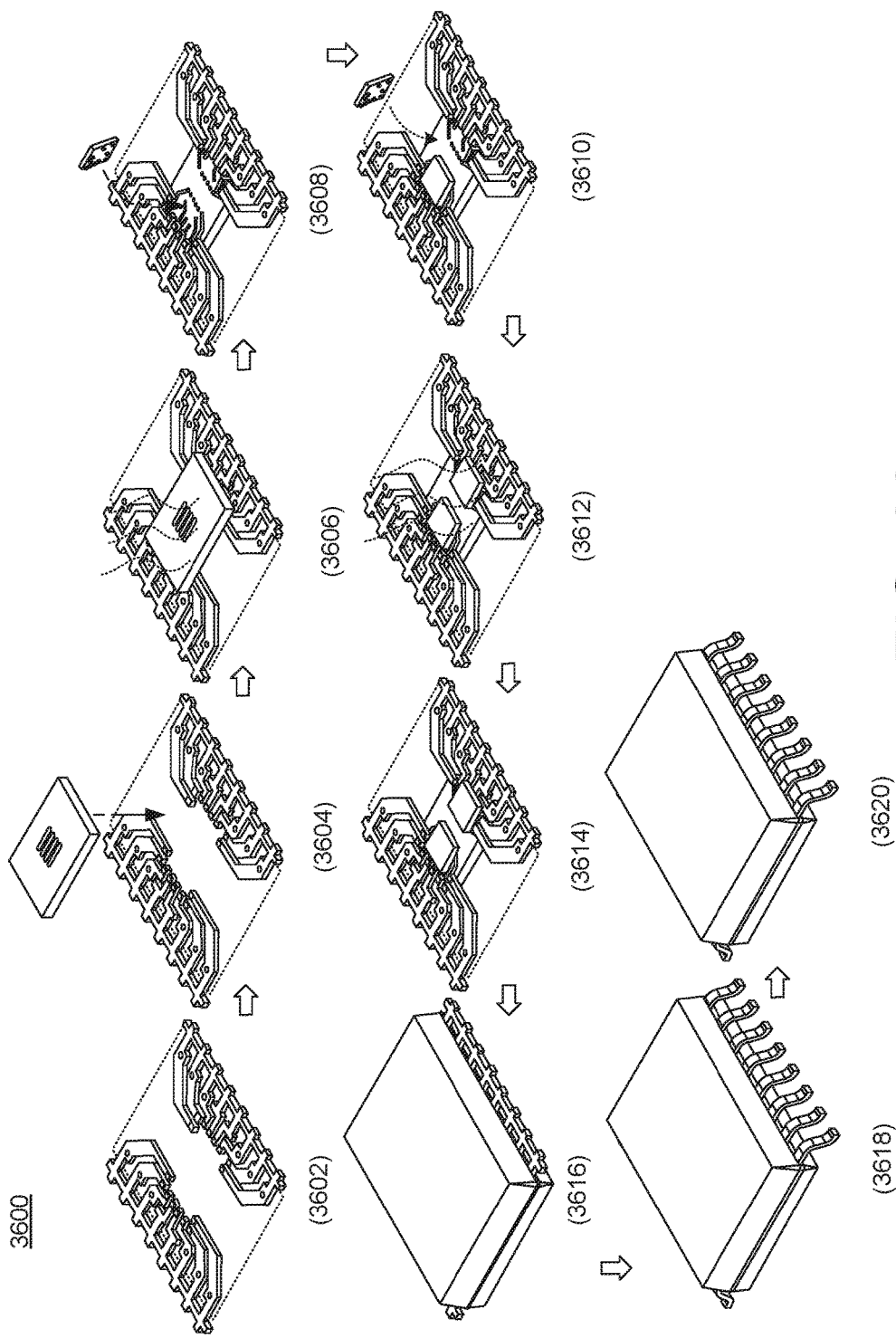
FIG. 36 illustrates a process flow for constructing the semiconductor package of FIG. 14.

FIG. 36 illustrates a process flow 3600 for constructing the semiconductor packages 1400 of FIGS. 14A-14E according the embodiments. For example, the process flow 3600 may be an alternative to the process flows of FIGS. 15 and 16. Although FIG. 36 is illustrated as a sequential, ordered listing of operations, it will be appreciated that some or all of the operations may occur in a different order, or in parallel, or iteratively, or may overlap in time. Solder print (3602), ceramic substrate attach (3604), Hi-Melt solder reflow (3606), fluxing and input flip chip attach (3608), fluxing and output flip chip attach (3610), PB-free solder reflow and flux clean (3612), plasma clean (3614), mold, PMB, postplate, and SRB (3616), trim and form (3618), and test and finish (3620) may be performed.

Implementations of the various techniques described herein may be implemented in digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

It may also be understood that when a layer is referred to as being on another layer or substrate, it can be directly on the other layer or substrate, or intervening layers may also be present. It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown in the figures as being directly on, directly connected or directly coupled can be referred to as such. The claims of the application may be amended to recite exemplary relationships described in the specification or shown in the figures.

Some implementations may be implemented using various semiconductor processing and/or packaging techniques.

Some embodiments may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus comprising:
   a first semiconductor die;
   a second semiconductor die; and
   a capacitive isolation circuit being coupled to the first semiconductor die and the second semiconductor die, the capacitive isolation circuit being disposed outside of the first semiconductor die and the second semiconductor die,
   the first semiconductor die, the second semiconductor die, and the capacitive isolation circuit being included in a molding of a semiconductor package,
   the capacitive isolation circuit including:
      a first capacitor network having first and second conductive layers with a dielectric material disposed between the first and second conductive layers, the first capacitor network being coupled to the first semiconductor die;
      a second network capacitor having first and second conductive layers with a dielectric material disposed between the first and second conductive layers, the second capacitor network being coupled to the second semiconductor die; and
      a bond wire coupled to at least one of the first capacitor network and the second capacitor network.

2. The apparatus of claim 1, wherein the capacitive isolation circuit defines a distance through insulation that is at least twice a thickness of the dielectric material of either the first capacitor network or the second capacitor network, the twice the thickness being greater than or equal to a distance between a first lead frame portion and a second lead frame portion.

3. The apparatus of claim 1, wherein the bond wire is a first bond wire, the apparatus further comprising:
   a second bond wire coupled to the first semiconductor die and a first lead frame portion.

4. The apparatus of claim 3, further comprising:
   a third bond wire coupled to the second semiconductor die and a second lead frame portion.

5. The apparatus of claim 1, further comprising:
   a first lead frame coupled to the first semiconductor die; and
   a second lead frame coupled to the second semiconductor die, the second lead frame being disposed apart from the first lead frame.

6. The apparatus of claim 1, wherein the first semiconductor die is coupled to the first capacitor network via one or more solder balls, and the second semiconductor die is coupled to the second capacitor network via one or more solder components.

7. The apparatus of claim 1, wherein the first semiconductor die is coupled to the first capacitor network via a conductive epoxy, and the second semiconductor die coupled to the second capacitor network via a conductive epoxy.

8. The apparatus of claim 1, wherein the second conductive layer of the first capacitor network has a length different from a length of the first conductive layer of the first capacitor network.

9. The apparatus of claim 1, wherein the second conductive layer of the first capacitor network has a length that is the same as a length of the first conductive layer of the first capacitor network.

10. The apparatus of claim 1, wherein the bond wire includes a first end portion that is coupled to the first capacitor network and a second end portion that is coupled to the second capacitor network.

11. The apparatus of claim 1, further comprising:
    a third capacitor network having first and second conductive layers with a dielectric material disposed between the first and second conductive layers.

12. The apparatus of claim 11, wherein the bond wire has a first end portion that is coupled to the first capacitor network and a second end portion that is coupled to the third capacitor network.

13. An apparatus comprising:
    a first semiconductor die having a first surface and a second surface disposed opposite to the first surface;
    a second semiconductor die having a first surface and a second surface disposed opposite to the first surface;
    a first lead frame portion coupled to the second surface of the first semiconductor die;
    a second lead frame portion coupled to the second surface of the second semiconductor die, the first and second lead frame portions being portions on a same lead frame or the first and second lead frame portions each being on different lead frames;
    a first capacitor network coupled to the first surface of the first semiconductor die via one or more first conductive components; and
    a second capacitor network coupled to the first surface of the second semiconductor die via one or more second conductive components.

14. The apparatus of claim 13, further comprising:
    a bond wire coupled to the first capacitor network and the second capacitor network.

15. The apparatus of claim 13, wherein each of the first capacitor network and the second capacitor network includes first and second conductive layers with a dielectric material disposed between the first and second conductive layers.

16. The apparatus of claim 13, further comprising:
    a third lead frame portion that is separate from the first lead frame portion and the second lead frame portion; and
    a third capacitor network coupled to the third lead frame portion.

17. The apparatus of claim 13, further comprising:
    a first bond wire coupled to the first surface of the first semiconductor die and the first lead frame portion; and
    a second bond wire coupled to the first surface of the second semiconductor die and the second lead frame portion.

18. An apparatus comprising:
- a first semiconductor die having a first surface and a second surface disposed opposite to the first surface;
- a second semiconductor die having a first surface and a second surface disposed opposite to the first surface;
- a first lead frame portion coupled to the second surface of the first semiconductor die;
- a second lead frame portion coupled to the second surface of the second semiconductor die, the first and second lead frame portions being portions on a same lead frame or the first and second lead frame portions each being on different lead frames;
- a first capacitor network coupled to the first surface of the first semiconductor die via one or more first conductive components;
- a second capacitor network coupled to the first surface of the second semiconductor die via one or more second conductive components, each of the first capacitor network and the second capacitor network includes first and second conductive layers with a dielectric material disposed between the first and second conductive layers;
- a first bond wire coupled to the first capacitor network and the second capacitor network;
- a second bond wire coupled to the first surface of the first semiconductor die and the first lead frame portion; and
- a third bond wire coupled to the first surface of the second semiconductor die and the second lead frame portion.

* * * * *